US006629302B2

(12) United States Patent
Miura et al.

(10) Patent No.: US 6,629,302 B2
(45) Date of Patent: Sep. 30, 2003

(54) CIRCUIT BOARD DESIGN AIDING APPARATUS, DESIGN AIDING METHOD, AND STORAGE MEDIUM STORING DESIGN AIDING PROGRAM

(76) Inventors: Shinji Miura, 18-19-606, Toriimae, Enmyouji, Ooyamazakicho, Otokunigun, Kyoto 618-0091 (JP); Yukihiro Fukumoto, 2-22-601, Koudukamachi, Hirakata-shi, Osaka-fu 573-0035 (JP); Hirokazu Uemura, 4-50-8, Minamikinomoto, Yao-shi, Osaka-fu 581-0042 (JP); Yoshiyuki Saito, 1-1-611, Kouzu, Katano-shi, Osaka-fu 573-0053 (JP); Hiroshi Ikeda, 10, Koyama-Hananokicho, Kita-ku, Kyoto-shi, Kyoto-fu 603-8122 (JP); Takeshi Nakayama, 4-10-202, Ikuno, Katano-shi, Osaka-fu 576-0054 (JP); Osamu Shibata, 1-6-22, Kikusuidoori, Moriguchi-shi, Osaka-fu 570-0032 (JP); Shinichi Tanimoto, 30-23, Miyukihigashimachi, Neyagawa-shi, Osaka-fu 572-0055 (JP)

( * ) Notice: Subject to any disclaimer, the term of this patent is extended or adjusted under 35 U.S.C. 154(b) by 379 days.

(21) Appl. No.: 09/746,886

(22) Filed: Dec. 22, 2000

(65) Prior Publication Data

US 2001/0047508 A1 Nov. 29, 2001

(30) Foreign Application Priority Data

Dec. 22, 1999 (JP) ............................. 11-364631

(51) Int. Cl.$^7$ ................................. G06F 9/45
(52) U.S. Cl. ................... 716/8; 716/9; 716/15
(58) Field of Search ................ 716/8, 7, 9, 10, 716/11, 12, 13, 14, 15; 438/113, 612, 616; 257/774, 687, 758

(56) References Cited

U.S. PATENT DOCUMENTS

| 5,585,675 | A | * | 12/1996 | Knopf ......................... 257/774 |
| 5,825,264 | A | * | 10/1998 | Yamazaki et al. ........... 333/204 |
| 6,057,175 | A | * | 5/2000 | Milla et al. .................. 438/113 |
| 6,285,203 | B1 | * | 9/2001 | Akram et al. ................ 324/755 |
| 6,493,933 | B1 | * | 12/2002 | Post et al. ..................... 29/846 |

FOREIGN PATENT DOCUMENTS

JP      2001 175697      6/2001

\* cited by examiner

Primary Examiner—Vuthe Siek
Assistant Examiner—Binh C Tat

(57) ABSTRACT

A design aiding apparatus and a method, and a storage medium storing a design aiding program enable the efficient layout design of components in a multilayer wiring board formed by laminating a plurality of wiring layers. The design aiding apparatus includes (a) a first acquiring unit for acquiring information showing a first location in a lamination direction of the wiring layers, (b) a second acquiring unit for acquiring information showing a second location on a two-dimensional plane that is orthogonal to the lamination direction, and (c) a placement unit for generating information showing a space to be occupied when the component is placed in such a manner that a placement reference point of the component coincides with the second location that is on the two-dimensional plane including the first location. According to the above construction, the present invention is capable of aiding layout design of components in the wiring board.

29 Claims, 46 Drawing Sheets

FIG. 2

| TYPE | PARAMETER |
|---|---|
| PLACEMENT(1) | IC1,MN700,(100,80),L3,(0,180,0) |
| PLACEMENT(2) | IC1,MN700,(100,80),(L3,L2),(0,180,0) |
| PLACEMENT(3) | IC1,MN700,(100,80),(L2,−2),(0,180,0) |
| CUT-OFF | NULL |
| COMPONENT CONNECTING VIA | NULL |
| WIRING | NULL |
| WIRING COMPONENT | NULL |
| CAPACITOR | NULL |
| UNCONNECTION(1) | IC1,IC2 |
| UNCONNECTION(2) | L1,L2 |
| END | NULL |

FIG. 3

WIRING BOARD TABLE 100

| SHAPE 101 | LAYER NUMBER 102 | INTER-LAYER DISTANCE 103 |
|---|---|---|
| (0,0)(150,0)(150,100)(0,100) | 4 | 10 $\mu$m |

FIG. 4

WIRING LAYER TABLE 110

| WIRING LAYER IDENTIFICATION NAME 111 | SIGNAL TYPE 112 |
|---|---|
| L1 | GENERAL SIGNAL |
| L2 | POWER SOURCE |
| L3 | GENERAL SIGNAL |
| L4 | GROUND |

FIG. 5

DIELECTRIC TABLE 120

| LOCATION 121 | THICKNESS 121 | DIELECTRIC CONSTANT 122 |
|---|---|---|
| L2−L3 | 10 $\mu$m | 0.1 |

FIG. 7

COMPONENT TABLE 140

| COMPONENT TYPE NAME 141 | OUTWARD SHAPE 142 | ALLOWABLE DIRECTION 143 |
|---|---|---|
| MN700 | (0,0,0)(5,0,0)(5,5,0)(0,5,0)(0,0,2)(5,0,2)(5,5,2)(0,5,2) | (0,0,*)(0,180,*) 144 |
| JP001 | (0,0,0)(5,0,0)(5,5,0)(0,5,0)(0,0,2)(5,0,2)(5,5,2)(0,5,2) | (0,0,0) 145 |

FIG.8

PIN TABLE

| COMPONENT TYPE NAME | PIN NUMBER | LOCATION | CONNECTING DIRECTION |
|---|---|---|---|
| MN700 | 1 | (4,1,2) | (0,0,1) |
| JP001 | 1 | (4,3,5) | (0,0,1) |
| ... | | | |

PLURAL COMPONENT TABLE

| PAIR NUMBER | LOWER COMPONENT TYPE NAME | UPPER COMPONENT TYPE NAME |
|---|---|---|
| 1 | MN700 | MN701 |
| ... | | |

CONNECTION TABLE 190

| NET IDENTIFICATION NAME | PIN IDENTIFICATION NAME |
|---|---|
| N1 | IC1−4,IC2−4,R1−1 |
| N2 | IC1−2,IC2−1 |
| ... | |

DESIGN REFERENCE TABLE

WIRING COMPONENT REFERENCE TABLE

FIG 15

PLACEMENT TABLE 240

| COMPONENT IDENTIFICATION NAME | COMPONENT TYPE NAME | LOCATION | DIRECTION |
|---|---|---|---|
| IC1 | MN700 | (100,80,18) | (0,180,0) |
| ... | | | |

VIA TABLE 250

| VIA IDENTIFICATION NAME | NET IDENTIFICATION NAME | LOCATIONS OF BOTH ENDS | DIAMETER |
|---|---|---|---|
| B1 | N1 | (96,80,16)(96,80,10) | 0.2mm |
| B2 | N2 | (106,80,10)(106,80,20) | 0.2mm |
| ... | | | |

WIRING CONDUCTOR TABLE 260

| WIRING CONDUCTOR IDENTIFICATION NAME 261 | NET IDENTIFICATION NAME 262 | WIRING LAYER IDENTIFICATION NAME 263 | PATH 264 | WIDTH 265 |
|---|---|---|---|---|
| F1 | N1 | L3 | (96,80)(106,80) | 0.2mm |
| F2 | N2 | L2 | (106,80)··· | 0.2mm |
| ··· | | | | |

FIG. 18

PIN CONNECTING LOCATION TABLE 270

| COMPONENT IDENTIFICATION NAME 271 | PIN NUMBER 272 | NET IDENTIFICATION NAME 273 | WIRING LAYER IDENTIFICATION NAME 274 | LOCATION 275 |
|---|---|---|---|---|
| IC1 | 1 | N1 | L3 | (96,80) |
| ... | | | | |

CUT-OFF TABLE

| CUT-OFF IDENTIFICATION NAME | WIRING LAYER IDENTIFICATION NAME | SHAPE |
|---|---|---|
| H1 | L2 | (20,50)(50,50)(50,80)(20,80) |
| ... | | |

FIG. 24

WIRING COMPONENT CONDUCTOR PATH TABLE

| COMPONENT TYPE NAME | CONDUCTOR NUMBER | PATH | WIDTH |
|---|---|---|---|
| JP001 | 1 | (4,3,5)(26,3,5) | 0.2mm |
| ... | | | |

FIG. 28

CAPACITOR TABLE

| CAPACITOR IDENTIFICATION NAME | WIRING LAYER IDENTIFICATION NAME | SHAPE |
|---|---|---|
| PC001 | L5 | (100,80),5 $\phi$ |
| ... | | |

FIG. 30

UNCONNECTION TABLE

| ELEMENT TYPE | IDENTIFICATION NAME |
|---|---|
| PIN | IC1−1 |
| VIA | B1 |
| WIRING CONDUCTOR | F1 |
| ... | |

FIG. 56

WIRING LAYER TABLE  ,700

| WIRING LAYER IDENTIFICATION NAME | SIGNAL TYPE | INTER-LAYER DISTACE | DIELECTRIC CONSTANT |
|---|---|---|---|
| L1 | GENERAL SIGNAL | 10 μm | 0.1 |
| L2 | POWER SOURCE | 20 μm | 0.1 |
| L3 | GENERAL SIGNAL | 10 μm | 0.5 |
| L4 | GROUND | — | — |

CIRCUIT BOARD DESIGN AIDING APPARATUS, DESIGN AIDING METHOD, AND STORAGE MEDIUM STORING DESIGN AIDING PROGRAM

This application is based on an application No. H11-364631 filed in Japan, the content of which y incorporated by reference.

BACKGROUND OF THE INVENTION

1. Field of the Invention

The present invention relates to a design aiding apparatus and a method for aiding the layout design of components in a multilayer circuit board that is formed by laminating a plurality of wiring layers, and a storage medium storing a design aiding program.

2. Prior Art

Conventionally, for packaging of a circuit board composed of a plurality of wiring layers (hereafter referred to as a multilayer wiring board), a packaging technique to mount components on exposed wiring layers of the board (that is, the front surface and the back surface of the board) has been typically used.

A conventional design aiding apparatus for aiding such packaging design has the functions of aiding (1) placement of components on the front and back surfaces of the multilayer wiring board, (2) application of conductive foil on wiring layers, and (3) arrangement of conductors (hereafter referred to as vias) to connect conductive foil laid on adjacent wiring layers.

In recent years, the size of components have been decreased and the packaging techniques have been improved. This has developed a packaging technique to place components between wiring layers and connect the placed components to the wiring layers inside the multilayer wiring board. According to this packaging technique, the packaging density of the multilayer wiring board can be improved as compared with the conventional technique of placing components on the front and back surfaces of the multilayer wiring board. This has the effect of further downsizing multilayer wiring boards. With the use of this packaging technique, the size of equipment is expected to decrease further.

However, the problem is that the above conventional design aiding apparatus does not have the function of aiding the layout design of components in the multilayer wiring board, and so cannot be applied to the packaging technique to place components into the multilayer wiring board. This has been an obstacle to efficient packaging design of a multilayer wiring board in which components are placed.

SUMMARY OF THE INVENTION

The present invention aims to provide a design aiding apparatus, a design aiding method, and a storage medium storing a design aiding program that enable the layout design of components in a multilayer wiring board to be carried out more efficiently.

The above object of the present invention can be achieved by a design aiding apparatus that aids layout design of components in a multilayer wiring board, including: a first acquiring unit operable to acquire first location information that shows a first location in a lamination direction of the multilayer wiring board; a second acquiring unit operable to acquire second information that shows a second location on a two-dimensional plane that is orthogonal to the lamination direction; and a placement unit operable to generate component placement information that shows a space to be occupied by the component, when the component is placed at a location determined by the acquired first location information and the acquired second location information.

According to the above construction, the first acquiring unit acquires location information that shows a placement location of the component in the lamination direction of wiring layers of the multilayer wiring board, and the second acquiring unit acquires location information that shows a placement location of the component on the two-dimensional plane that is orthogonal to the lamination direction, and the placement unit generates placement information that shows a space to be occupied by the component when the component is placed at a location determined by the two types of location information. Accordingly, the design aiding apparatus of the present invention is capable of aiding the layout design of components in the multilayer wiring board.

With the use of the design aiding apparatus of the present invention, the packaging design of the multilayer wiring board in which components are placed can be carried out more efficiently.

(2) The above object of the present invention can also be achieved by a design aiding apparatus that aids layout design of components in a multilayer wiring board formed by laminating a plurality of wiring layers, the design aiding apparatus including: a first acquiring unit operable to acquire first location information that shows a first location in a lamination direction of the plurality of wiring layers; a second acquiring unit operable to acquire second location information that shows a second location on a two-dimensional plane that is orthogonal to the lamination direction; and a placement unit operable to generate component placement information that shows a space to be occupied by the component, when the component is placed in such a manner that a placement reference point of the component coincides with the second location that is on the two-dimensional plane including the first location.

According to the above construction, the first acquiring unit acquires location information that shows a placement location of the component in the lamination direction of wiring layers of the multilayer wiring board, and the second acquiring unit acquires location information that shows a placement location of the component on the two-dimensional plane that is orthogonal to the lamination direction, and the placement unit generates placement information that shows a space to be occupied by the component when the component is placed at a location determined by the two types of location information. Accordingly, the design aiding apparatus of the present invention is capable of aiding the layout design of components in the multilayer wiring board.

With the use of the design aiding apparatus of the present invention, the packaging design of the multilayer wiring board in which components are placed can be carried out more efficiently.

(3) Also, in the design aiding apparatus, the first acquiring unit may include: a wiring layer information acquiring unit operable to acquire layer information that identifies one wiring layer out of the plurality of wiring layers; and a wiring layer location acquiring unit operable to acquire the first location information that shows a location of the identified wiring layer in the lamination direction; and the placement unit of the design aiding apparatus may generate the component placement information, in such a manner that the placement reference point of the component coincides with the second location that is on the two-dimensional plane including the first location, the first location being the location of the identified wiring layer in the lamination direction.

According to the above construction, the first acquiring unit acquires location information that shows a placement location of the component in the lamination direction of wiring layers of the multilayer wiring board, and the second acquiring unit acquires location information that shows a placement location of the component on the two-dimensional plane that is orthogonal to the lamination direction, and the placement unit generates placement information that shows a space to be occupied by the component when the component is placed at a location determined by the two types of location information. Accordingly, the design aiding apparatus of the present invention is capable of aiding the layout design of components in the multilayer wiring board.

With the use of the design aiding apparatus of the present invention, the packaging design of the multilayer wiring board in which components are placed can be carried out more efficiently.

(4) Also, in the design aiding apparatus, the first acquiring unit may include: a wiring layer information acquiring unit operable to acquire layer information that identifies one wiring layer out of the plurality of wiring layers; a wiring layer location acquiring unit operable to acquire the first location information that shows a location of the identified wiring layer in the lamination direction; and a distance acquiring unit operable to acquire distance information that shows a distance from the identified wiring layer in the lamination direction; the placement unit may generate the component placement information in such a manner that the placement reference point of the component coincides with the second location that is on the two-dimensional plane including a third location, the third location being away from the first location at the distance determined by the distance information.

According to the above construction, the first acquiring unit acquires location information that shows a placement location of the component in the lamination direction of wiring layers of the multilayer wiring board, and the second acquiring unit acquires location information that shows a placement location of the component on the two-dimensional plane that is orthogonal to the lamination direction, and the placement unit generates placement information that shows a space to be occupied by the component when the component is placed at a location determined by the two types of location information. Accordingly, the design aiding apparatus of the present invention is capable of aiding the layout design of components in the multilayer wiring board.

With the use of the design aiding apparatus of the present invention, the packaging design of the multilayer wiring board in which components are placed can be carried out more efficiently.

(5) Also, in the design aiding apparatus, the first acquiring unit may include: a wiring layer information acquiring unit operable to acquire two sets of layer information that respectively identify adjacent two wiring layers out of the plurality of wiring layers; a wiring layer location acquiring unit operable to acquire two sets of location information that respectively show two locations of the identified two wiring layers in the lamination direction; and a distance adjusting unit operable to generate the first location information that shows the first location in the lamination direction of the plurality of wiring layers, in such a manner that the space to be occupied by the component is within a space between the identified two wiring layers.

According to the above construction, the first acquiring unit acquires location information that shows a placement location of the component in the lamination direction of wiring layers of the multilayer wiring board, and the second acquiring unit acquires location information that shows a placement location of the component on the two-dimensional plane that is orthogonal to the lamination direction, and the placement unit generates placement information that shows a space to be occupied by the component when the component is placed at a location determined by the two types of location information. Accordingly, the design aiding apparatus of the present invention is capable of aiding the layout design of components in the multilayer wiring board.

With the use of the design aiding apparatus of the present invention, the packaging design of the multilayer wiring board in which components are placed can be carried out more efficiently.

(6) The design aiding apparatus of the present invention may further include: an angle acquiring unit operable to acquire angle information that shows a rotation angle at which the component is to be rotated for being placed into the multilayer wiring board; and an angle judging unit operable to judge whether the component is placeable in a state of being rotated at the rotation angle shown by the angle information; wherein when the angle judging unit judges that the component is placeable in a state of being rotated at the rotation angle, the placement unit generates component placement information that shows a space to be occupied by the component when the component is placed in the state of being rotated at the rotation angle.

According to this construction, the design aiding apparatus of the present invention is capable of aiding the layout design of component in freely chosen directions within the wiring board, therefore an area needed for packaging within the wiring board can be reduced by placing components in an appropriate direction so that a distance of the wiring path is shortened.

(7) The design aiding apparatus of the present invention may further include: an angle acquiring unit operable to acquire angle information that shows a rotation angle at which the component is to be rotated for being placed into the multilayer wiring board; and an angle judging unit operable to judge whether the component is placeable in a state of being rotated at the rotation angle shown by the angle information; wherein when the angle judging unit judges that the component is placeable in a state of being rotated at the rotation angle, the placement unit generates component placement information that shows a space to be occupied by the component when the component is placed in the state of being rotated at the rotation angle.

According to this construction, the design aiding apparatus of the present invention is capable of judging whether the acquired rotation information is appropriate. Therefore, when inappropriate rotation information is acquired, the design aiding apparatus is capable of aiding the design operation smoothly by, for example, notifying an external apparatus or an operator of an error and requiring another input.

(8) Also, in the design aiding apparatus, the angle acquiring unit may acquire an angle that shows a direction orthogonal to the wiring layer as the rotation angle, and the placement unit may generate the component placement information that shows the space to be occupied by the component when the component is placed in a state of being rotated in the direction orthogonal to the wiring layer.

According to this construction, the design aiding apparatus of the present invention is capable of aiding the layout design of a component so that the component is stood up. Therefore, an area needed for packaging within the wiring board can be reduced if, for example, a component that has a connection terminal on each end is placed so as to be stood up and connected directly to a predetermined wiring layer.

(9) The above object of the present invention can also be achieved by the design aiding apparatus wherein at least one component has already been placed in the multilayer wiring board, the design aiding apparatus further including: a component placement information storing unit operable to store component placement information that shows a space occupied by a component that has already been placed; and an interference judging unit operable to judge whether the space to be occupied by the component shown by the component placement information generated by the placement unit intersects with the space occupied by the component that has already been placed, wherein when the interference judging unit judges that the space to be occupied by the component shown by the component placement information intersects with the space occupied by the component that has already been placed, the placement unit (a) calculates a rotation angle at which the component is to be rotated, in such a manner that a space to be occupied by the component when the component is placed in a state of being rotated at the calculated rotation angle does not intersect with the space occupied by the component that has already been placed, and (b) generates component placement information that shows the space to be occupied by the component when the component is placed in the state of being rotated at the calculated rotation angle.

According to this construction, the design aiding apparatus of the present invention judges that a component to be placed intersects with a component that has been already placed and amends the direction in which the component to be placed is oriented. Therefore, the labor of an operator is decreased when the operator amends the direction in which the component is to be oriented, and the layout of the component can be designed more efficiently.

(10) The design aiding apparatus may further include: a penetration judging unit operable to judge whether a space to be occupied by the component shown by the generated component placement information intersects with a wiring layer in the multilayer wiring board; and a cut-off information generation unit operable to generate, when the penetration judging unit judges that the space to be occupied by the component shown by the generated component placement information intersects with the wiring layer in the multilayer wiring board, plane information that shows a plane on which the space and the wiring layer intersect.

According to this construction, when a component with a height that exceeds a distance between adjacent wiring layers is placed into the wiring board, the design aiding apparatus of the present invention is capable of recognizing a region where a wiring conductor cannot be laid on a wiring layer because of the component. Thus, the design aiding apparatus is capable of aiding the layout design of a wiring conductor so that the wiring conductor is applied only in an appropriate region (1) by excluding the recognized region of the wiring layer from a region that can be calculated as a wiring path, or (2) by excluding the recognized region of the wiring layer when a wiring conductor for a power source wiring layer or a wiring conductor for a ground wiring layer is laid entirely on a wiring layer.

(12) The design aiding apparatus may further aid layout design of a plurality of components that are to be placed one on top of another in the multilayer wiring board, the design aiding apparatus including: a plural component storing unit operable to store a plurality of sets of component information that respectively show a plurality of types of components that are placeable one on top of another; wherein when the placement unit fetches the plurality of sets of component information, the placement unit generates component placement information that shows a space to be occupied by each of the plurality of types of components when the plurality of types of components shown by the read sets of component information are placed one on top of another, in such a manner that a placement reference point of one component out of the plurality of types of component coincides with the second location.

According to this construction, the design aiding apparatus of the present invention is capable of recognizing a plurality of types of components that function when placed one on top of another and aiding the layout design of the plurality of types of components as one group. Therefore, for example, the layout design of predetermined number of memory components that are placed one on top of another to secure predetermined storage capacity can be carried out more efficiently.

(13) The above object of the present invention may also be achieved by the design aiding apparatus, wherein each of the plurality of types of components is equipped with a connection terminal, the design aiding apparatus further including, a via connection unit operable to generate via location information that shows a placement location of a via to connect connection terminals respectively equipped on adjacent components.

According to this construction, the design aiding apparatus of the present invention aids the layout design of vias that connect connection terminals of adjacent components out of the plurality of components that function when placed one on top of another, therefore, the wiring between the plurality of components that function when placed one on top of another can be designed more efficiently. As the wiring between the such components designed based on this construction does not interfere with wiring layers, an area needed for the wiring on wiring layers is reduced, thereby reducing an area needed for the packaging within the wiring board.

(14) The above object of the present invention may also be achieved by the design aiding apparatus, wherein at least two components to be connected to each other are placed into the multilayer wiring board, the design aiding apparatus further including: a wiring component judging unit operable to judge whether a wiring component is necessary when the at least two components are connected; and a wiring component generation unit operable to generate, when the wiring component judging unit judges that the wiring component is necessary, shape information that shows a shape of the wiring component on which conductive foil is laid, the wiring component used to connect the at least two components, wherein the placement unit generates wiring component placement information that indicates a space to be occupied by the wiring component shown by the generated shape information when the wiring component is placed.

According to this construction, the design aiding apparatus of the present invention is capable of fetching at least two wiring conductors that are prevented from being directly connected on a wiring layer because of an obstacle, such as a component, a cut-off region, or another wiring conductor, and aiding the layout design of a wiring component that connects the at least two wiring conductors inside the wiring board. Therefore, the design aiding apparatus is capable of aiding the wiring design more efficiently by placing a wiring component when the obstacle interrupts the wiring on a wiring layer.

(15) The above object of the present invention may also be achieved by the design aiding apparatus, wherein a plurality of components are placed into the multilayer wiring board, the design aiding apparatus further including: a connection information storing unit operable to store a plurality of sets of connection information that respectively show a plurality of connections that connect the plurality of components; a wiring information storing unit operable to store a plurality of sets of wiring information that respectively show a plurality of wirings between some components out of the plurality of components; and an unconnection information generation unit operable to extract connections that are not realized by the plurality of wirings shown by the plurality of sets of wiring information out of the plurality of connections-, and generating connection information that shows the extracted connections as unconnection information.

According to this construction, to recognize the incomplete wiring, the design aiding apparatus of the present invention is capable of aiding a design operation smoothly by, for example, displaying the incomplete wiring so that an operator is notified of the incomplete wiring.

(16) The above object of the present invention may also be achieved by the design aiding apparatus, wherein a dielectric layer is formed between adjacent two wiring layers in the multilayer wiring board, the design aiding apparatus further including, a capacitor generation unit operable to generate foil location information that indicates two locations where conductive foil with a predetermined area is laid, the two locations respectively being on the two adjacent wiring layers and facing each other.

According to this construction, in the packaging design of the multilayer wiring board that includes a dielectric layer, the design aiding apparatus of the present invention is capable of aiding the design for forming a capacitor inside the wiring board. With this, the size of the wiring board can be reduced, as compared with a case in which the design for realizing a capacitor on a surface of the wiring board is employed.

(17) The above object of the present invention may also be achieved by the design aiding apparatus, wherein at least one component has already been placed into the multilayer wiring board, the design aiding apparatus further including: a component placement information storing unit operable to store component placement information that shows a space that has been occupied by the at least one component; and an interference judging unit operable to judge whether the space to be occupied by the component shown by the component placement information generated by the placement unit intersects with the space that has been occupied by the at least one component; wherein when the interference judging unit judges that the space to be occupied by the component shown by the component placement information intersects with the space occupied by the component that has already been placed, the placement unit (a) calculates a placement location of the component, in such a manner that a space to be occupied by the component when the component is placed at the calculated placement location does not intersect with the space occupied by the component that has already been placed, and (b) generates component placement information that shows the space to be occupied by the component when the component is placed at the calculated placement location.

According to this construction, the design aiding apparatus of the present invention judges that a component to be placed intersects with a component that has been already placed and amends the placement location of the component. Therefore, the labor of an operator is decreased when the operator amends the placement location of the component, and the layout of the component can be designed more efficiently.

BRIEF DESCRIPTION OF THE DRAWINGS

These and other objects, advantages and features of the invention will become apparent from the following description thereof taken in conjunction with the accompanying drawings that illustrate a specific embodiment of the invention. In the drawings:

FIG. 2 shows an example of command information received by an input unit;

FIG. 3 shows an example of wiring board information stored in a wiring board table;

FIG. 4 shows an example of wiring layer information stored in a wiring layer table;

FIG. 5 shows an example of dielectric information stored in a dielectric table;

FIG. 7 shows an example of component information stored in a component table;

FIG. 8 shows an example of pin information stored in a pin table;

FIG. 15 shows an example of placement information stored in a placement table;

FIG. 16 shows an example of via information stored in a via table;

FIG. 17 shows an example of wiring conductor information stored in a wiring conductor table;

FIG. 18 shows an example of pin connecting location information stored in a pin connecting location table;

FIG. 21 shows an example of cut-off information stored in a cut-off table;

FIG. 24 shows an example of wiring component conductor path information stored in a wiring component conductor path table;

FIG. 28 shows an example of capacitor information stored in the capacitor table;

FIG. 30 shows an example of unconnection information stored in an unconnection table;

FIG. 56 shows an example of wiring layer information stored in a wiring layer table.

DESCRIPTION OF THE PREFERRED EMBODIMENT

Embodiment

The following is an explanation of an embodiment of a design aiding apparatus of the present invention with reference to the drawings. The design aiding apparatus aids the design of (1) placement of components into a multilayer wiring board that is formed by laminating a plurality of wiring layers and (2) wiring of the multilayer wiring board.

Overall Construction

Figure 1:
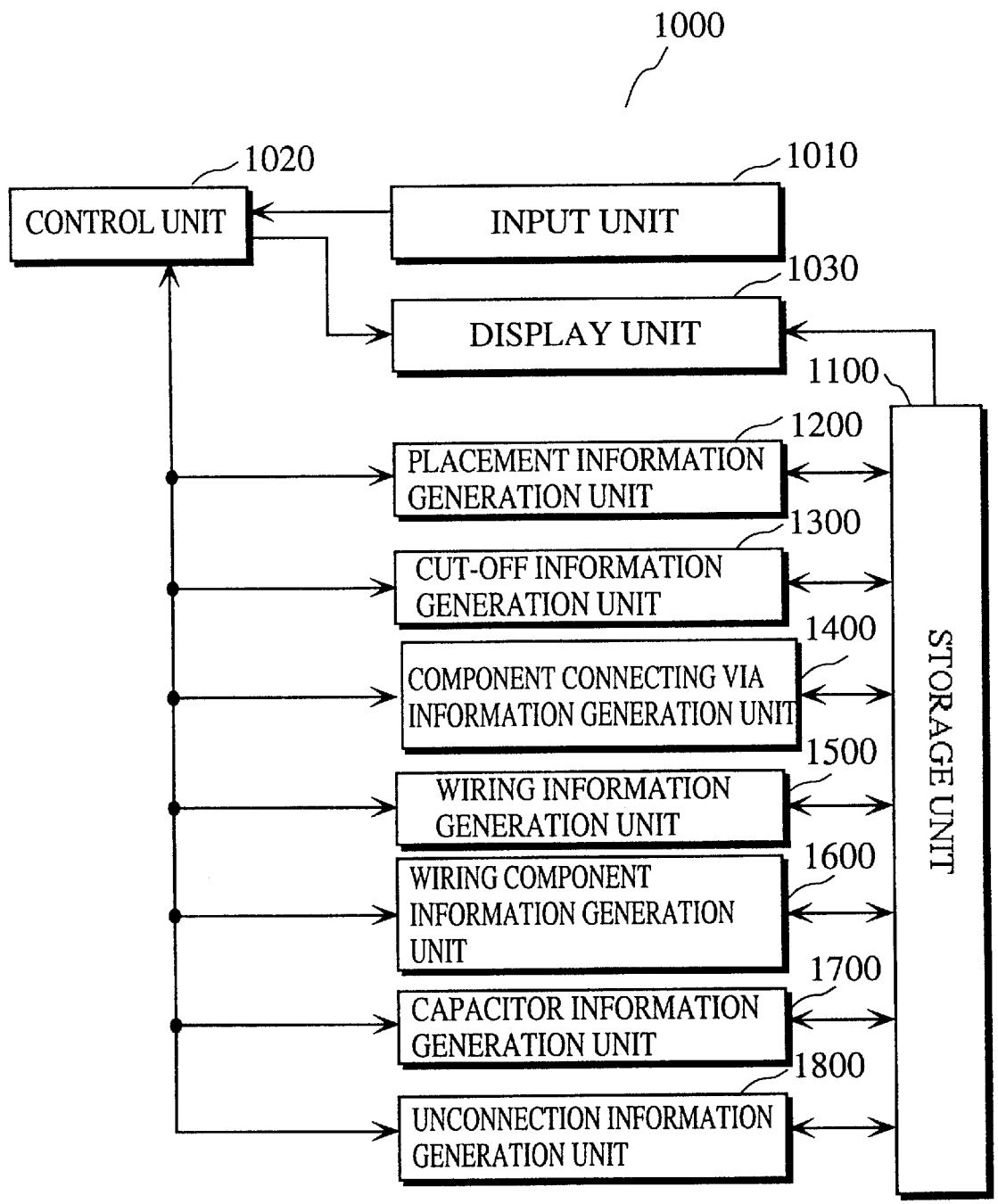
FIG. 1 shows an example of an overall construction of a design aiding apparatus relating to the embodiment of the present invention.

FIG. 1 is an example of an overall construction of a design aiding apparatus 1000 to which the embodiment relates. The design aiding apparatus 1000 is roughly composed of an input unit 1010, a control unit 1020, a storage unit 1100, a placement information generation unit 1200, a cut-off information generation unit 1300, a component connecting via information generation unit 1400, a wiring information generation unit 1500, a wiring component information generation unit 1600, a capacitor information generation unit 1700, an unconnection information generation unit 1800, and a display unit 1030.

The design aiding apparatus 1000 is realized by hardware, such as a processor, a ROM (Read Only Memory) storing programs, a RAM (Random Access Memory) as a working storage, and a hard disk. The functions of each element of the design aiding apparatus 1000 are realized when the processor executes the programs stored in the ROM. Information passing between the elements is made through the RAM and the hard disk.

Input Unit 1010 The input unit 1010 receives command information that shows operation instructions for the design aiding apparatus 1000 from outside, and outputs the acquired command information to the control unit 1020.

FIG. 2 shows an example of command information 220 received by the input unit 1010. The command information 220 is roughly composed of (1) a command type 221 that indicates a type of an operation to be executed by the design aiding apparatus 1000, and (2) a parameter 222 that designates a content of the operation in detail. The parameter 222 shows a null value for a function for which a detailed content of the operation does not need to be designated.

In the figure, reference numerals 223 to 233 show specific examples of the command information. These specific examples will be explained in detail later in this specification.

Control Unit 1020

The control unit 1020 receives command information from the input unit 1010, and in accordance with a command type included in the received command information, instructs one of the placement information generation unit 1200, the cut-off information generation unit 1300, the component connecting via information generation unit 1400, the wiring information generation unit 1500, the wiring component information generation unit 1600, the capacitor information generation unit 1700, and the unconnection information generation unit 1800 to execute its processing. When the parameter included in the command information shows values other than the null value, the control unit 1020 delivers the parameter to the unit instructed to execute its processing.

When the placement information generation unit 1200, the cut-off information generation unit 1300, the component connecting via information generation unit 1400, the wiring information generation unit 1500, the wiring component information generation unit 1600, the capacitor information generation unit 1700, and the unconnection information generation unit 1800 have finished each processing, the control unit 1020 instructs the display unit 1030 to display the processing result.

Display Unit 1030

The display unit 1030 receives a display instruction from the control unit 1020, and displays, based on information stored in the storage unit 1100, an updated content of layout design that shows a layout of components, vias, and wiring conductors.

Figure 31A:
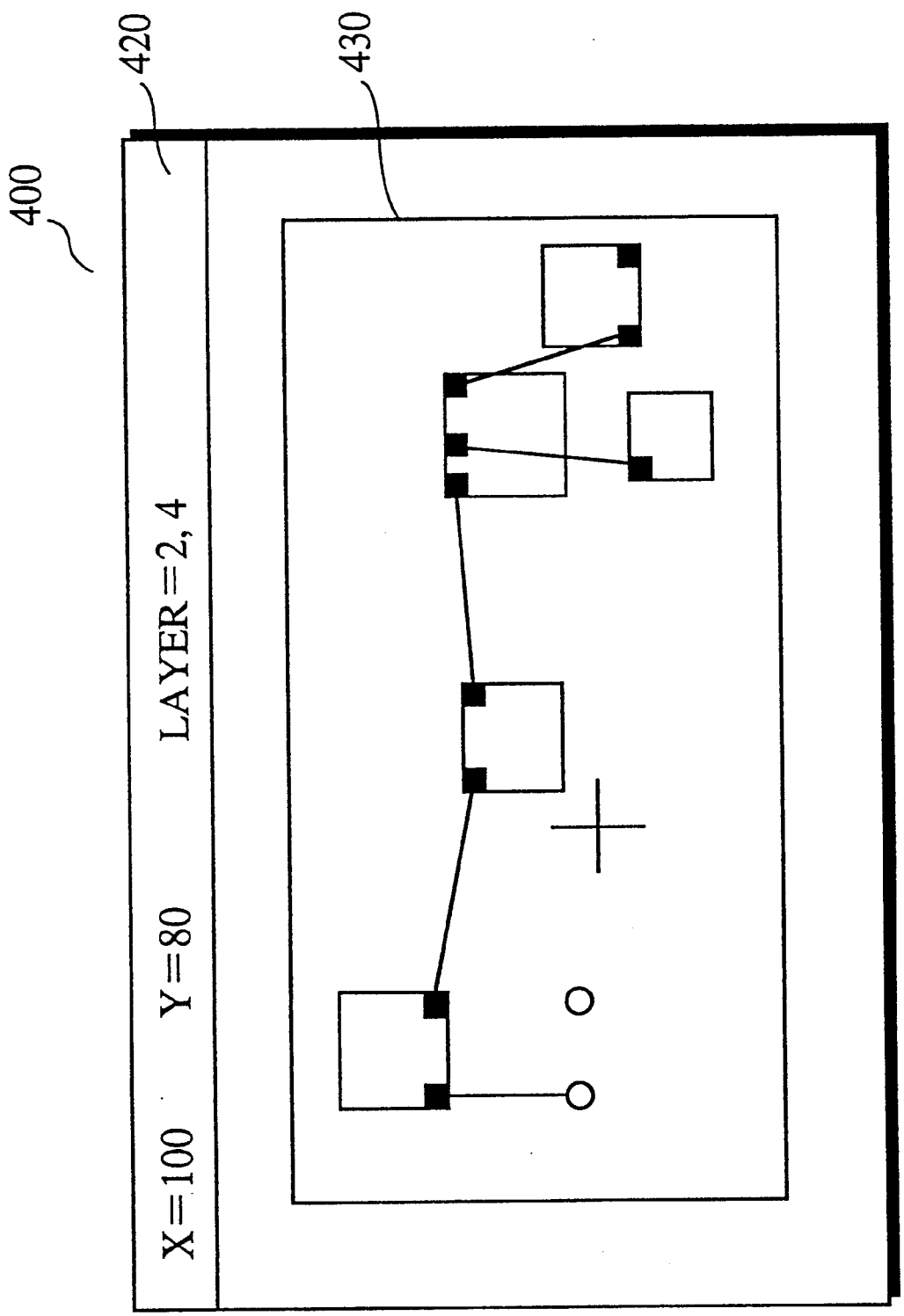
FIG. 31A shows a display example of a display unit.

FIG. 31A shows a display example of the display unit 1030. A pattern view showing a layout of components, vias, and wiring conductors as looked at in the lamination direction of the wiring board is displayed in a display region 430.

In the display region 430, each white box denotes a component, each black square inside the white box denotes a connection terminal equipped on the component, each white circle denotes a via, and each line connecting the black square and the white circle represents a wiring conductor. The wiring conductor is schematically displayed as a line connecting the connection terminal and the via, and is also displayed as a polygonal line showing an actual location where the wiring conductor is routed (not illustrated).

Also, a cursor which moves with a pointing devise is displayed in the display region 430. In the figure, a cross hair represents such a cursor. When a wiring layer is designated by an operator, the display unit 1030 displays only components, vias, and wiring conductors placed on the selected wiring layer. A display section 420 displays the X-Y coordinates of a location indicated by the intersection point of the cross hair and an identification name that identifies the selected wiring layer.

Figure 31B:
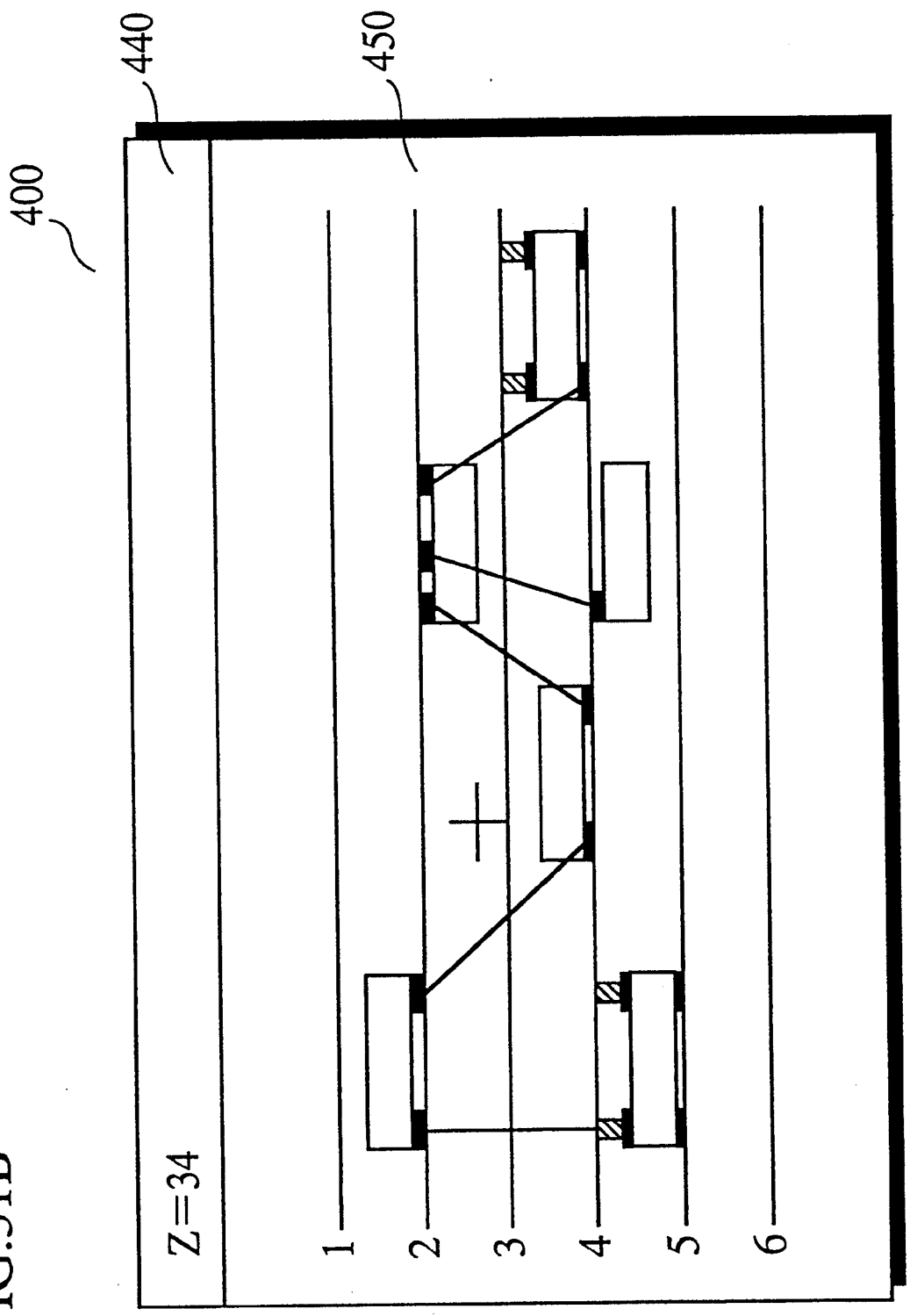
FIG. 31B shows another display example of the display unit.

FIG. 31B shows another display example of the display unit 1030. A pattern view showing a layout of components, vias, and wiring conductors as looked at in a direction orthogonal to the lamination direction of the wiring board is displayed in a display region 450.

In the display region 450, each of a plurality of parallel lines accompanied by an identification name on left side represents a location of a wiring layer, each white polygon denotes a component, each black square attached to the white polygon denotes a connection terminal equipped on the component, each shaded square represents a via, each line connecting the black square and the shaded square denotes a wiring conductor. Also, a cursor that moves with a pointing device is displayed in the display region 450.

A display section 440 displays the Z coordinate of a location indicated by the intersection point of the cursor.

Overall Design Aiding Process

Figure 39:
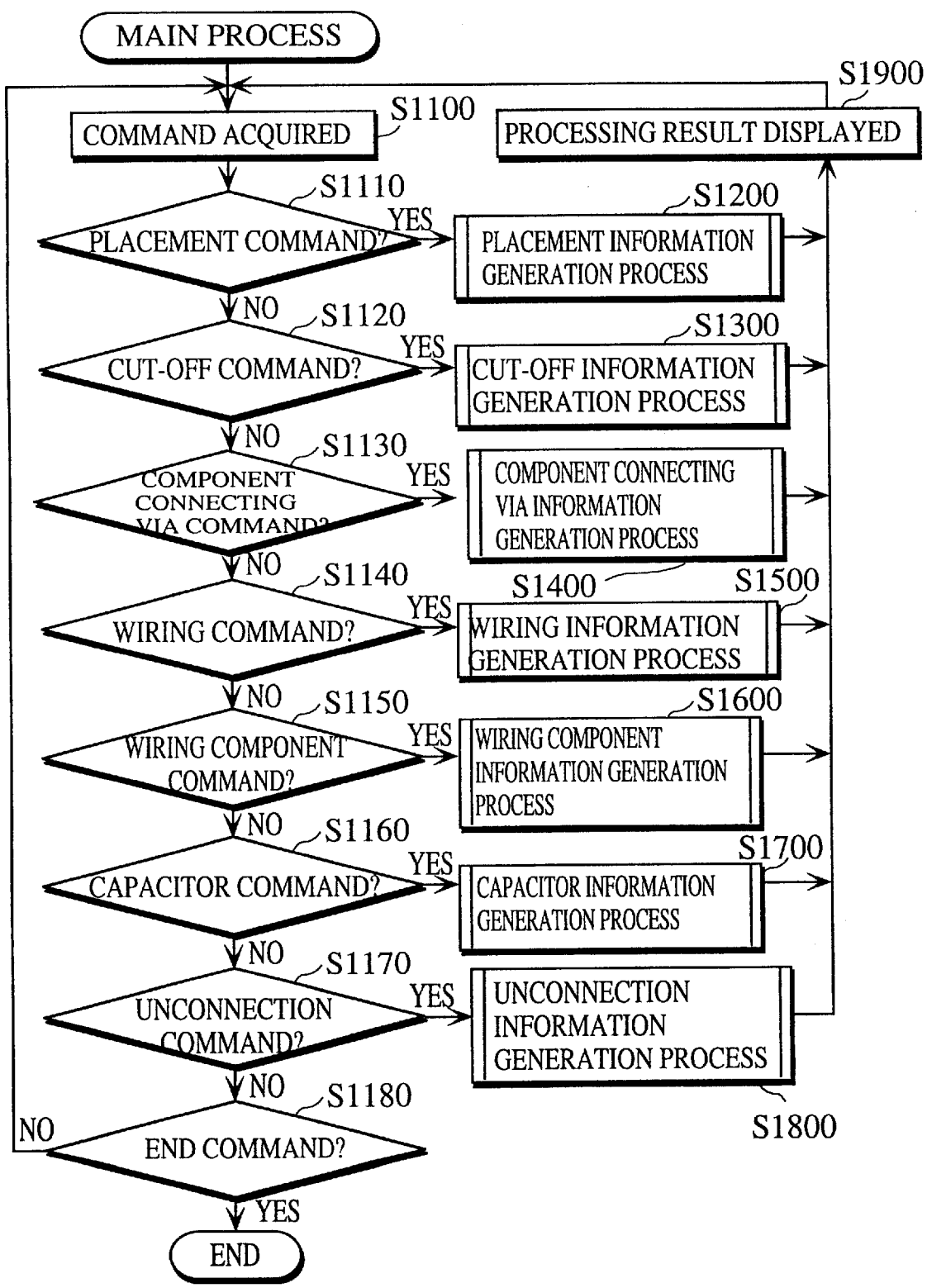
FIG. 39 is a flowchart showing a detailed operation of a control unit.

FIG. 39 is a flowchart showing an overall operation of the design aiding apparatus 1000.

An overall design aiding process performed by the design aiding apparatus 1000 is explained with reference to the flowchart shown in FIG. 39.

(Step S1100) The input unit 1010 receives command information from outside the apparatus.

(Step S1110) The control unit 1020 analyses the received command information, and if the command information is judged as showing a placement command, the processing advances to step S1200.

(Step S1120) If the command information is judged as showing a cut-off command, the processing advances to step S1300.

(Step S1130) If the command information is judged as showing a component connecting via command, the processing advances to step S1400.

(Step S1140) If the command information is judged as showing a wiring command, the processing advances to step S1500.

(Step S1150) If the command information is judged as showing a wiring component command, the processing advances to step S1600.

(Step S1160) If the command information is judged as showing a capacitor command, the processing advances to step S1700.

(Step S1170) If the command information is judged as showing an unconnection command, the processing advances to step S1800.

(Step S1180) If the command information is judged as showing an end command, the processing ends. Otherwise, the processing returns to step S1100.

(Step S1200) The placement information generation unit 1200 executes a placement information generation process.

(Step S1300) The cut-off information generation unit 1300 executes a cut-off information generation process.

(Step S1400) The component connecting via information generation unit 1400 executes a component connecting via information generation process.

(Step S1500) The wiring information generation unit 1500 executes a wiring information generation process.

(Step S1600) The wiring component information generation unit 1600 executes a wiring component information generation process.

(Step S1700) The capacitor information generation unit 1700 executes a capacitor information generation process.

(Step S1800) The unconnection information generation unit 1800 executes an unconnection information generation process.

(Step S1900) The display unit 1030 displays, based on the processing results of steps S1200 to S1800 stored in the storage unit 1100, updated design information showing a layout of components, vias, and wiring conductors.

Design information stored in the storage unit 1100, the placement information generation process, the cut-off information generation process, the component connecting via information generation process, the wiring information generation process, the wiring component information generation process, the capacitor information generation process, and the unconnection information generation process are explained in detail below.

Storage Unit 1100

The storage unit 1100 stores the following tables:

(1) a wiring board table, a wiring layer table, and a dielectric table for storing information about the multilayer wiring board;

(2) a component table, a pin table, and a plural component table for storing information about components;

(3) a connection table for storing information about connections between components;

(4) a design reference table for storing various conditions for the multilayer wiring board design;

(5) a placement table, a via table, a wiring conductor table for storing information about a layout of components, vias, and wiring conductors;

(6) a pin connecting location table for storing information about locations at which pins equipped on components are connected to wiring layers;

(7) a cut-off table for storing information about planes on which wiring layers intersect with components;

(8) a wiring component conductor path table for storing information about conductors laid on wiring components;

(9) a capacitor table for storing information about wiring conductors for forming capacitors; and

(10) an unconnection table for storing information about connection terminals, vias, and wiring conductors of components whose wiring is not complete.

First, an explanation on the terms used above is given below, and then an detailed explanation on the information stored in each of the above tables is given with reference to the drawings.

Explanation of Terms

As explained above, the wiring board in the present embodiment is a multilayer wiring board in which components are placed, the multilayer wiring board formed by laminating a plurality of wiring layers. For ease of explanation, a three-dimensional rectangular coordinate system which takes the lamination direction of the wiring layers as the Z-axis is employed to refer to locations inside the wiring board. Here, it is assumed that the unit "mm" is used in expressing the distance in the X-axis and Y-axis directions, and the unit "$\mu m$" is used in expressing the distance in the Z-axis direction unless otherwise specified.

The term "wiring layer" is used to refer to an X-Y plane present at a predetermined location in the Z-axis direction, and indicates a location where the wiring conductor is laid. Here, it is assumed that the wiring board is placed within an X-Y-Z space (a space expressed by the X-Y-Z coordinates) so that a base wiring layer is located at Z=0 and the other wiring layers are located in the positive direction of the Z-axis.

Components, vias, and insulators are placed between adjacent wiring layers in the wiring board.

The term "wiring conductor" is used to refer to conductive foil that provides electrical connection between given locations on each wiring layer. The term "via" is used to refer to a conductor that is set in a linear shape in the Z-axis direction inside the wiring board, and provides electrical connection in the Z-axis direction.

A "component" includes at least one connection terminal (hereafter referred to as a pin) for electrically connecting the internal circuit of the component to outside the component. One placement reference point and one placement reference direction are predetermined for the component, with which a placement location and a placement orientation of the component are determined. The "placement reference direction" shows a specific orientation of the component when it is placed in the X-Y-Z space.

The X-Y-Z coordinates of each vertex that defines the outline of the component and the X-Y-Z coordinates of each pin of each component when the component is placed in such a manner that the placement reference point of the component is set at the origin of the X-Y-Z space and that the component is oriented to the placement reference direction are defined.

The term "plural component" is used to refer to at least two components that are to be placed one on top of another so as to function together when connected to each other at predetermined pins equipped on the at least two components. As one example, the plural component is designed so that the predetermined pins are arranged opposed to each other when the two components are oriented in the same placement reference direction and placed in such a manner that the respective placement reference points are at the same location. The predetermined pins are connected by a via without going through wiring layers. This can reduce an area of the wiring layer needed for the wiring and so improves the packaging density of the wiring board. Such a plural component is useful, for instance, when placing a necessary number of memory components one on top of another to secure a predetermined storage capacity.

The term "wiring component" is used to refer to a component for connecting two wiring conductors that are laid on the same wiring layer but cannot be directly connected because of an obstacle. As one example, the wiring component can be a predetermined cubic shaped nonconductor that has at least one conductor (conductive foil) on its surface. The wiring component is placed into the wiring board, and is used to connect the two wiring conductors by respectively connecting (a) both ends of the conductor laid on the wiring component and (b) the two wiring conductors by vias.

A "connection between components" is represented by a plurality of pins connected to each other in the circuit design. The wiring composed of (a) the plurality of pins, (b) the wiring conductors, the vias, and the wiring components connected to the plurality of pins is called a net.

A "capacitor" is formed by a wiring conductor laid on facing locations of adjacent wiring layers in the wiring board when a dielectric is provided between the adjacent wiring layers.

Wiring Board Table 100

FIG. 3 shows an example of wiring board information stored in the wiring board table 100. The wiring board table 100 includes fields showing a shape 101, a layer number 102, and an inter-layer distance 103.

The shape field 101 shows the X-Y coordinates of each vertex that defines the outline of the wiring board. The layer number field 102 shows a number of wiring layers included in the wiring board. The inter-layer distance field 103 shows a distance between adjacent wiring layers in the Z-axis direction.

The wiring board information is inputted in advance from an external circuit design aiding apparatus, an external design information maintenance apparatus, or the like, and is stored in the wiring board table 100.

Wiring Layer Table 110

FIG. 4 shows an example of wiring layer information stored in the wiring layer table 110. The wiring layer table 110 includes fields showing a wiring layer identification name 111 and a signal type 112.

The wiring layer identification name field 111 shows an identification name that identifies a wiring layer. The signal type field 112 shows usage of the wiring layer identified by the wiring layer identification name.

The wiring layer information is inputted in advance from an external circuit design aiding apparatus, an external design information maintenance apparatus, or the like, and is stored in the wiring layer table 110.

Dielectric Table 120

FIG. 5 shows an example of dielectric information stored in the dielectric table 120.

The dielectric table 120 stores fields showing a location 121, a thickness 122, and a dielectric constant 123. The location field 121 shows two wiring layer identification names that identify two wiring layers that have a dielectric interposed therebetween. The thickness field 122 shows a thickness of the dielectric in the Z-axis direction. The dielectric constant field 123 shows a dielectric constant of the dielectric.

The dielectric information is inputted in advance from an external circuit design aiding apparatus, an external design information maintenance apparatus, or the like, and is stored in the dielectric table 120.

Example of Wiring board

Figure 6:
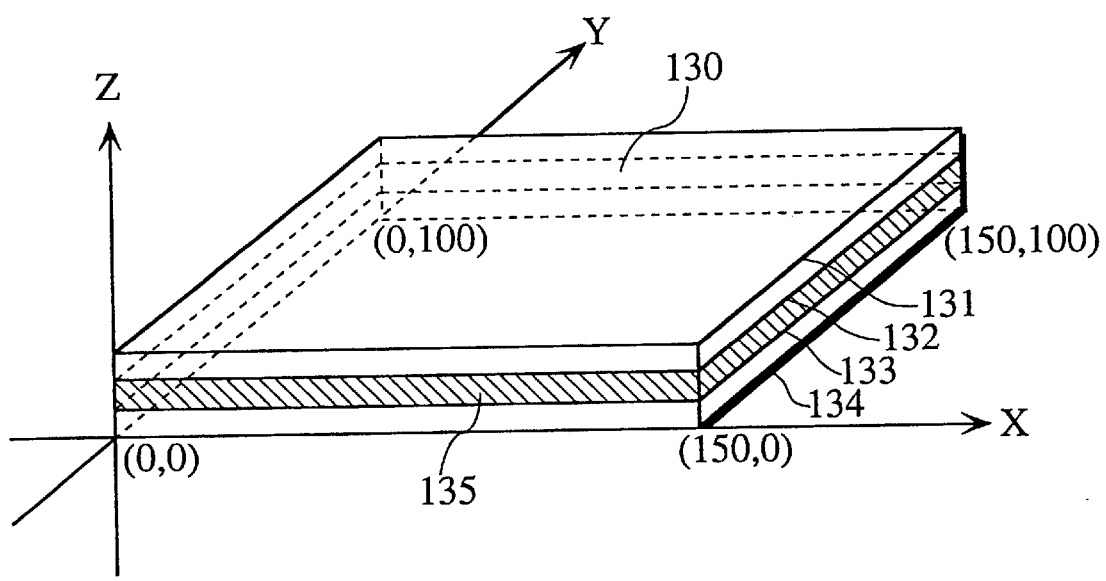
FIG. 6 shows a wiring board expressed by the wiring board table, the wiring layer table, and the dielectric table.

FIG. 6 shows a wiring board 130 expressed by the wiring board table 100, the wiring layer table 110, and the dielectric table 120. The wiring board 130 is a flat member having the distance of 150 mm in the X-axis direction and the distance of 100 mm in the Y-axis direction. As shown in the layer number field 102, the wiring board 130 is composed of four wiring layers 131 to 134, and the distance between adjacent wiring layers in the Z-axis direction is 10 μm as shown in the inter-layer distance field 103.

The wiring board 130 is placed within the X-Y-Z space so that the wiring layer 134 identified by the identification name L4 is located at Z=0. The wiring layers identified by the identification names L3, L2, and L1 are located at Z=10, Z=20, and Z=30 respectively. The thickness of the wiring board 130 is 30 μm.

As shown in each field in the dielectric table 120, a dielectric 135 with a thickness of 10 μm and a dielectric constant of 0.1 is placed between the wiring layers identified by the identification names L2 and L3 in the wiring board 130.

Component Table 140

FIG. 7 shows an example of component information stored in the component table 140. The component table 140 stores fields showing a component type name 141, an outward shape 142, and an allowable direction 143.

The component type name field 141 shows an identification name that identifies a type of a component. The outward shape field 142 shows, in correspondence with the component type name, a relative location of each vertex that defines the outline of the component. The relative location is shown by the X-Y-Z coordinates of each vertex of the outline of the component when the component is placed so as to be oriented to the placement reference direction, in such a manner that the placement reference point of the component is set at the origin of the X-Y-Z space.

The allowable direction field 143 stores at least one allowable range of rotation angles (ρx, ρy, ρz) for the component when the component identified by the component type name is placed so as to be rotated from its placement reference direction. The values, ρx, ρy, and ρz each represent a range of rotation angles for the component allowed to be rotated on the X-axis, the Y-axis, and the Z-axis respectively. A symbol * shows that the rotation angle can be freely chosen. The allowable direction field 143 shows the value (0, 0, 0) for a component that can only be oriented to the placement reference direction.

The component information is inputted in advance from an external circuit design aiding apparatus, an external design information maintenance apparatus, or the like, and is stored in the component table 140.

Pin Table 150

FIG. 8 shows an example of pin information stored in the pin table 150. The pin table 150 stores fields showing a component type name 151, a pin number 152, a location 153, and a connecting direction 154.

The component type name field 151 shows a name that identifies a type of a component. The pin number field 152 shows a number that identifies a pin equipped on the component identified by the component type name. The location field 153 shows a relative location of the pin identified using the component type name and the pin number. The relative location is shown by the X-Y-Z coordinates of a location of the pin when the component is oriented to the placement reference direction and placed so that the placement reference point is set at the origin of the X-Y-Z space. The connecting direction field 154 shows a vector value that shows the direction to which the pin is connected. The vector value is expressed by the X-Y-Z coordinates and shows a direction to which the pin is connected when the component is placed so as to be oriented to the placement reference direction.

The pin information is inputted from an external circuit design aiding apparatus, an external design information maintenance apparatus, or the like, and is stored in the pin table 150.

Example of Component

Figure 9:
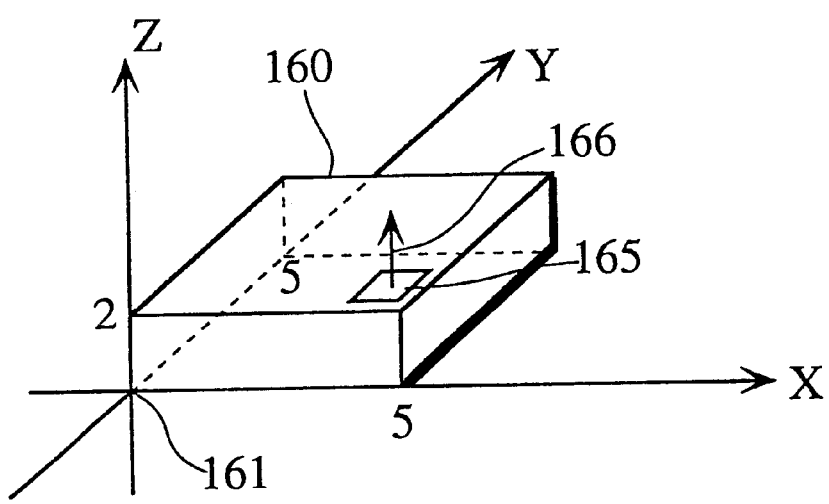
FIG. 9 shows a component expressed by the line 144 in the component table.

FIG. 9 shows a component 160 expressed by the line 144 in the component table 140. As shown in the outward shape field 142, the component 160 is a sheet member having the distance 38 of 5 mm, the distance of 5 mm, and the distance of 2 μm in the directions of the X-axis, the Y-axis, and the Z-axis respectively. The allowable range of rotation angles (a) (0, 0, *) and (b) (0, 180, *) in the allowable direction field 143 respectively indicate that (a) the component 160 can be placed in a state of being rotated at a freely chosen angle on the Z-axis and that (b) the component 160 can be placed in a state of being rotated at a freely chosen angle on the Z-axis and at an angle of 180 degrees on the Y-axis (that is, the component 160 can be placed in a state of being turned over). FIG. 9 shows the component 160 that is oriented to the placement reference direction and placed in such a manner that the placement reference point 161 of the component 160 is set at the origin of the X-Y-Z space.

As the line 155 in the pin table 150 shows, the first pin 165 equipped on the component 160 is at the coordinates (4, 1, 2), and is to be connected to the direction (0, 0, 1) shown by the vector 166.

Plural Component Table 170

Figures 10, 11:
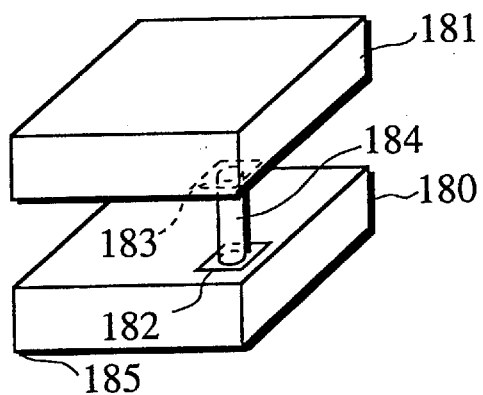
FIG. 10 shows an example of plural component information stored in a plural component table.
FIG. 11 shows an example of a plural component expressed by the line 174 in the plural component table.

FIG. 10 shows an example of plural component information stored in the plural component table 170. The plural component table 170 includes fields showing a pair number 171, a lower component type name 172, and an upper component type name 173.

The pair number field 171 shows a number that identifies a pair of components to be placed one on top of another. The lower component type name field 172 and the upper component type name field 173 respectively show a component type name of an upper component and a component type name of a lower component. The upper and lower components in the pair are to be placed one on top of another in the Z-axis direction, and are identified by the pair number.

The plural component information is inputted in advance from an external circuit design aiding apparatus, an external design information maintenance apparatus, or the like, and is stored in the plural component table 170.

Example of Plural Component

FIG. 11 shows an example of the plural component expressed by the line 174 in the plural component table 170.

A component 180 is a lower component having a pin 182 and a component 181 is an upper component having a pin 183. A via 184 is used to connect the components 180 and 181 at the locations of the respective pins 182 and 183 without going through a wiring layer.

In this example, the component 180 and the component 181 are placed in such a manner that each placement reference point coincides with a point 185, resulting in the pin 182 and the pin 183 being opposed to each other so as to be connected by the via 184. It should be noted here that the placement reference point of the component 180 is set at one of the vertexes that define the outline of the component 180, and the placement reference point of the component 181 is set outside the component 181.

Connection Table 190

Figures 12, 13:
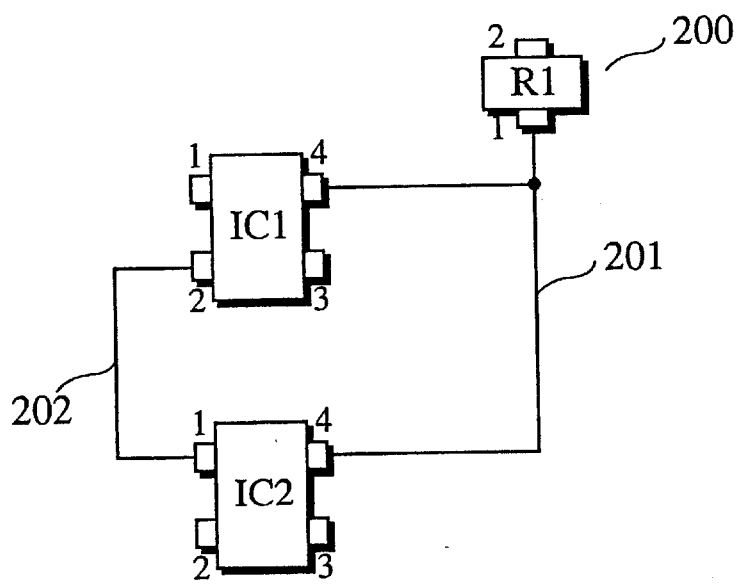
FIG. 12 shows an example of connection information stored in a connection table.
FIG. 13 shows a circuit including nets expressed by the connection table.

FIG. 12 shows an example of connection information stored in the connection table 190. The connection table 190 includes fields showing a net identification name 191 and a pin identification name 192.

The net identification name field 191 shows an identification name that identifies a net. The pin identification name field 192 shows identification names that each identify each pin belonging to the net identified by the net identification name. The pin identification name is composed of a component name and a pin number, and is used to identify a pin that is located on a component indicated by the component name and is indicated by the pin number.

The connection information is inputted in advance from an external circuit design aiding apparatus, an external design information maintenance apparatus, or the like, and is stored in the connection table 190.

Example of Connection

FIG. 13 shows a circuit 200 that includes nets expressed by the connection table 190. The line 193 in the connection table 190 shows a net 201. The net 201 is identified by a net identification name N1 and corresponds to the connection between the pin number 4 of the component IC1, the pin number 4 of the component IC2, and the pin number 1 of the component R1 in the circuit 200. The line 194 shows a net 202 which is identified by a net identification name N2 and corresponds to the connection between the pin number 2 of the component IC1 and the pin number 1 of the component IC2.

Design Reference Table 210

Figure 14A:
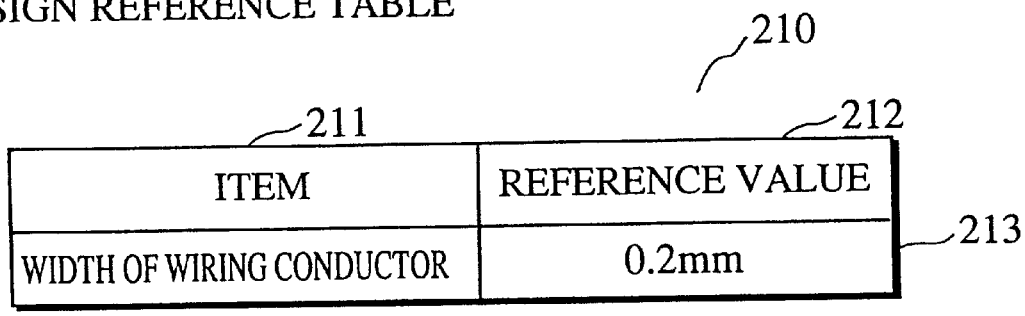
FIG. 14A shows an example of design reference information stored in a design reference table.

FIG. 14A shows an example of design reference information stored in the design reference table 210. The design reference table 210 includes fields showing an item 211 and a reference value 212.

The item field 211 shows a name of a design reference item. The reference value field 212 shows a reference value for the design reference item shown by the item name. As one example, the line 213 in the design reference table 210 indicates that a wiring conductor is to be 0.2 mm wide.

The design reference information is inputted in advance from an external circuit design aiding apparatus, an external design information maintenance apparatus, or the like, and is stored in the design reference table 210.

Wiring Component Reference Table 215

Figure 14B:
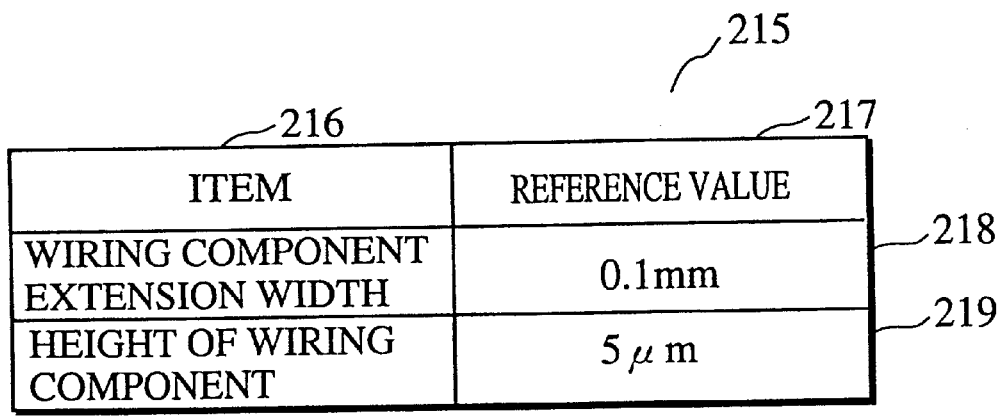
FIG. 14B shows an example of wiring component reference information stored in a wiring component reference table.

FIG. 14B shows an example of design reference information stored in the wiring component reference table 215. The wiring component reference table 215 includes fields showing an item 216 and a reference value 217.

The item field 216 shows a name that shows a specific item of a wiring component. The reference value field 217 shows a reference value for the specific item. As one example, the line 219 in the wiring component reference table 215 shows that a height of the wiring component is to be 5 $\mu$m.

The wiring component reference information is inputted in advance from an external circuit design aiding apparatus, an external design information maintenance apparatus, or the like, and is stored in the wiring component reference table 215.

Placement Table 240

FIG. 15 shows an example of placement information stored in the placement table 240. The placement table 240 includes fields showing a component identification name 241, a component type name 242, a location 243, and a direction 244.

The component identification name field 241 shows an identification name that identifies a component. The component type name field 242 shows a component type name that identifies a type of the component identified by the component identification name. The location field 243 shows coordinates of a location where a placement reference point of the component identified by the component identification name is to be placed. The direction field 244 shows a rotation angle ($\theta x$, $\theta y$, $\theta z$) that shows a direction to which the component identified by the component identification name is to be oriented. The values $\theta x$, $\theta y$, and $\theta z$ each show angles at which the component is rotated on the X-axis, Y-axis, and Z-axis from a placement reference direction, and these angles determine the direction to which the component is oriented.

The storage unit 1100 acquires placement information from the placement information generation unit 1200 and the wiring component information generation unit 1600, and stores the placement information in the placement table 240.

Via Table 250

FIG. 16 shows an example of via information stored in the via table 250. The via table 250 includes fields showing a via identification name 251, a net identification name 252, an end location 253, and a diameter 254.

The via identification name field 251 shows an identification name that identifies a via. The net identification name field 252 shows an identification name that identifies a net to which the via identified by the via identification name belongs. The end location field 253 shows two sets of coordinates showing locations of both ends of the via identified by the via identification name. The diameter field 254 shows a diameter of the via identified by the via identification name.

The storage unit 1100 acquires via information from the component connecting via information generation unit 1400, the wiring information generation unit 1500, the wiring component information generation unit 1600, and the capacitor information generation unit 170, and stores the via information into the via table 250.

Wiring Conductor Table 260

FIG. 17 shows an example of wiring conductor information stored in a wiring conductor table 260. The wiring conductor table 260 includes fields showing a wiring conductor identification name 261, a net identification name 262, a wiring layer identification name 263, a path 264, and a width 265.

The wiring conductor identification name field 261 shows an identification name that identifies a wiring conductor. The net identification name field 262 shows an identification name that identifies a net to which the wiring conductor identified by the wiring conductor identification name belongs. The wiring layer identification name field 263 shows an identification name that identifies a wiring layer that shows a location where the wiring conductor identified by the wiring conductor identification name is laid. The path field 264 shows sets of X-Y coordinates showing both ends and through points of a path of the wiring conductor identified by the wiring conductor identification name on the wiring layer. The width field 265 shows a width of the wiring conductor identified by the wiring conductor identification name.

The storage unit 1100 acquires wiring conductor information from the wiring information generation unit 1500 and stores the wiring conductor information into the wiring conductor table 260.

Pin Connecting Location Table 270

FIG. 18 shows an example of pin connecting location information stored in the pin connecting location table 270. The pin connecting location table 270 includes fields showing a component identification name 271, a pin number 272, a net identification name 273, a wiring layer identification name 274, and a location 275.

The component identification name field 271 shows an identification name that identifies a component. The pin number field 272 shows a number that identifies a pin equipped on the component identified by the component identification name. The net identification name field 273 shows an identification name that shows a net to which the pin identified using the component identification name and the pin number belongs. The wiring layer identification name field 274 shows an identification name that identifies a wiring layer to which the pin identified using the component identification name and the pin number is connected. The location field 275 shows X-Y coordinates of the central point of a region where the pin is connected to the wiring layer.

The storage unit 1100 acquires pin connecting location information from the wiring information generation unit 1500 and stores the pin connecting location information into the pin connecting location information table 270.

Layout Example

Figure 19:
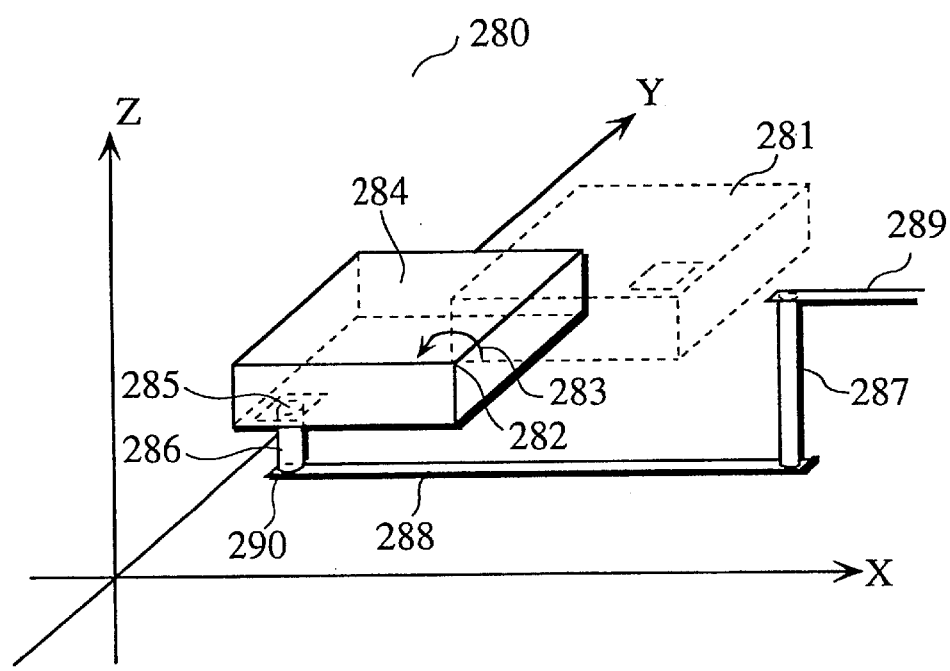
FIG. 19 shows a layout expressed by the placement table, the via table, the wiring conductor table, and the pin connecting location table.

FIG. 19 shows a layout 280 expressed by the placement table 240, the via table 250, the wiring conductor table 260, and the pin connecting location table 270.

Figure 20:
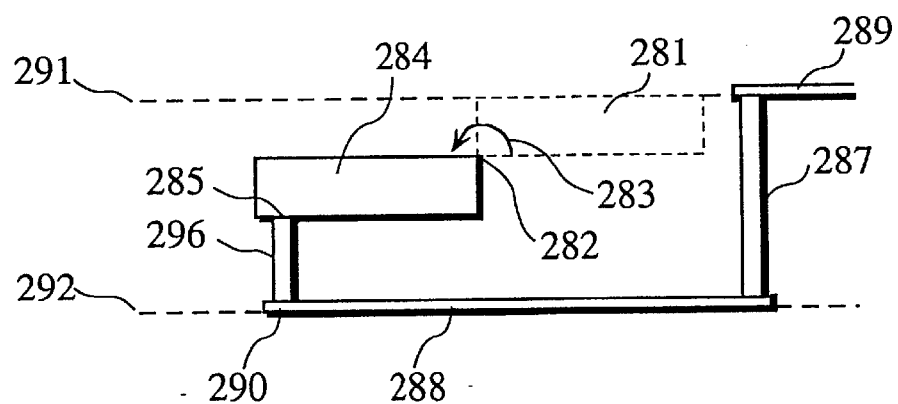
FIG. 20 is a side view showing the layout shown in FIG. 19.

FIG. 20 is a side view showing the layout 280 in which the elements are given the same reference numerals as in FIG. 19. In FIG. 20, broken lines 291 and 292 respectively show locations of wiring layers identified by the wiring layer identification names L2 and L3.

The line 246 in the placement table 240 shows a placement location of a component 284. The component 284 is placed in such a manner that a placement reference point 282 is set at the coordinates (100, 80, 18) and that the component 284 is rotated at an angle of 180 degrees on the Y-axis from the placement reference direction (that is, the component 284 is turned over). A dotted line 281 indicates a placement location of the component when it is oriented to the placement reference direction, and an arrow 283 shows the rotation of the component on the Y-axis.

A placement reference point stored in the placement table 240 and a location of each vertex that defines the outline of the component when the component is placed so as to be rotated at the rotation angle from the placement reference direction can be calculated in the following way. A relative location of each vertex stored in the outward shape field 142 in the component table 140 is rotated according to the rotation angle stored in the direction field 244, and coordinates of the resulting location are calculated. As a result, coordinates of each vertex of the placed component can be acquired.

The coordinates of the placement reference point and the rotation angle used for the above calculation can also determine a region to be occupied by the component when the component is placed within the X-Y-Z space, which is a region surrounded by each calculated vertex.

The line 255 in the via table 250 shows a placement location of a via 286. The via 286 is placed in such a manner that its both ends are respectively set at the pin 285 of the coordinates (96, 80, 16) and the point 290 of the coordinates (96, 80, 10) on the wiring layer.

The line 266 in the wiring conductor table 260 shows a placement location of the wiring conductor 288. The wiring conductor 288 is laid on the wiring layer 292 (Z=10) identified by the wiring layer identification name L3 in such a manner that it is applied to the region between the point (96, 80) and the point (106, 80) with a width of 0.2 mm.

The line 276 in the pin connecting location table 270 indicates that a pin 285 with a pin number 1 of a component identified by an identification name IC1 is connected to a point 290 of the coordinates (96, 80) on a wiring layer identified by an identification name L3. The pin connecting location information is referred to in a wiring process and an unconnection information generation process that will be described later in this specification.

Cut-Off Table 300

FIG. 21 shows an example of cut-off information stored in the cut-off table 300. The cut-off table 300 includes fields showing a cut-off identification name 301, a wiring layer identification name 302, and a shape 303.

The cut-off identification name field 301 shows an identification name that identifies a plane on which a wiring layer and a component intersect. The wiring layer identification name field 302 shows an identification name that shows the wiring layer that intersects with the component on the plane identified by the cut-off identification name. The shape field 303 shows sets of X-Y coordinates of vertexes that define the plane identified by the cut-off identification name.

The storage unit 1100 acquires cut-off information from the cut-off information generation unit 1300 and stores the cut-off information in the cut-off information table 300.

Example of Intersection of Wiring Layer and Component

Figure 22:
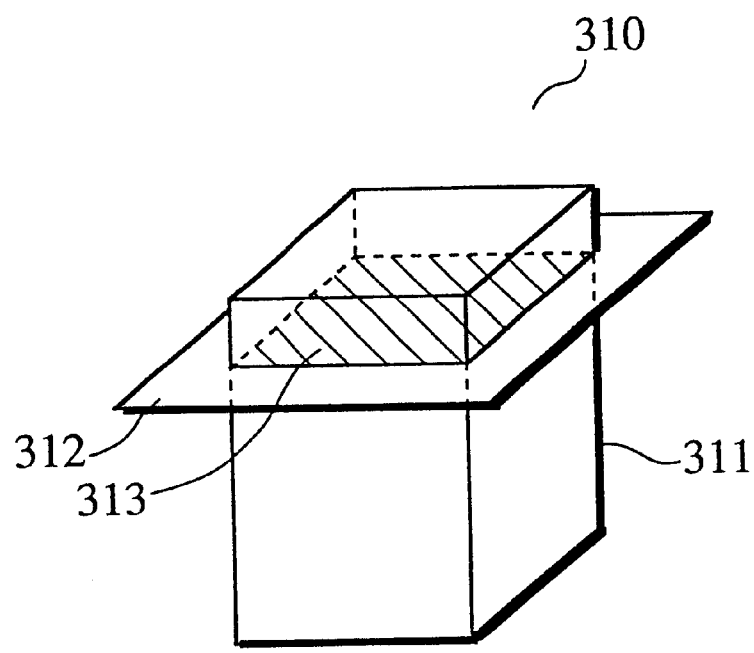
FIG. 22 shows a state of intersection of a wiring layer and a component expressed by the cut-off table.

FIG. 22 shows a state of intersection 310 of a wiring layer and a component expressed by the cut-off table 300.

Figure 23:
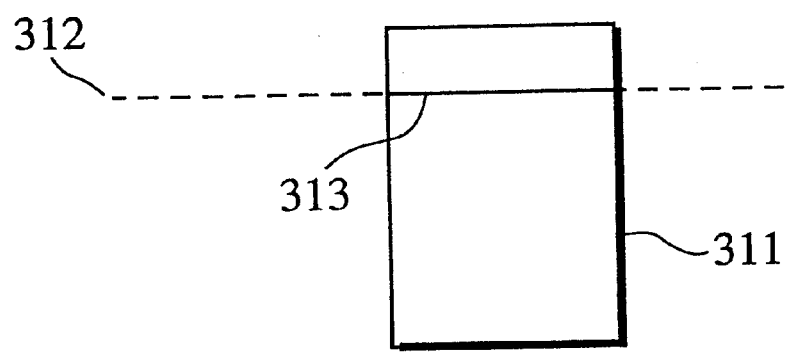
FIG. 23 is a side view showing the state of intersection shown in FIG. 22.

FIG. 23 is a side view showing the state of intersection 310 in which elements are given the same reference numerals as in FIG. 22.

Both figures show the state when the component 311 and the wiring layer 312 intersect on the plane 313 that is shaded in FIG. 22. The shape 303 in the cut-off table 300 shows that the plane 313 is a square region with vertexes of the coordinates (20, 50), (50, 50), (50, 80), and (20, 80) on the wiring layer 312 identified by the identification name L2.

Wiring Component Conductor Path Table 320

FIG. 24 shows an example of wiring component conductor path information stored in the wiring component conductor path table 320.

The wiring component conductor path table 320 includes fields showing a component type name 321, a conductor number 322, a path 323, and a width 324.

A wiring component used in the present embodiment is a nonconductor with a predetermined cubic shape and includes at least one conductor on its surface as explained before. The location of the conductor is stored in the wiring component conductor path table 320, and a shape of the wiring component is stored in the component table 140.

The component type name field 321 shows an identification name that identifies a wiring component. The conductor number field 322 shows a number that identifies a conductor on the wiring component identified by the component type name. The path field 323 shows sets of the X-Y-Z coordinates of both ends and through points of a path of the conductor identified by the conductor number laid on the component identified by the component type name. These X-Y-Z coordinates are taken when the wiring component is oriented to a placement reference direction and placed in such a manner that the placement reference point is set at the origin of the X-Y-Z space. The width field 324 shows a width of the conductor identified using the component type name and the conductor number.

The storage unit 1100 acquires wiring component conductor path information from the wiring component information generation unit 1600 and stores the wiring component conductor path information into the wiring component path information table 320.

Example of Wiring Component

Figure 25:
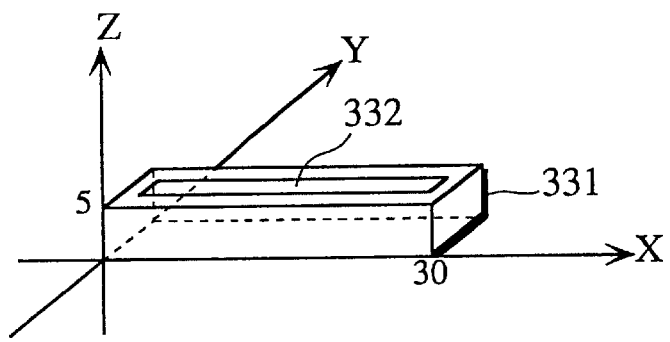
FIG. 25 shows a wiring component expressed by the line 325 in the wiring component conductor path table and the line 145 in the component table.

FIG. 25 shows a wiring component 331 expressed by the line 325 in the wiring component conductor path table 320 and the line 145 in the component table 140.

The line 145 in the component table 140 shows locations of vertexes that define the outline of the wiring component 331. The wiring component 331 is a sheet member with the vertexes shown in the shape field 142, with the distance of 30 mm, 6 mm, and 5 $\mu$m in the respective directions of the X-axis, the Y-axis, and the Z-axis. The value (0, 0, 0) in the allowable direction field 143 indicates that the wiring component 331 can only be oriented to the placement reference direction.

The line 325 in the wiring component conductor path table 320 shows a location of a conductor 332 laid on the component 331. The conductor 332 is laid on the wiring component 331 in such a manner that both ends of the path of the conductor 332 with the width of 0.2 mm are at the coordinates (4, 3, 5) and (26, 3, 5) when the wiring component 331 is oriented to the placement reference direction and placed in such a manner that the placement reference point is set at the origin of the X-Y-Z space.

It should be noted here that a path of a conductor laid on a wiring component does not need to be straight, and that a plurality of conductors may be laid on a wiring component.

Figure 26:
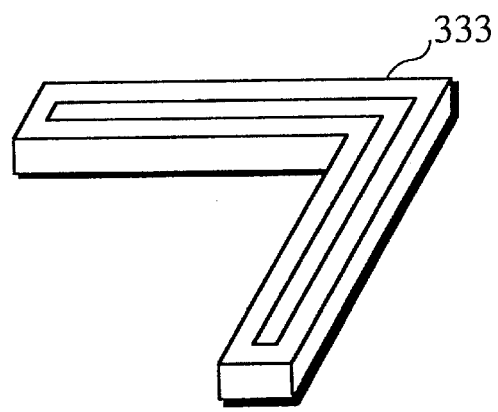
FIG. 26 shows an example of a wiring component on which a conductor whose path is not straight is laid.

FIG. 26 shows, as one example, a wiring component 333 on which the conductor is laid in such a manner that its path is not straight.

Figure 27:
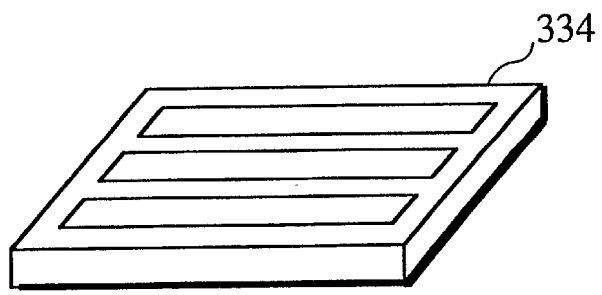
FIG. 27 shows an example of a wiring component on which a plurality of conductors are laid.

FIG. 27 shows, as one example, a wiring component 334 on which a plurality of conductors are laid.

Capacitor Table 340

FIG. 28 shows an example of capacitor information stored in the capacitor table 340. The capacitor table 340 includes fields showing a capacitor identification name 341, a wiring layer identification name 342, and a shape 343.

The capacitor identification name field 341 shows an identification name that identifies a capacitor. The capacitor wiring layer identification name field 342 shows an identification name that identifies a wiring layer on which a wiring conductor that forms the capacitor identified by the capacitor identification name is located. The shape field 343 shows information about a shape of the wiring conductor identified by the capacitor identification name.

The storage unit 1100 acquires capacitor information from the capacitor information generation unit 1700 and stores the capacitor information generation unit 1700 into the capacitor table 340.

Example of Capacitor Construction

Figure 29A:
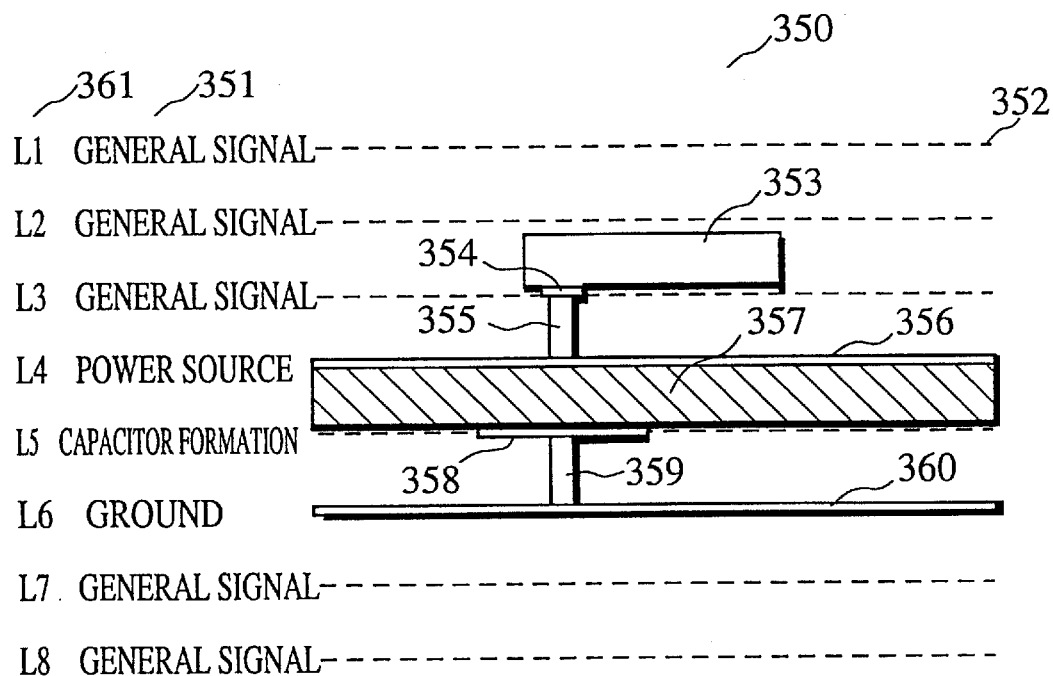
FIG. 29A is a side view showing an example construction of a bypass capacitor as one example construction of a capacitor.

As one example of the capacitor construction, FIG. 29A shows a side view of a capacitor that is provided to decrease noise generated at the point to supply electricity to a component (so called, a bypass capacitor).

In FIG. 29A, a multilayer wiring board 350 includes eight wiring layers, each of which is accompanied by an identification name 361, a usage 351, and a broken line 352. The broken line 352 shows a location of each wiring layer. The component 353 is placed between the wiring layers L3 and L2, and power is supplied from the wiring conductor 356 laid on an entire surface of a power source wiring layer to a power source pin 354 by a via 355. A dielectric 357 is placed between the power source wiring layer and a capacitor forming layer. The wiring conductor 358 is laid on a region opposed to the via 355 with the dielectric 357 in between and is connected to the wiring conductor 360 laid on an entire surface of a ground wiring layer by a via 359.

In the above described example, the capacitor is formed by the wiring conductor 356 and the wiring conductor 358 with the dielectric 357 interposed in between. A necessary area of the wiring conductor 358 is calculated using a necessary capacity of the capacitor, a thickness of the dielectric 357, and a dielectric constant of the dielectric 357.

In FIG. 28, the capacitor table 340 shows information showing a location and a shape of the wiring conductor laid on a capacitor forming layer. The line 344 indicates that the wiring conductor with the diameter of 5 mm is provided on the wiring layer L5, in such a manner that the center of the wiring conductor is set at the coordinates (100, 80).

It should be noted here that a shape of the wiring conductor that forms the capacitor can be a circle as one example, however, it may instead be a square or the like as long as the wiring conductor has an area that can secure the necessary capacity.

Figure 29B:
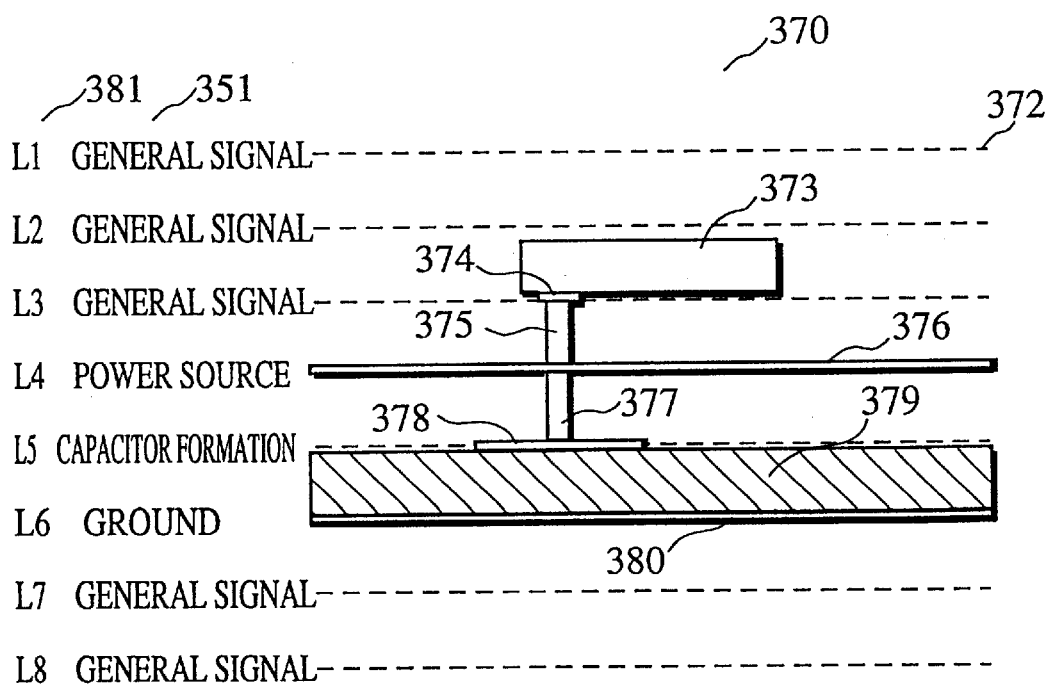
FIG. 29B is another example construction of a bypass capacitor.

FIG. 29B shows an example construction of a bypass capacitor in a multilayer wiring board where a dielectric is placed between a capacitor forming layer and a ground wiring layer, which is not explained in detail in this specification.

Unconnection Table 390

FIG. 30 shows an example of unconnection information stored in the unconnection table 390. The unconnection table 390 includes fields showing an element type 391 and an identification name 392. The element type field 391 shows an element type name that identifies an element as a pin, a via, or a wiring conductor, the element belonging to a net whose wiring is not complete. The identification name field 392 shows an identification name that identifies the pin, the via, or the wiring conductor. Here, an identification name for identifying a pin is composed of a component identification name and a pin number, and an identification name for identifying a via and the a wiring conductor is respectively expressed using a via identification name and a wiring conductor identification name.

The storage unit 1100 acquires unconnection information from the unconnection information generation unit 1800 and stores the unconnection information into the unconnection table 390.

Placement Information Generation Unit 1200

The placement information generation unit 1200 is activated by the control unit 1020 when command information delivered from the input unit 1010 includes a command type "placement". At this point, the control unit 1020 delivers the placement information generation unit 1200 a parameter included in the command information so that the placement information generation unit 1200 executes the placement information generation process based on the parameter.

Figure 32:
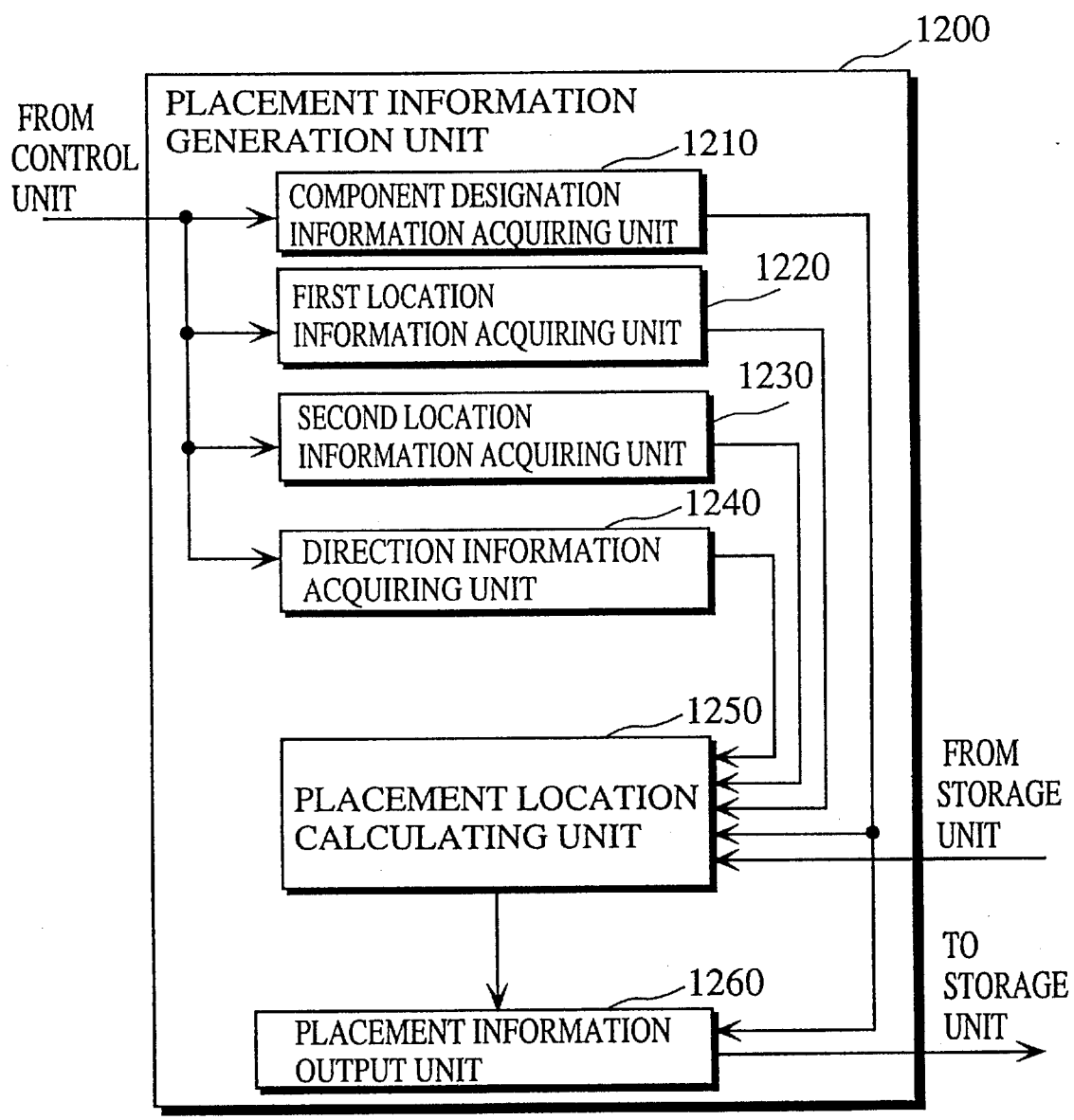
FIG. 32 shows an example construction of a placement information generation unit.

FIG. 32 shows an example of the construction of the placement information generation unit 1200. The placement information generation unit 1200 includes a component designation information acquiring unit 1210, a first location information acquiring unit 1200, a second location information acquiring unit 1230, a direction information acquiring unit 1240, a placement location calculating unit 1250, and a placement information output unit 1260.

The component designation information acquiring unit 1210, the first location information acquiring unit 1220, the second location information acquiring unit 1230, and the direction information acquiring unit 1240 extract predetermined information from the parameter included in command information acquired from the control unit 1020.

The placement location calculating unit 1250 calculates a placement reference location based on each extracted information, and the placement information output unit 1260 outputs placement information including the calculated placement reference location to the storage unit 1100. The storage unit 1100 stores the received placement information into the placement table 240.

The following is a detailed explanation of parameters delivered to the placement information generation unit 1200 by the control unit 1020 with reference to FIG. 2.

In the figure, the lines 223 to 225 each show an example of a parameter included in the placement command. Each parameter is made up of five parts separated by a comma. The first part shows a component identification name, the second part a component type name, the third part a set of coordinates of a location on the X-Y plane, the fourth part information showing a location in the Z-axis direction, and the fifth part a rotation angle on the X-axis, Y-axis, and Z-axis from a placement reference direction, the rotation angle showing a placement direction.

The fourth part is designated according to one of the following formats.

<The first format>

One wiring layer identification name is designated.

<The second format>

Two wiring layer identification names are designated.

<The third format>

One wiring layer identification name and a distance in the Z-axis direction are designated.

Examples shown by the lines 223, 224, and 225 respectively correspond to the first format, the second format, and the third format.

Placement Information Generation Process in Detail

Figure 40:
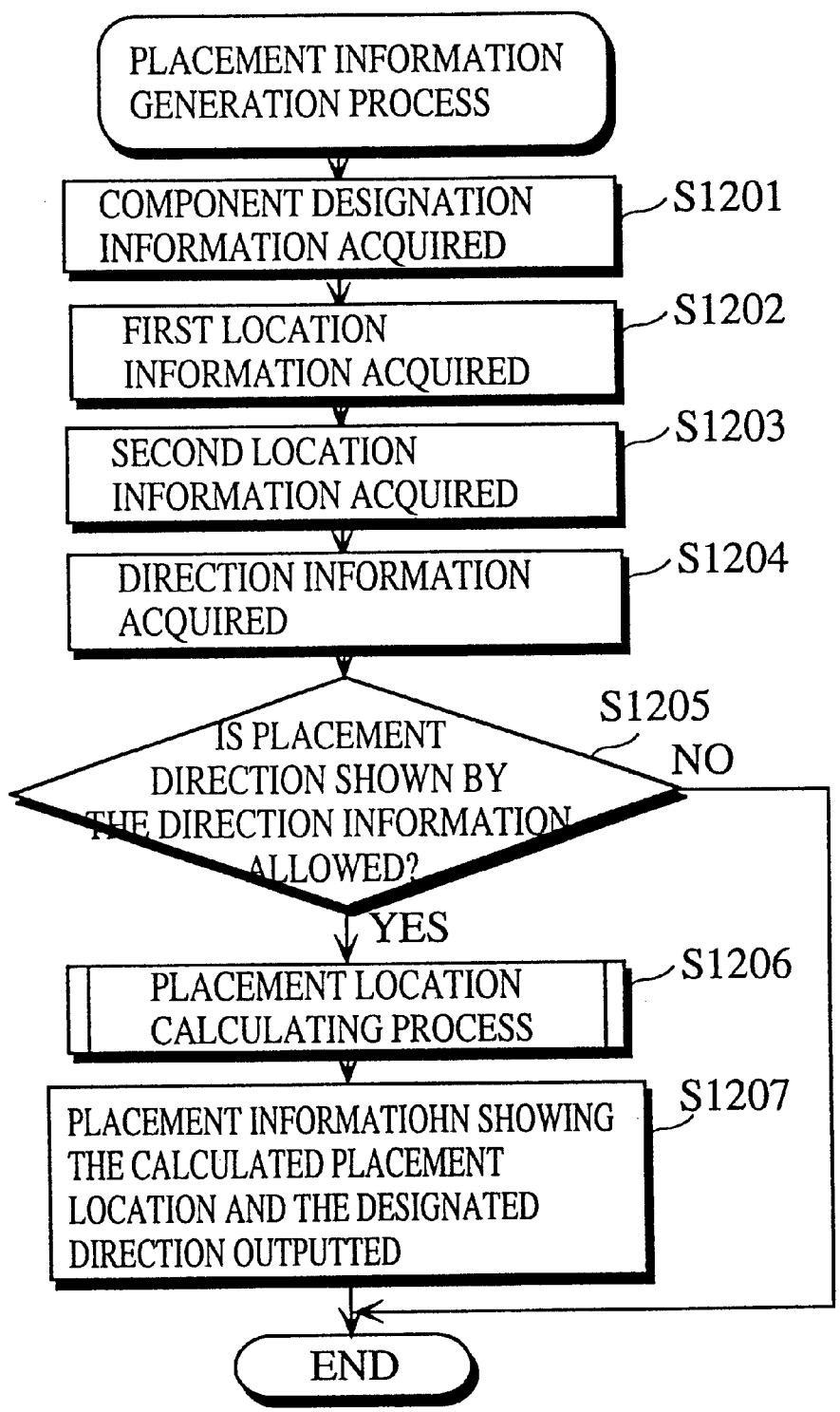
FIG. 40 is a flowchart showing a detailed operation of the placement information generation unit.
Figure 41:
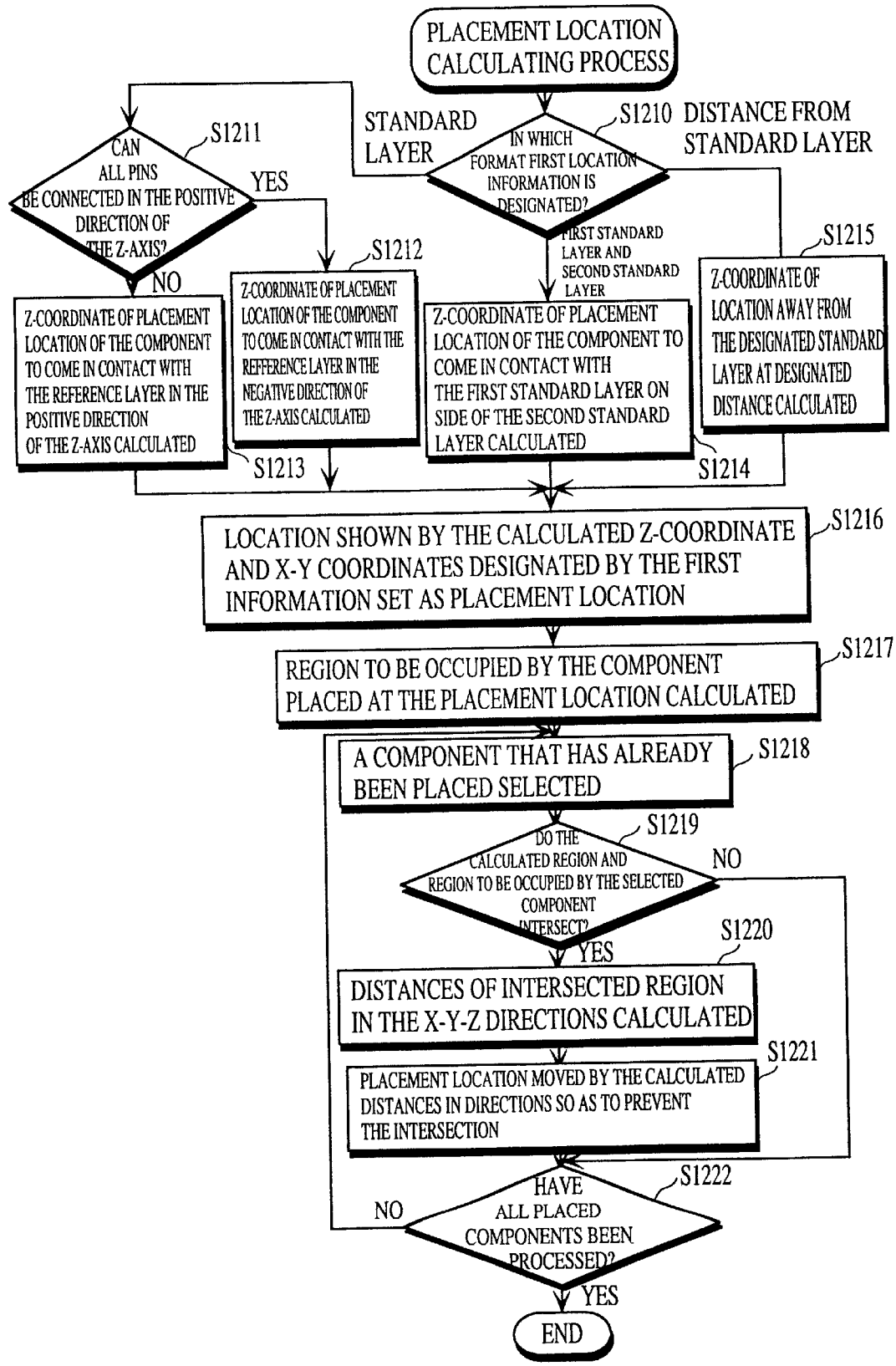
FIG. 41 is a flowchart showing a detailed operation of the placement information generation unit.

Flowcharts in FIGS. 40 and 41 each show a detailed operation of the placement information generation unit 1200.

The following is a detailed explanation of the placement information generation process with reference to the flowchart shown in FIG. 40.

(Step S1201) The component designation information acquiring unit 1210 extracts a component identification name and a component type name designated in the first part and the second part of the parameter that has been delivered by the control unit 1020.

(Step S1202) The first location information acquiring unit 1220 extracts the X-Y coordinates designated in the third part of the parameter.

(Step S1203) The second location information acquiring unit 1230 extracts one of (1) one wiring layer identification name, (2) two wiring layer identification names, and (3) one wiring layer identification name and a distance in the Z-axis direction, that is designated in the fourth part of the parameter.

(Step S1204) The direction information acquiring unit 1240 extracts a rotation angle designated in the fifth part of the parameter.

The placement location calculating unit 1250 calculates, based on the above designated information, a placement reference location of the component by executing the following steps.

(Step S1205) The placement location calculating unit 1250 acquires an allowable direction stored in correspondence with the designated component type name in the component table 140. When the above designated rotation angle is not included in a range of the acquired allowable direction, the placement location calculating unit 1250 ends the placement information generation process.

(Step S1206) The placement location calculating unit 1250 executes a placement location calculating process to acquire the X-Y-Z coordinates of a placement location of a placement reference point of the designated component. The placement location calculating process is explained in detail later.

(Step S1207) The placement information output unit 1260 outputs placement information composed of the designated component identification name, the designated component type name, the calculated X-Y-Z coordinates, and the designated rotation angle to the storage unit 1100.

Placement Location Calculating Process in Detail

The following is a detailed explanation of the placement location calculating process with reference to the flowchart in FIG. 41.

(Step S1210) The placement location calculating unit 1250 branches the processing according to a format in which the fourth part of the parameter is designated.

(Step S1211) When the fourth part of the parameter is designated in the first format, the following steps are performed. A wiring layer identified by a designated wiring layer identification name is made as a standard layer. A judgement is performed as to whether all pins of the designated component are oriented to be connected in the positive direction of the Z-axis when the designated component is oriented to the direction indicated by the designated rotation angle. This judgement is performed in the following way. A vector stored in the connecting direction field 154 in the pin table 150 is rotated at the designated rotation angle, and it is judged whether the resulting vector is oriented to the positive direction of the Z-axis.

(Step S1212) When the above judgement result is affirmative, the placement location calculating unit 1250 calculates the Z-coordinate of a placement reference point of the component when the component is placed so as to come in contact with the standard layer in the negative direction of the Z-axis.

(Step S1213) When the above judgement result is negative, the placement location calculating unit 1250 calculates the Z-coordinate of the placement reference point of the component when the component is placed so as to come in contact with the standard layer in the positive direction of the Z-axis.

(Step S1214) When the fourth part of the parameter is designated in the second format, the present step is performed. Two wiring layers identified by the designated two wiring layer identification names are made the first standard layer and the second standard layer in designated order. The placement location calculating unit 1250 calculates the Z-coordinate of a placement reference point of the designated component when the designated component is placed so as to come in contact with a surface of the first standard layer, the surface of the first standard layer facing the second standard layer.

(Step S1215) When the fourth part of the parameter is designated in the third format, the present step is performed. The placement location calculating unit 1250 calculates the Z-coordinate of a location that is away at a designated distance from a wiring layer identified by a designated wiring layer identification name.

(Step S1216) A location determined by the Z-coordinate calculated in step S1212, step S1214, or step S1215 and the designated X-Y coordinates is set as a placement location of the placement reference point of the designated component.

(Step S1217) The placement location calculating unit 1250 calculates a region occupied by the component when the component is oriented to the direction shown by the designated rotation angle and placed in such a manner that the placement reference point of the component is at the above location.

The region is calculated using (a) the location of the placement reference point, (b) the rotation angle of the component, and (c) each set of coordinates stored in correspondence with a component type name in the shape 142 in the component table 140 as explained before. Each set of coordinates is a set of relative coordinates of each vertex that defines the outline of the component. Each set of relative coordinates is first converted into a set of absolute coordinates using the placement location of the placement reference point and the rotation angle, so that the outline determined by each vertex of the converted coordinates can be calculated. An internal area of a cubic formed by the calculated outline is judged to be the region to be occupied by the component.

(Step S1218) The placement reference point calculating unit 1250 acquires a component identification name, and a component type name, a location, and a rotation angle stored in correspondence with the component identification name from the placement table 240.

(Step S1219) An area occupied by the acquired component when the component is oriented to the direction shown by the acquired rotation angle in such a manner that its placement reference point is set at the acquired location is calculated. A judgement is performed as to whether the calculated area intersects with the area calculated in step S1216.

(Step S1220) When the above judgement result is affirmative, a distance of each of the X-axis, Y-axis, and Z-axis occupied by the intersected part is calculated.

(Step S1221) The placement reference point of the component to be placed is moved by at least the calculated distances in the respective directions so that these two areas do not intersect.

(Step S1222) The processing from step S1218 is repeated for each component stored in the placement table 240.

Cut-Off Information Generation Unit 1300

When command information delivered by the input unit 1010 includes a command type "cut-off", the cut-off information generation unit 1300 is activated by the control unit 1020 and executes a cut-off information generation process.

Figure 33:
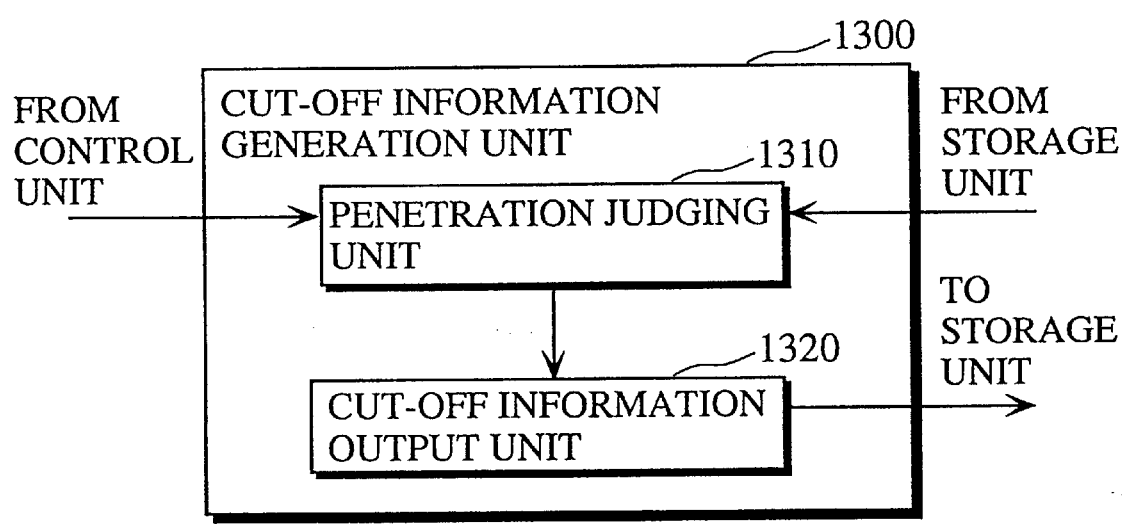
FIG. 33 shows an example construction of a cut-off information generation unit.

FIG. 33 shows an example of the construction of the cut-off information generation unit 1300. The cut-off information generation unit 1300 includes a penetration judging unit 1310 and a cut-off information output unit 1320.

The penetration judging unit 1310 calculates a location and a shape of a plane on which a wiring layer and a component intersect. The cut-off information output unit 1320 outputs cut-off information including the location and the shape of the calculated intersected plane to the storage unit 1100. The storage unit 1100 stores the received cut-off information into the cut-off table 300.

Cut-Off Information Generation Unit in Detail

Figure 42:
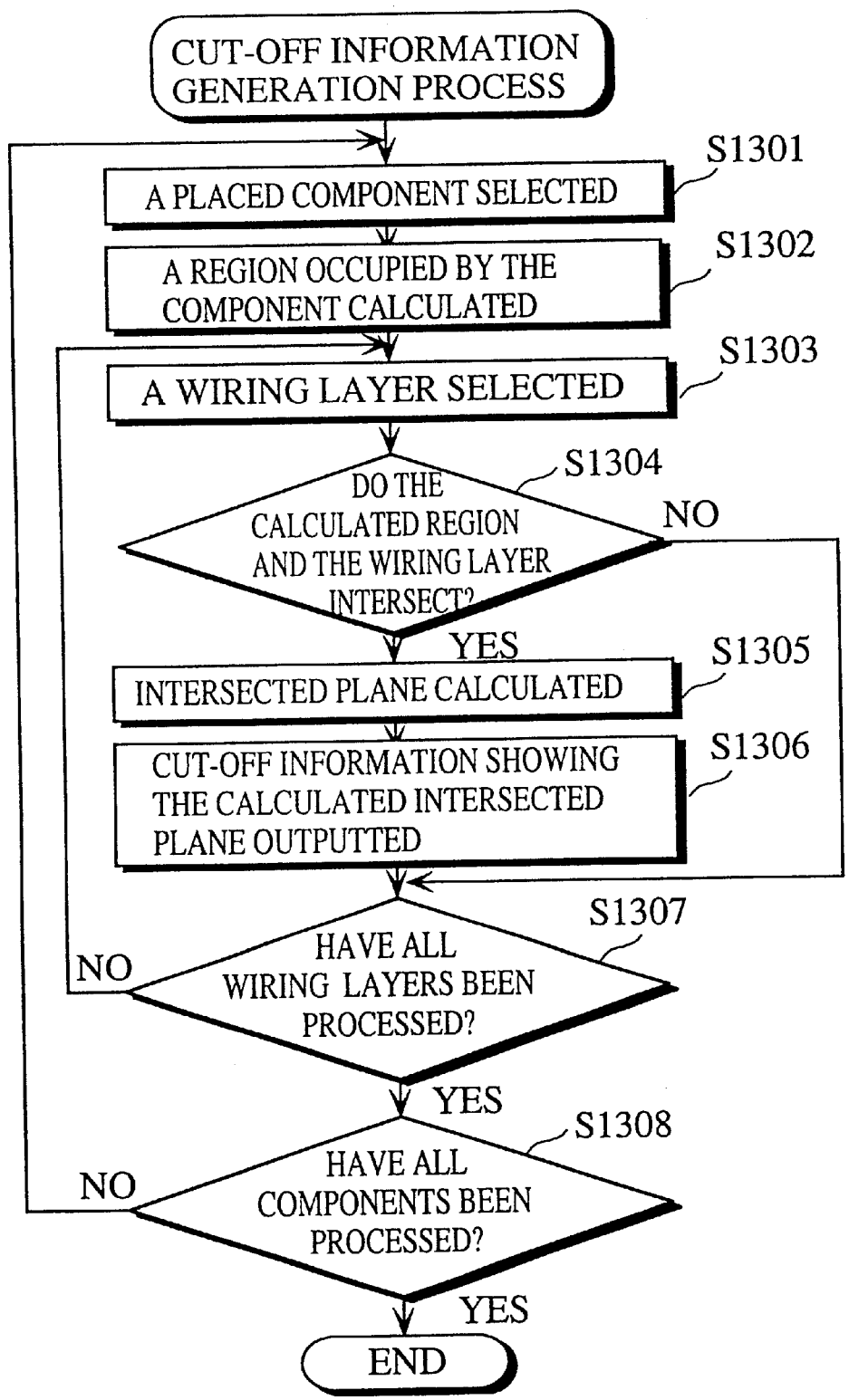
FIG. 42 is a flowchart showing a detailed operation of the cut-off information generation unit.

A flowchart in FIG. 42 shows a detailed operation of the cut-off information generation unit 1300.

The following is a detailed explanation of the cut-off information generation process with reference to the flowchart shown in FIG. 42.

(Step S1301) The penetration judging unit 1310 selects one set of placement information from the placement table 240 and acquires a component identification name, a component type name, a location, and a rotation angle included in the acquired placement information.

(Step S1302) A region to be occupied by the component when the component is oriented to the direction shown by the acquired rotation angle and placed in such a manner that its placement reference point is set at the acquired location is calculated.

(Step S1303) A wiring layer is selected.

(Step S1304) A judgement is performed as to whether the calculated region and the selected wiring layer intersect.

(Step S1305) When the above judgement result is affirmative, a shape and a location of the plane on which the calculated region and the selected wiring layer intersect are calculated. As one example, the location and the shape are expressed by the coordinates of each vertex that defines the intersected plane. The coordinates of each vertex can be acquired by calculating simultaneous equations composed of an equation expressing the outline of the component and an equation expressing the selected wiring layer.

(Step S1306) The cut-off information output unit 1320 outputs cut-off information composed of an identification name that uniquely identifies the intersected plane, a wiring layer identification name that identifies the selected wiring layer, and each calculated set of coordinates to the storage unit 1100.

(Step S1307) The penetration judging unit 1310 repeats the processing from step S1303 for each wiring layer.

(Step S1308) The processing from step S1301 is repeated for each component in the placement table 240.

Component Connecting Via Information Generation Unit 1400

When command information delivered from the input unit 1010 shows a command type "component connecting via", the component connecting via information generation unit 1400 is activated by the control unit 1020 and executes a component connecting via information generation process.

A via is a conductor provided typically in a linear shape in the Z-axis direction inside the wiring board as mentioned early in this specification. It should be noted here that a via that is connected to a component placed inside the wiring board is particularly called "a component connecting via".

Figure 34:
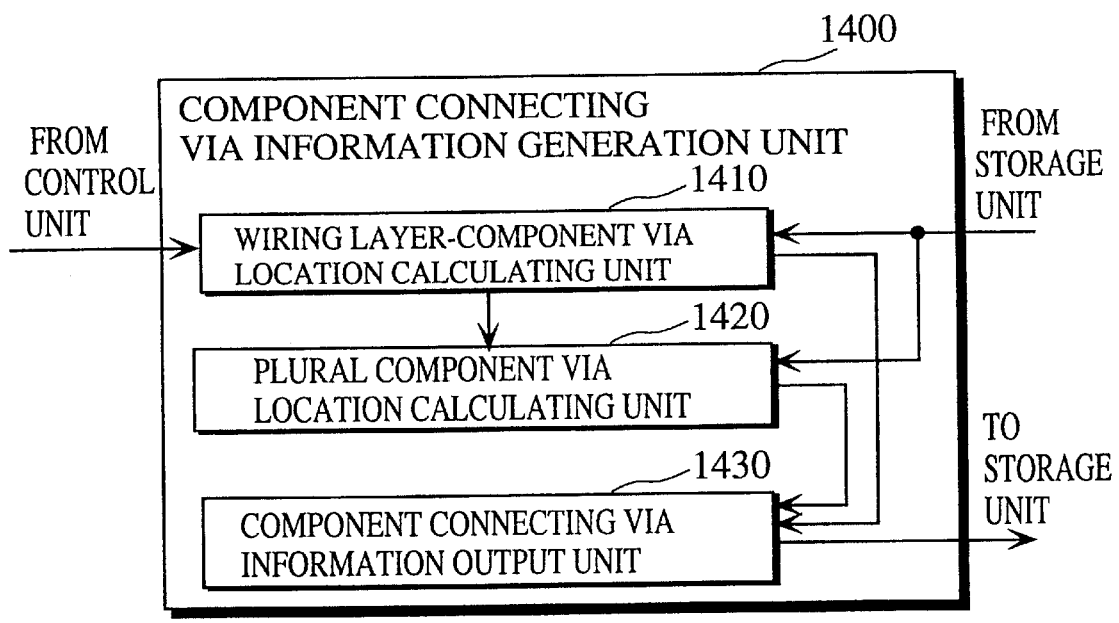
FIG. 34 shows an example construction of a component connecting via information generation unit.

FIG. 34 shows an example of the construction of the component connecting via information generation unit 1400. The component connecting via information generation unit 1400 includes a wiring layer-component via location calculating unit 1410, a plural component via location calculating unit 1420, and a via information output unit 1430.

The wiring layer-component via location calculating unit 1410 calculates a placement location of a via to connect (a) the wiring conductor on a wiring layer and (b) a pin equipped on a component. The plural component via location calculating unit 1420 calculates a placement location of a via to connect an upper component and a lower component that compose the plural component. The via information output unit 1430 outputs via information including the calculated placement location to the storage unit 1100. The storage unit 1100 stores the received via information into the via table 250.

Component connecting via Information Generation Process in Detail

Figure 43:
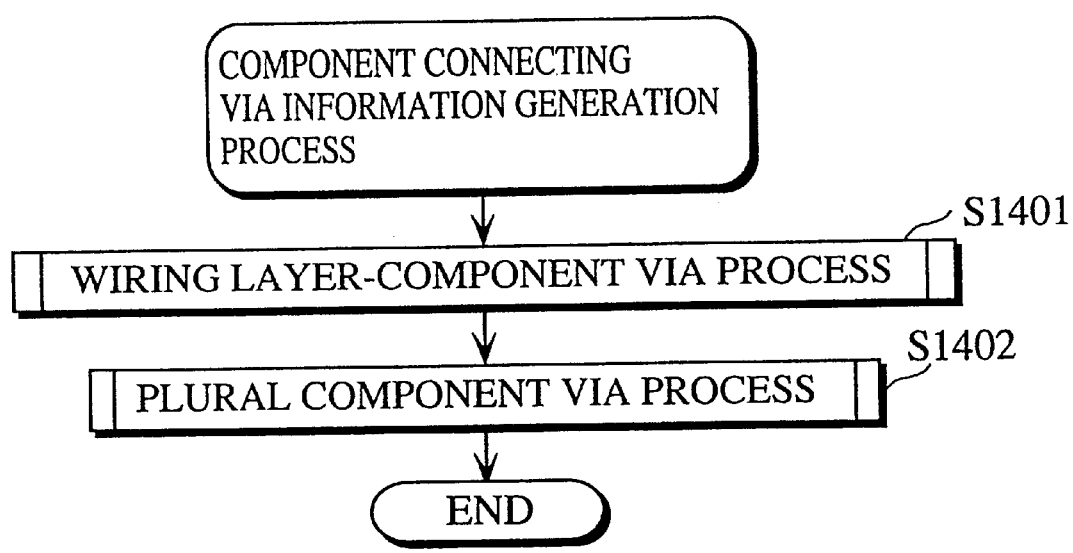
FIG. 43 is a flowchart showing a detailed operation of the component connecting via information generation unit.
Figure 44:
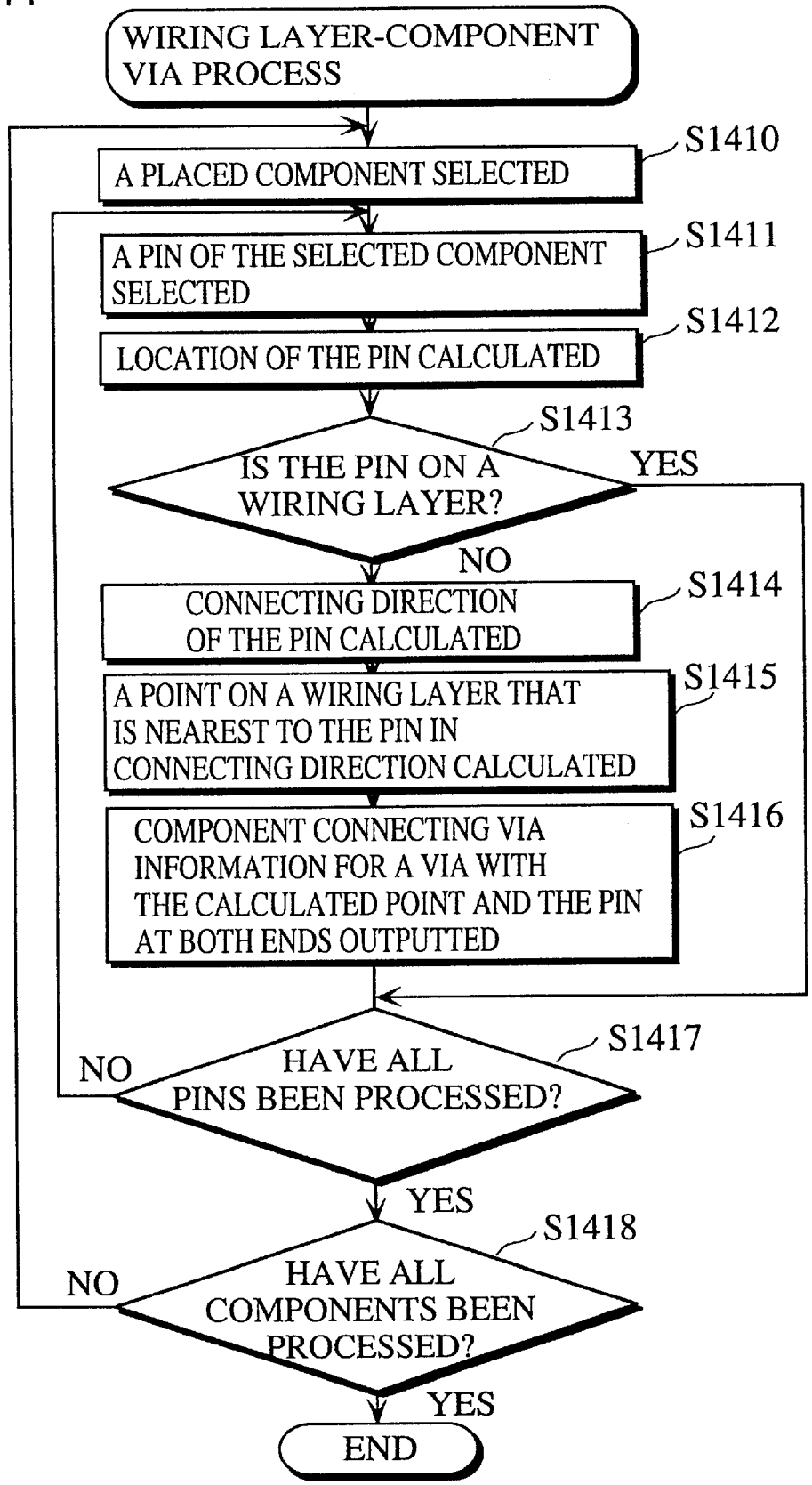
FIG. 44 is a flowchart showing a detailed operation of the component connecting via information generation unit.
Figure 45:
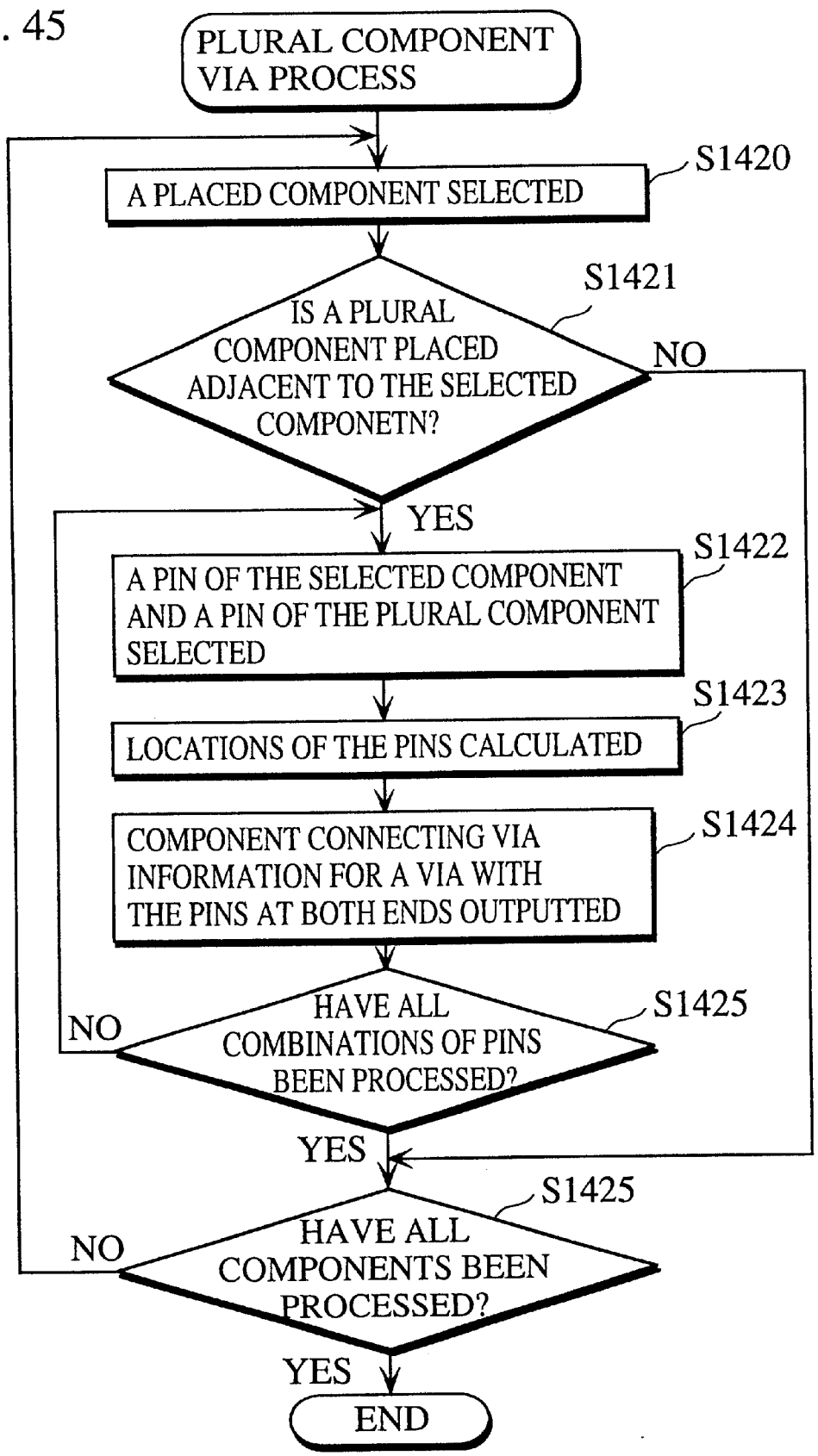
FIG. 45 is a flowchart showing a detailed operation of the component connecting via information generation unit.

Flowcharts in FIGS. 43, 44, and 45 each show a detailed operation of the component connecting via information generation unit 140.

The following is a detailed explanation of the component connecting via information generation process with reference to the flowchart shown in FIG. 43.

(Step S1401) The wiring layer-component via location calculating unit 1410 performs a wiring layer-component via process and calculates a placement location of a via to connect the wiring conductor laid on a wiring layer and a pin equipped on a component. This process is explained in detail later.

(Step S1402) The plural component via location calculating unit 1410 performs a plural component via process and calculates a placement location of a via to connect an upper component and a lower component that compose a plural component. This process is explained in detail later.

Wiring layer-Component Via Process in Detail

The following is an explanation of the wiring layer-component via process with reference to the flowchart shown in FIG. 44.

(Step S1410) The wiring layer-component via location calculating unit 1410 acquires one set of placement information from the placement table 240.

(step S1411) The wiring layer-component via location calculating unit 1410 acquires one set of pin information that includes a same component type name as the above acquired component type name.

(Step S1412) The X-Y-Z coordinates showing a location of the pin included in the acquired pin information are calculated.

(Step S1413) A judgement is performed as to whether the calculated Z-coordinate coincides with the Z-coordinate of a wiring layer. When the above judgement result is affirmative, the pin is located at the wiring layer. This means that the pin is directly connected to the wiring conductor, and so a component connecting via is not necessary. The processing advances to step S1417.

(Step S1414) A connecting direction included in the acquired pin information is rotated at the rotation angle included in the acquired placement information.

(Step S1415) A vertical line is drawn from the location calculated in step S1412 to a nearest wiring layer in the resulting direction in Step 1414, and a location where the line comes in contact with the wiring layer is calculated.

(Step S1416) The via information output unit 1430 acquires a net identification name of a net to which the pin identified using the component identification name included in the acquired placement information and the pin number included in the acquired pin information from the connection table 190.

The via information outputs unit 1430 outputs via information including the identification name that uniquely identifies the via, the acquired net identification name, the location calculated in step S1412, and the calculated location where the vertical line comes in contact with the wiring layer to the storage unit 1110.

(Step S1417) The wiring layer-component via location calculating unit 1410 repeats the processing from step S1411 for each pin information that includes a same component type name as the acquired component type name stored in the pin table 150.

(Step S1418) The processing from step S1410 is repeated for each placement information stored in the placement table 240.

Plural Component Via Process in Detail

The following is a detailed explanation of the plural component via process with reference to the flowchart shown in FIG. 45.

(Step S1420) The plural component via location calculating unit 1420 acquires first placement information from the placement table 240.

(Step S1421) The plural component via location calculating unit 1420 acquires an upper component type name stored in correspondence with a lower component type name that coincides with the component type name included in the acquired first placement information from the plural component table 170, and searches the placement table 240 for second placement information including a component type name that coincides with the acquired upper component type name and a location that coincides with the location included in the acquired first placement information.

(Step S1422) The plural component via location calculating unit 1420 selects a pin equipped on a component included in the acquired first placement information and a pin equipped on the component included in acquired the second placement information, each pin identified by the same pin number.

(Step S1423) Locations of the two selected pins are calculated.

(Step S1424) The via information output unit 1430 acquires a net identification name of a net to which the pin identified using (a) the component identification name included in the acquired first placement information and (b) the pin number identifying the above selected pin belongs from the connection table 190.

The via information output unit 1430 outputs via information including an identification name that uniquely identifies the via, the acquired net identification name, and the two locations calculated in step S1423 to the storage unit 1100.

(Step S1425) The plural component via location calculating unit 1420 repeats the processing from step S1422 for each pair of pins that are identified by a same pin number.

(Step S1426) The processing from step S1420 is repeated for each placement information stored in the placement table 240.

Wiring Information Generation Unit 1500

When command information delivered from the input unit 1010 includes a command type "wiring", the wiring information generation unit 1500 is activated and executes a wiring information generation process.

Figure 35:
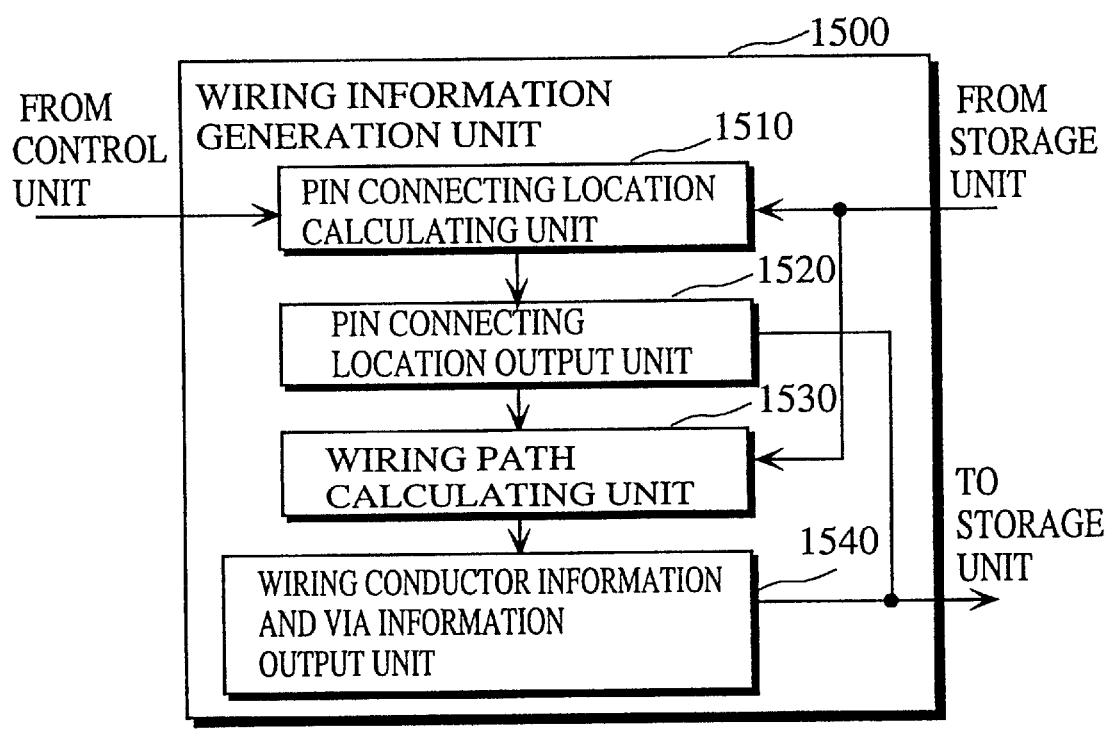
FIG. 35 shows an example construction of a wiring information generation unit.

FIG. 35 shows an example of the construction of the wiring information generation unit 1500. The wiring information generation unit 1500 includes a pin connecting location calculating unit 1510, a pin connecting location information output unit 1520, a wiring path calculating unit 1530, a wiring conductor and via information output unit 1540.

The pin connecting location calculating unit 1510 calculates a location on a wiring layer where a pin is connected either directly or by a component connecting via. The pin connecting location information output unit 1520 outputs pin connecting location information including the calculated location to the storage unit 1100. The storage unit 1100 stores the received pin connecting location information into the pin connecting location table 270.

The wiring path calculating unit 1530 calculates a path of a wiring conductor and a location of each via which provide the predetermined wiring between the pin connecting locations. The wiring conductor and via information output unit 1540 outputs (a) wiring conductor information including the calculated path of the wiring conductor and (b) via information including the location of the via to the storage unit 1100. The storage unit 1100 stores the received wiring conductor information and the via information respectively into the wiring conductor table 260 and the via table 250.

Wiring Information Generation Process in Detail

Figure 46:
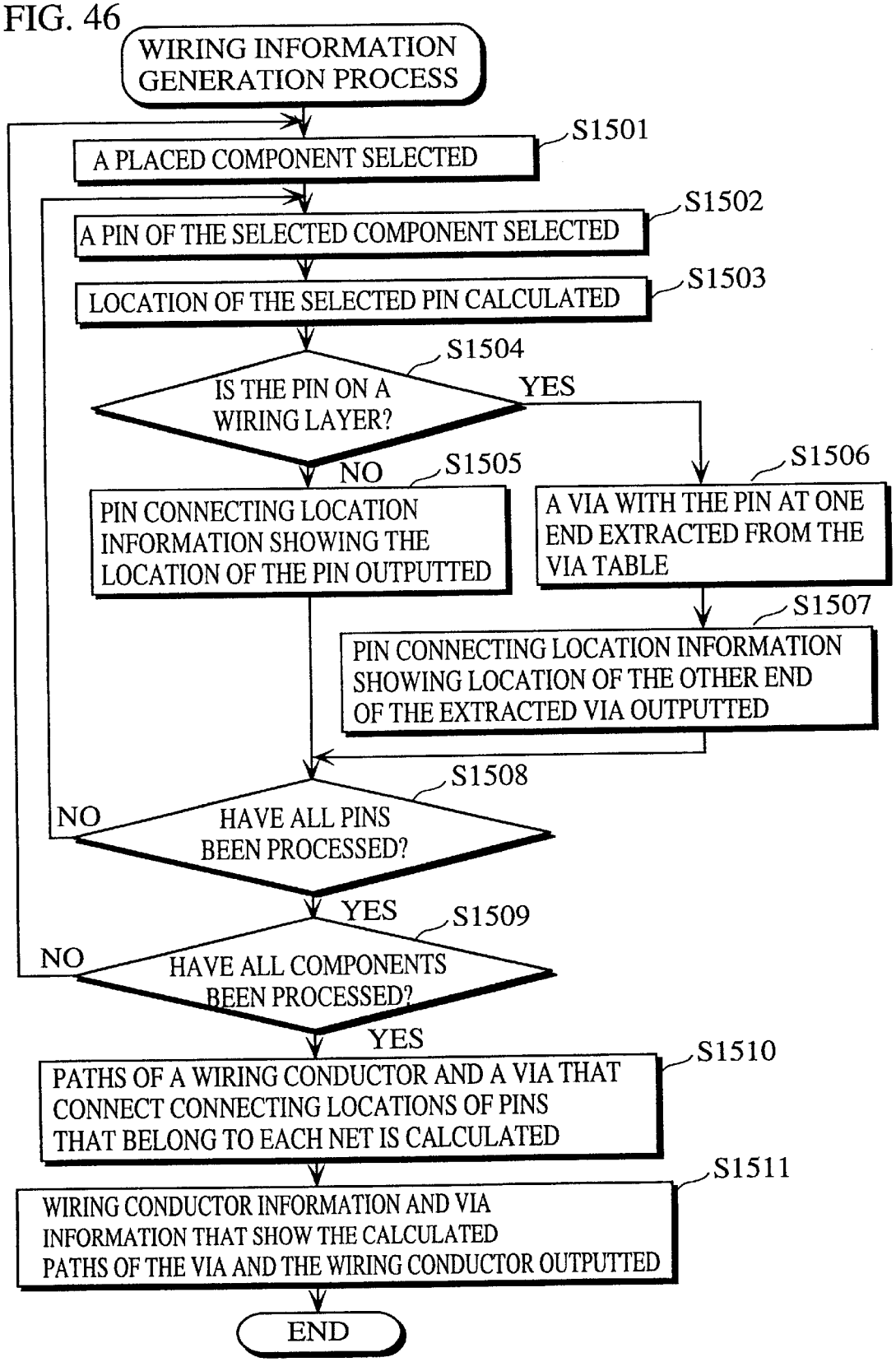
FIG. 46 is a flowchart showing a detailed operation of the wiring information generation unit.

A flowchart in FIG. 46 shows a detailed operation of the wiring information generation unit 1500.

The following is a detailed explanation of the wiring information generation process with reference to the flowchart shown in FIG. 46.

(Step S1501) The pin connecting location calculating unit 1510 acquires one set of placement information from the placement table 240.

(Step S1502) The pin connecting location calculating unit 1510 acquires a set of pin information including a component type name that coincides with a component type name included in the acquired set of placement information from the pin table 150.

(Step S1503) The X-Y-Z coordinates of a location of the pin are calculated. A net identification name of a net to which the pin belongs is acquired from the connection table 190.

(Step S1504) A judgement is performed as to whether the calculated Z-coordinate coincides with the Z-coordinate showing a location of a wiring layer.

(Step S1505) If the above judgement result is affirmative, the pin connecting location information output unit 1520 outputs pin connecting location information that includes the component identification name, the pin number, the acquired net identification name, a wiring layer identification name identifying the wiring layer shown by the Z-coordinate, and the X-Y coordinates of a location of the pin to the storage unit 1100 so that the storage unit 1100 stores the pin connecting location information into the pin connecting location table 270.

(Step S1506) When the above judgement result is negative, the pin connecting location calculating unit 1510 acquires via information for a via whose one end positioned at the calculated location of the pin, and extracts a location of the other end of the via included in the acquired via information.

(Step S1507) The pin connecting location information output unit 1520 outputs pin connecting location information that includes the component identification name, the pin number, the acquired net identification name, a wiring layer identification name identifying the wiring layer shown by the Z-coordinate of the acquired other end of the via, and the X-Y coordinates of the acquired other end of the via to the storage unit 1100 so that the storage unit 1100 stores the pin connecting location information into the pin connecting location table 270.

(Step S1508) The pin connecting location calculating unit 1510 repeats the processing from step S1502 for each pin information including a component type name that coincides with the acquired component type name stored in the pin table 150.

(Step S1509) The processing from step S1501 is repeated for each placement information stored in the placement table 240.

(Step S1510) The wiring path calculating unit 1530 acquires one set of connection information stored in the connection table 190, acquires a pin connecting location of each pin included in the acquired connection information from the pin connecting location table 270, and calculates a path of each wiring conductor that connects all the acquired pin connecting locations on the wiring layer, and locations of both ends of each via connecting the wiring conductor laid on adjacent wiring layers. The wiring path calculating unit 1530 executes the above process for each set of connection information stored in the connection table 190.

The above process is performed for calculating a path that connects predetermined locations on a wiring layer, and is not explained in detail in this specification as it has been realized by a conventional design aiding apparatus that aids the layout design of a multilayer wiring board.

(Step S1511) The wiring conductor and via information output unit 1540 outputs wiring conductor information composed of an identification name uniquely added to the wiring conductor, a net identification name included in the acquired connection information, a wiring layer identification name identifying a wiring layer on which the wiring conductor is laid, and a path and a width of the wiring conductor to the storage unit 1100, so that the storage unit 1100 stores the wiring conductor information into the wiring table 260.

The wiring conductor and via information output unit 1540 also outputs via information composed of an identification name uniquely added to the via, a net identification name included in the acquired connection name, and locations of both ends of the calculated via to the storage unit 1100, so that the storage unit 1100 stores the via information into the via table 250.

Wiring Component Information Generation Unit 1600

When command information delivered from the input unit 1010 shows a command type "wiring component", the wiring component information generation unit 1600 is activated by the control unit 1020 and executes the wiring component information generation process.

Figure 36:
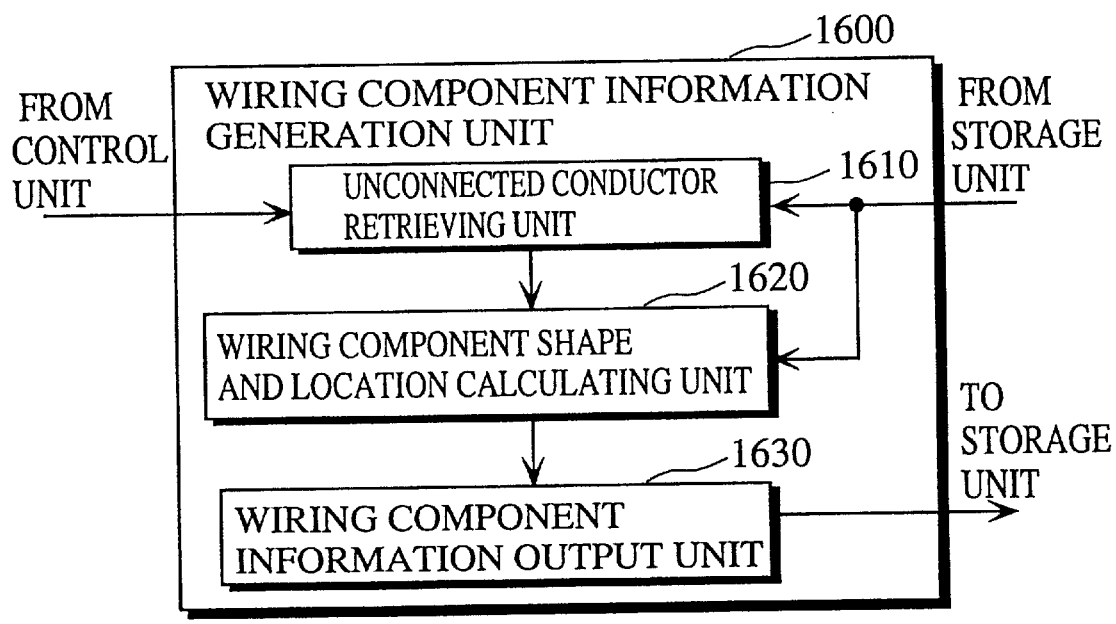
FIG. 36 shows an example construction of a wiring component information generation unit.

FIG. 36 shows an example of the construction of the wiring component information generation unit 1600. The wiring component information generation unit 1600 includes an unconnected conductor retrieving unit 1610, a wiring component shape and location calculating unit 1620, and a wiring component information output unit 1630.

The unconnected conductor retrieving unit 1610 retrieves a plurality of wiring conductors that belong to the same net and are located on the same wiring layer, but are not connected to each other. The wiring component shape and location calculating unit 162 calculates a shape and a location of the wiring component that connects the retrieved wiring conductors. The wiring component information output unit 1630 outputs component information including the calculated shape, wiring component conductor information, and placement information including the calculated location to the storage unit 1100.

The storage unit 1100 stores the received component information into the component table 140, the wiring component conductor information into the wiring component conductor path table 320, and the placement information into the placement table 240.

Wiring Component Information Generation Process in Detail

Figure 47:
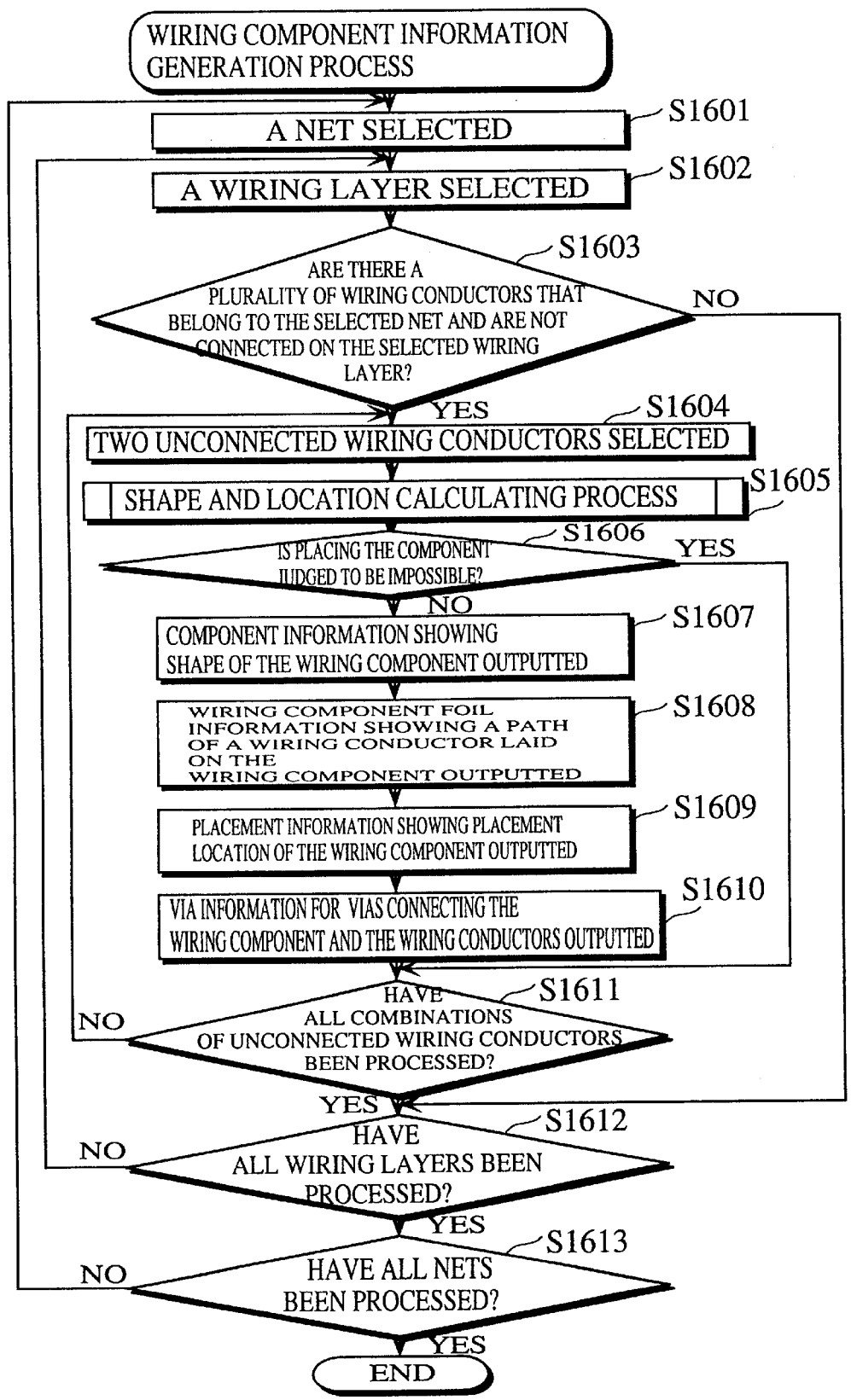
FIG. 47 is a flowchart showing a detailed operation of the wiring component information generation unit.
Figure 48:
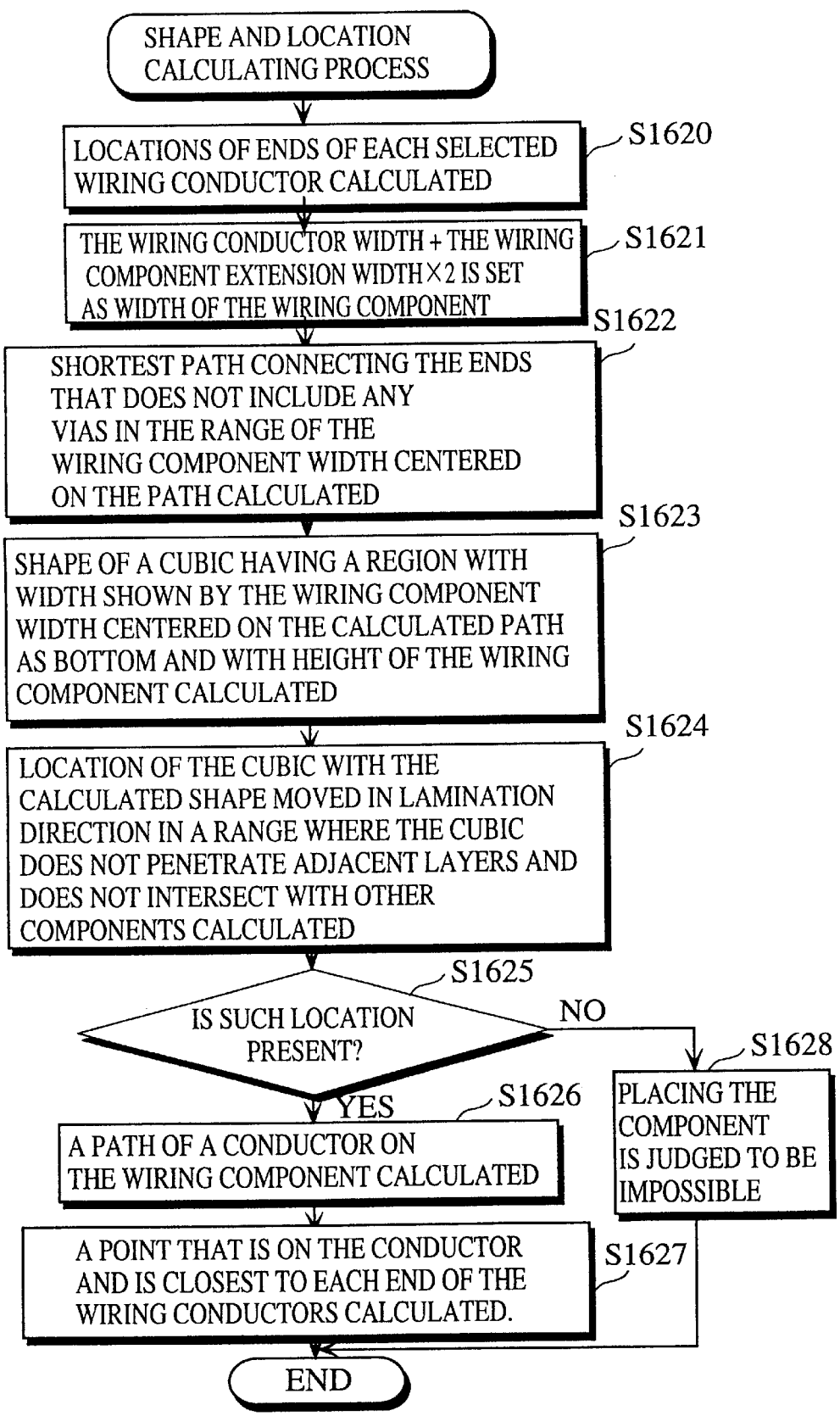
FIG. 48 is a flowchart showing a detailed operation of the wiring component information generation unit.

Flowcharts in FIGS. 47 and 48 each show a detailed operation of the wiring component information generation unit 1600.

The following is a detailed explanation of the wiring component information generation process with reference to the flowchart shown in FIG. 47.

(Step S1601) The unconnected conductor retrieving unit 1610 acquires one set of connection information from the connection table 190.

(Step S1602) A wiring layer is selected.

(Step S1603) Wiring conductor information that includes (1) a net identification name that coincides with a net identification name included in the acquired connection information and (2) a wiring layer identification name that identifies the selected wiring layer is retrieved from the wiring conductor table 260. If a plurality of sets of wiring conductor information are retrieved from the wiring conductor table 260, a plurality of wiring conductors identified by these sets of wiring conductor information are judged to be unconnected conductor.

(Step S1604) Two sets of wiring conductor information are selected out of the retrieved plurality of sets of wiring conductor information.

(Step S1605) The wiring component shape and location calculating unit 1620 executes a shape and location calculating process so that a shape of a wiring component to connect the selected two wiring conductors, a path of the conductor laid on the wiring component, and a placement location of the wiring component are calculated. When an appropriate placement location of the wiring component cannot be calculated, placing of the wiring component is judged impossible. The shape and location calculating process will be explained in detail later.

(Step S1606) When the placing of the wiring component is judged impossible, the processing advances to step S1611.

(Step S1607) The wiring component information output unit 1630 outputs component information composed of a component type name that uniquely identifies the wiring component, the calculated shape of the wiring component, and the allowable direction (0, 0, 0) to the storage unit 1100 so that the storage unit 1100 stores the component information into the component table 140.

(Step S1608) The wiring component information output unit 1630 also outputs wiring component conductor path information composed of an identification number that uniquely identifies the conductor laid on the wiring component, the calculated path of the conductor, and a width of the conductor to the storage unit so that the storage unit 1100 stores the wiring component conductor path information into the wiring component conductor path table 320.

(Step S1609) The wiring component information output unit 1630 also outputs placement information composed of the component type name, a component identification name of a component identified by the component type name, the calculated location, the rotation angle (0, 0, 0) to the storage unit 1100 so that the storage unit 1100 stores the placement information into the placement table 240.

(Step S1610) The wiring component information unit 1630 outputs two sets of via information to the storage unit 1100, each set relating to a via whose both ends respectively locate at an end of one of the selected two wiring conductors and at a closest end of the conductor laid on the wiring component. The storage unit 1100 stores the two sets of via information into the via table 250.

(Step S1611) The unconnected conductor retrieving unit 1610 repeats the processing from step S1604 for each selected pair of the retrieved plurality of sets of wiring conductor information.

(Step S1612) The processing from step S1602 is repeated for each wiring layer.

(Step S1613) The processing from step S1601 is repeated for each connection information stored in the connection table 190.

Shape and Location Calculating Process in Detail

Figure 49:
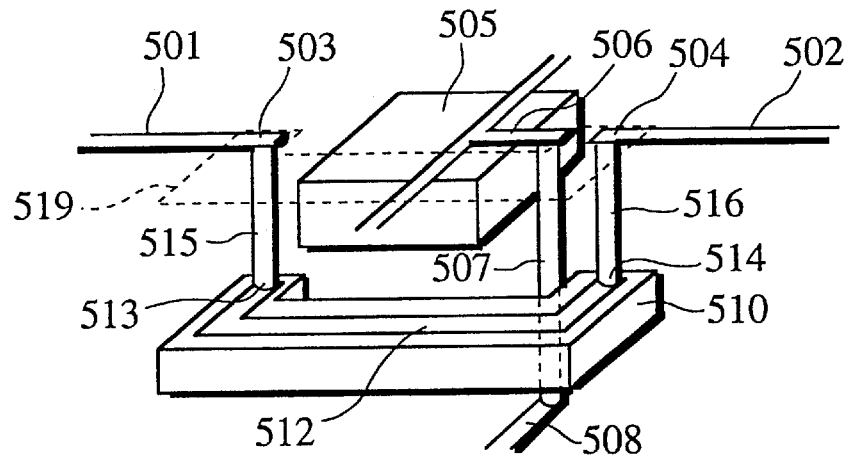
FIG. 49 shows a specific example of a wiring component placed according to a result of a shape and location calculating process.

FIG. 49 shows a specific example of a wiring component placed according to the result of the shape and location calculating process.

Figure 50:
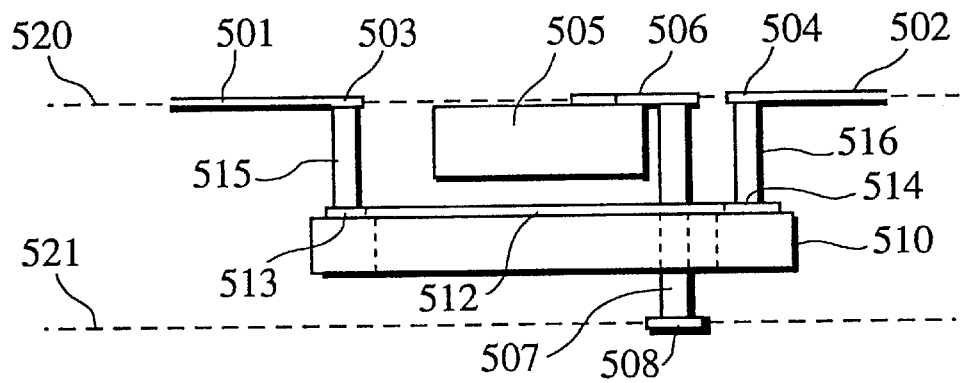
FIG. 50 is a side view showing the specific example shown in FIG. 49.

FIG. 50 is a side view showing the specific example in which elements are given the same reference numerals as in FIG. 49. In FIG. 50, broken lines 520 and 521 respectively show locations of adjacent two wiring layers.

Figure 51:
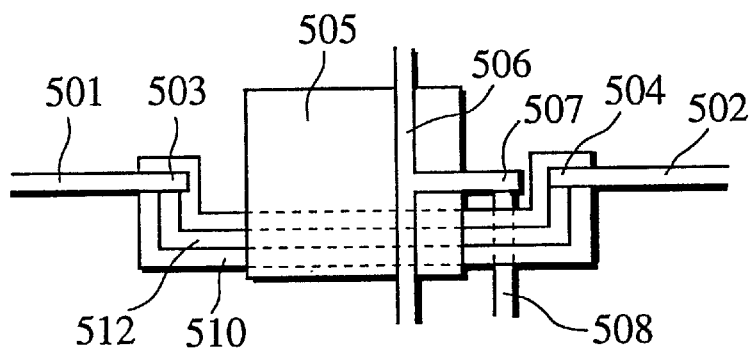
FIG. 51 is a top view showing the specific example shown in FIG. 49.

FIG. 51 is a top view showing the specific example in which elements are given the same reference numerals as in FIG. 49.

In FIG. 49, a wiring conductor 501, a wiring conductor 502, and a wiring conductor 506 are located on the same wiring layer, and the wiring conductor 501 and the wiring conductor 502 belong to the same net. The wiring conductor 501 and the wiring conductor 502 are prevented from being directly connected on the wiring layer by the wiring conductor 506 and a via 507 that belong to another net, and a component 505.

The unconnected conductor retrieving unit 1610 judges that the wiring conductor 501 and the wiring conductor 502 are unconnected, and the wiring component shape and location calculating unit 1620 calculates a shape and a location of a wiring component to connect the wiring conductor 501 and the wiring conductor 502.

The following is a detailed explanation of the shape and location calculating process performed by the wiring component shape and location calculating unit 1620 with reference to a flowchart shown in FIG. 48 and the specific example shown in FIGS. 49, 50, and 51.

(Step S1620) A location of an end of each wiring conductor identified by the two sets of wiring conductor information selected in step S1604 is calculated. In FIG. 49, the locations of the end 503 and the end 504 are calculated.

(Step S1621) A width of a wiring component is determined in the following way. A value stored as a wiring component extension width stored in the wiring component reference table 215 is doubled, and the resulting value and a width of the wiring conductor included in the selected wiring conductor information are summed. The resulting value is set as the width of the wiring component.

(Step S1622) A shortest path to connect the above calculated ends on the X-Y plane is calculated. Here, the above calculated wiring component width centered on the path should not include any vias connecting wiring layers. This is performed by defining a distance of each path using, for instance, the Manhattan distance, and retrieving a shortest path.

In the example shown in FIG. 49, as the via 507 is present on a straight line connecting the end 503 and the end 504, the wiring component shape and location calculating unit 1620 calculates a shortest path that is a detour to avoid the via 507.

(Step S1623) A region that has the same width as the calculated wiring component width centered on the calculated path on the X-Y plane is calculated. The region is indicated by a dotted line 519 in FIG. 49. A shape of a cubic having the calculated region as its bottom and the height of the wiring component stored in the wiring component reference table 215 as the distance in the Z-axis direction is calculated.

(Step S1624) The cubic having the above calculated shape is moved in the Z-axis direction in a range where the cubic does not penetrate the adjacent wiring layer, and a location where the cubic does not intersect with other components is calculated and set as the placement location of the wiring component. FIG. 50 shows a layout of a wiring component 510 and a component 505 between the wiring layers 520 and 521 where the wiring component 510 and the component 505 do not intersect.

(Step S1625) If the cubic intersects with other components even though it is moved to any location in a range where the cubic does not penetrate adjacent wiring layers, the processing advances to step S1628.

(Step S1626) A path of the conductor laid on the wiring component is calculated by converting the path calculated in step S1622 into relative coordinates by setting a placement reference point as the origin.

(Step S1627) A point that is on the conductor and is closest to each end of the two wiring conductors is calculated.

(Step S1628) Placing of the wiring component is judged impossible.

Capacitor Information Generation Unit 1700

When command information delivered from the input unit 1010 shows a command type "capacitor", the capacitor information generation unit 1700 is activated by the control unit 1020 and executes a capacitor information generation process.

Figure 37:
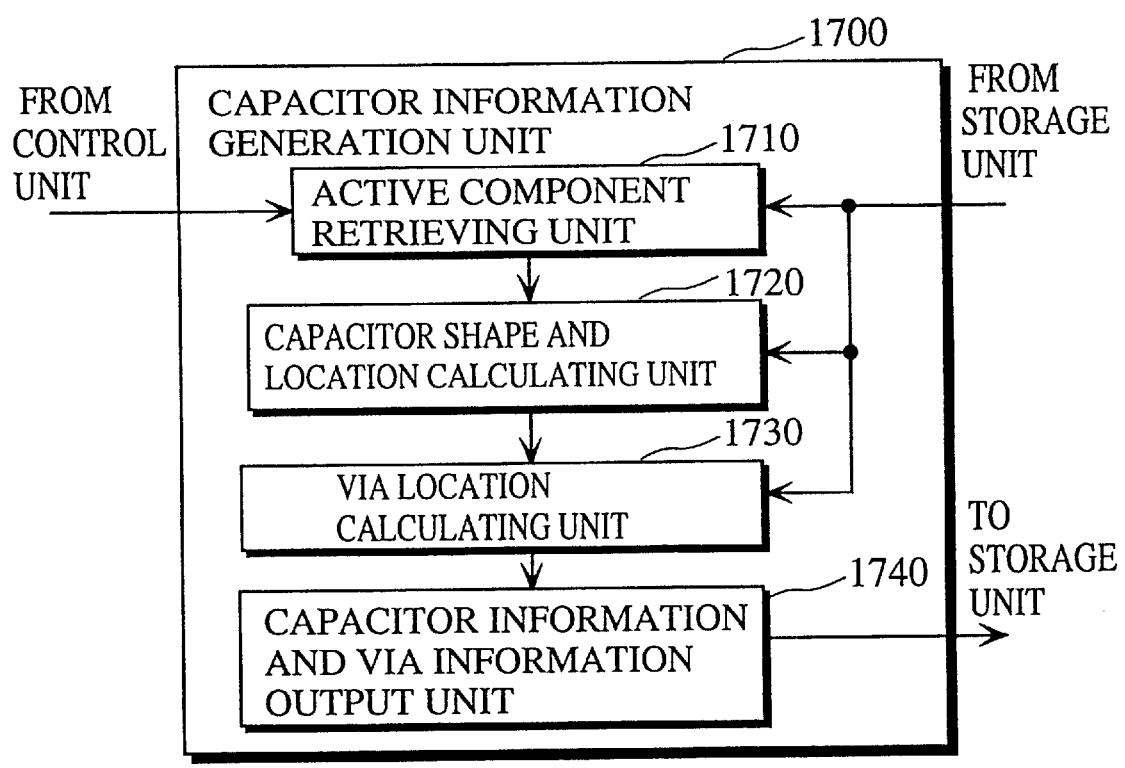
FIG. 37 shows an example construction of a capacitor information generation unit.

FIG. 37 shows an example of the construction of the capacitor information generation unit 1700. The capacitor information generation unit 1700 includes an active component retrieving unit 1710, a capacitor shape and location calculating unit 1720, a via location calculating unit 1730, and a capacitor information and via information output unit 1740.

The active component retrieving unit 1710 retrieves a component that has a power source pin. The capacitor shape and location calculating unit 1720 calculates a shape and a location of a wiring conductor that forms a capacitor (hereafter referred to as a capacitor conductor). The via location calculating unit 1730 calculates a location of a via that forms a capacitor. The capacitor information and via information output unit 1740 outputs (a) capacitor information that includes the calculated location and the shape of the wiring conductor and (b) via information that includes the calculated location of the via to the storage unit 1100.

Capacitor Information Generation Process in Detail

Figure 52:
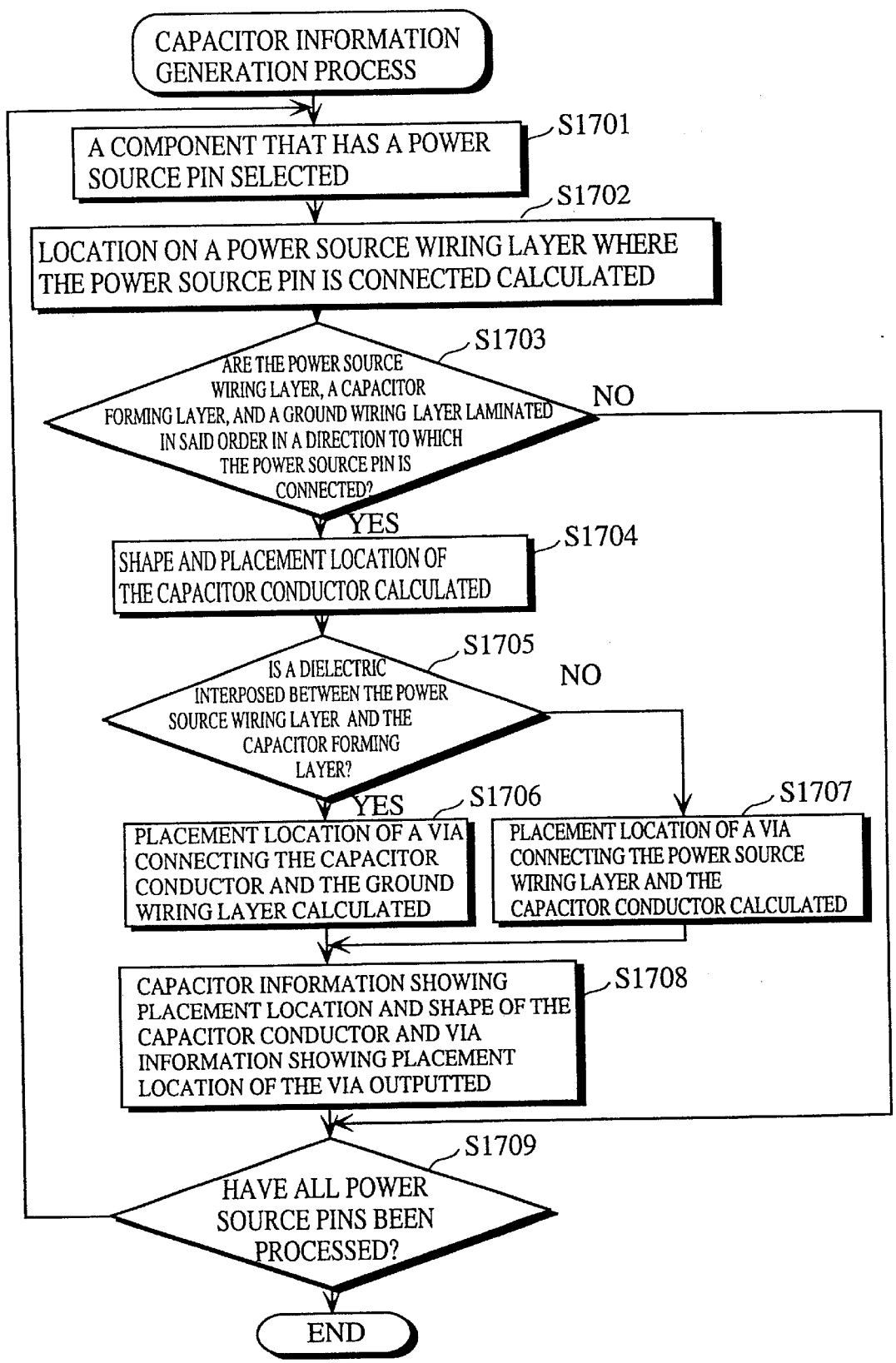
FIG. 52 is a flowchart showing a detailed operation of the capacitor information generation unit.

A flowchart in FIG. 52 shows a detailed operation of the capacitor information generation unit 1700.

The following is a detailed explanation of the capacitor information generation process with reference to the flowchart shown in FIG. 52.

(Step S1701) The active component retrieving unit 1710 acquires one set of pin connecting location information that includes a wiring layer identification name identifying a power source wiring layer from the pin connecting location table 270.

(Step S1702) The X-Y coordinates of a connecting location is calculated using the acquired set of pin connecting location information.

(Step S1703) A judgement is performed as to whether the power source wiring layer identified by the wiring layer identification name, a capacitor forming layer, and a ground wiring layer are placed in said order in the direction opposed to the component. When the above judgement result is negative, capacitor information is not generated and the processing advances to step S1709.

(Step S1704) An area of a capacitor conductor is calculated using the following equation.

Equation $$A = d \times C / (\in_0 \times \in_r)$$

A: an area of a wiring conductor
d: a thickness of a dielectric layer acquired from the dielectric table 120.
C: a capacity of a capacitor
$\in_0$: a dielectric constant of vacuum
$\in_r$: a dielectric constant of the dielectric layer acquired from the dielectric table 120

A diameter of a circle with the calculated area is calculated. In the capacitor forming layer, a circle that has the resulting diameter with the center set at the acquired X-Y coordinates indicates a placement location and a shape of the capacitor conductor.

(Step S1705) A judgement is performed as to where the dielectric is placed.

(Step S1706) When the above judgement result shows that the dielectric is placed between the power source wiring layer and the capacitor forming layer, a location of a via connecting the capacitor conductor and the ground wiring layer is calculated. This case is applied to an example shown in FIG. 29A. In the present step, a location of the via 359 that connects the capacitor conductor 358 and the ground wiring layer 360 is calculated.

(Step S1707) When the above judgement result shows that the dielectric is placed between the capacitor forming layer and the ground wiring layer, a location of a via connecting the power source wiring layer and the capacitor conductor is calculated. This case is applied to an example shown in FIG. 29B. In the present step, a location of a via 377 connecting a power source wiring layer 376 and a capacitor conductor 378 is calculated.

(Step S1708) The capacitor information and via information output unit 1740 outputs capacitor information composed of an identification name that uniquely identifies the capacitor, a wiring layer identification name that identifies the capacitor forming layer, and the above calculated coordinates of the center of the capacitor conductor and the diameter of the capacitor conductor to the storage unit 1100 so that the storage unit 1100 stores the capacitor information into the capacitor table 340.

Also, the capacitor information and via information output unit 1740 outputs via information composed of an identification name that uniquely identifies the via, an identification name that identifies one of a power source net and a ground net, and the above calculated location to the storage unit 1100 so that the storage unit 1100 stores the via information into the via table 250.

(Step S1709) The active component retrieving unit 1710 repeats the processing from step S1701 for each set of pin connecting location information that includes a wiring layer identification name that identifies a power source wiring layer stored in the pin connecting location table 270.

Unconnection Information Generation Unit 1800

When command information delivered from the input unit 1010, shows a command type "unconnection", the unconnection information generation unit 1800 is activated by the control unit 1020. Here, the control unit 1020 delivers the unconnection information generation unit 1800 a parameter included in the command information so that the unconnection information generation unit 1800 executes an unconnection information generation process based on the parameter.

Figure 38:
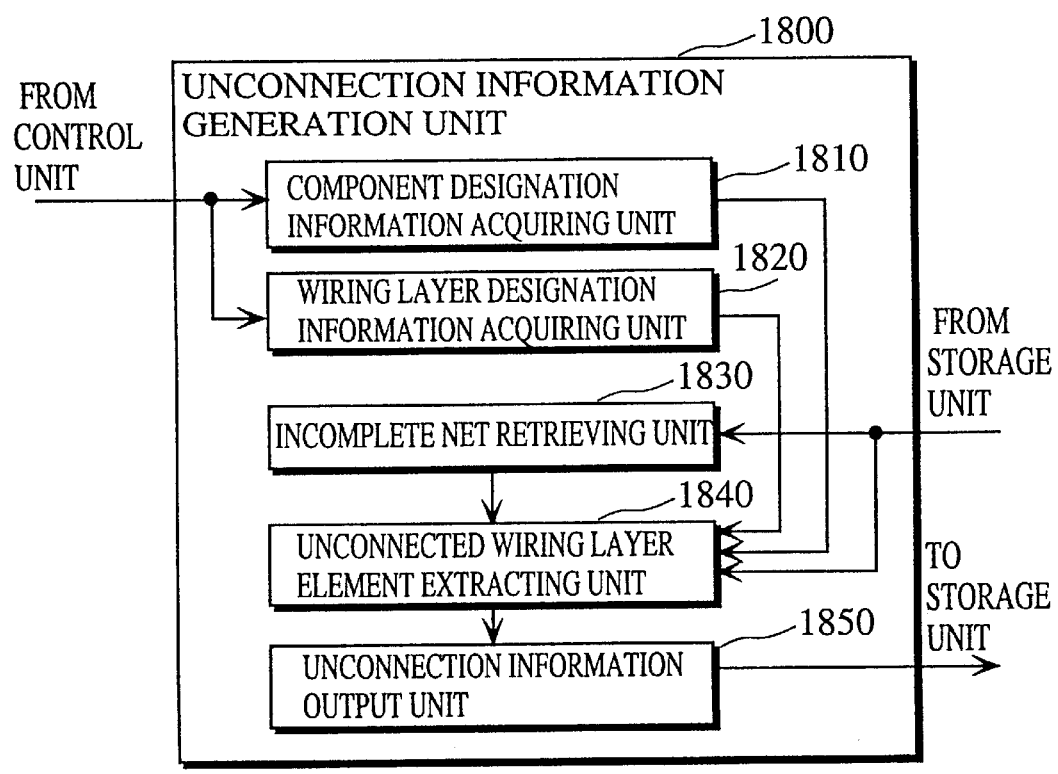
FIG. 38 shows an example construction of an unconnection information generation unit.

FIG. 38 shows an example of the construction of the unconnection information generation unit 1800. The unconnection information generation unit 1800 includes a component designation information acquiring unit 1810, a wiring layer designation information acquiring unit 1820, an incomplete net retrieving unit 1830, an unconnected wiring layer element extracting unit 1840, and an unconnection information output unit 1850.

The component designation information acquiring unit 1810 and the wiring layer designation information acquiring unit 1820 extract predetermined information from the parameter included in the command information that has been acquired from the control unit 1020. The incomplete net retrieving unit 1830 retrieves a net that includes an unconnected pin. The unconnected wiring layer element extracting unit 1840 extracts pins, wiring conductors, and vias that belong to the retrieved net. The unconnection information output unit 1850 outputs unconnection information including identification names that identify the extracted pins, the wiring conductors, and the vias to the storage unit 1100. The storage unit 1100 stores the received unconnection information into the unconnection table 390.

The following is a detailed explanation of the parameter delivered to the unconnection information generation unit 1800 from the control unit 1020 with reference to FIG. 2.

In the figure, the line 231 and the line 232 each show an example of a parameter included in an unconnection command. The parameter is designated according to one of the following formats.

<The first format>

At least one component identification name is designated.

<The second format>

At least one wiring layer identification name is designated.

The examples shown by the lines 231 and 232 respectively correspond to the first format and the second format.

The unconnection information generation unit 1800 extracts pins, wiring conductors, and vias that belong to an incomplete net according to a method that corresponds to a designated format.

Unconnection Information Generation Process in Detail

Figure 53:
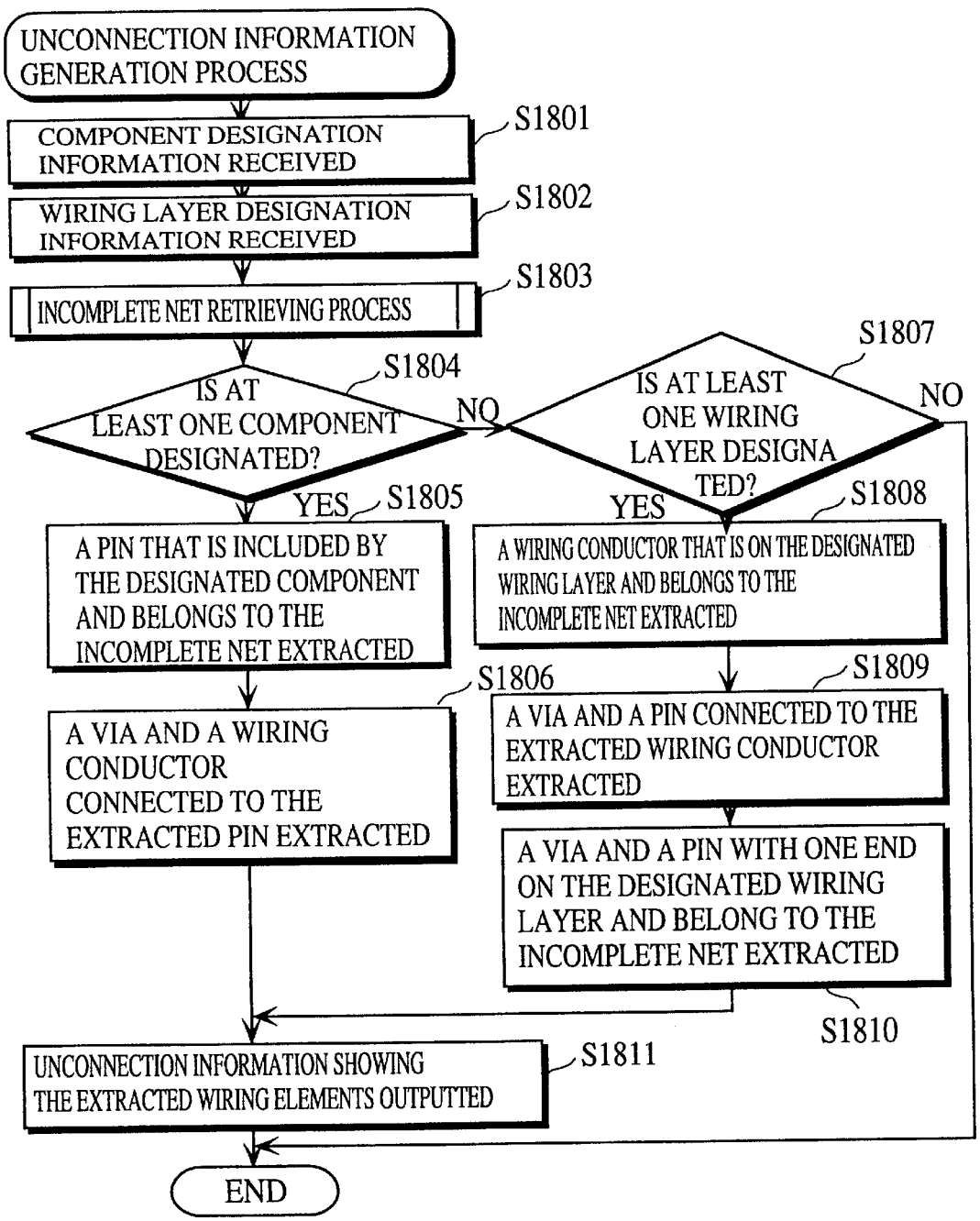
FIG. 53 is a flowchart showing a detailed operation of the unconnection information generation unit.
Figure 54:
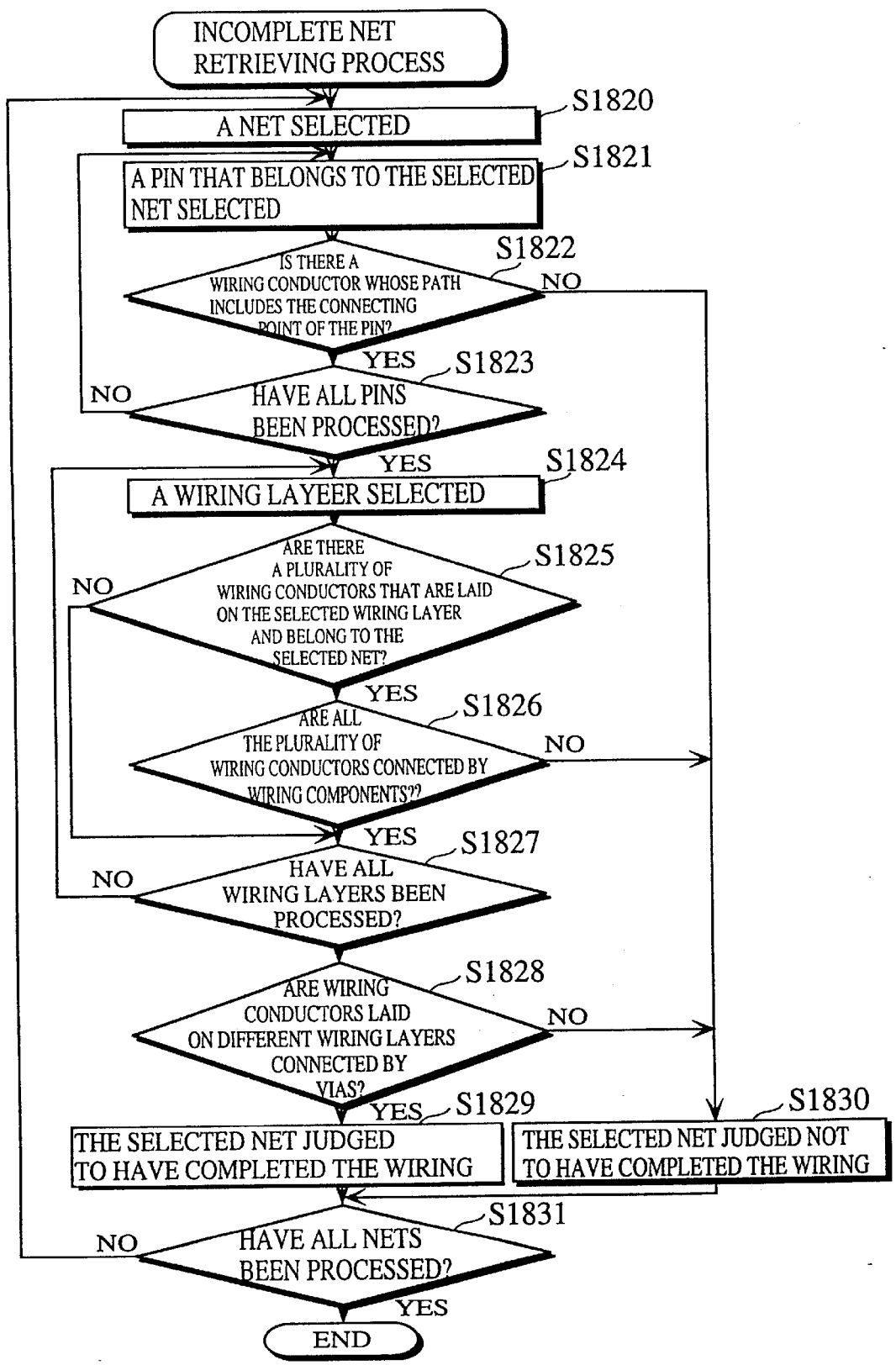
FIG. 54 is a flowchart showing a detailed operation of the unconnection information generation unit.

Flowcharts in FIGS. 53 and 54 each show a detailed operation of the unconnection information generation unit 1800.

The following is a detailed explanation of the unconnection information generation process with reference to the flowchart shown in FIG. 53.

(Step S1801) The component designation information acquiring unit 1810 extracts, when the parameter is designated in the first format, each component identification name included in the parameter.

(Step S1802) The wiring layer designation information acquiring unit 1820 extracts, when the parameter is designated in the second format, each wiring layer identification name included in the parameter.

(Step S1803) The incomplete net retrieving unit 1830 executes an incomplete net retrieving process to retrieve a net that includes an unconnected pin. The incomplete net retrieving process will be explained in detail later.

(Step S1804) The unconnected wiring layer element extracting unit 1840 judges whether the parameter is designated in the first format.

(Step S1805) When the parameter is designated in the first format, that is, when at least one component identification name is designated, pin connecting location information that includes a net identification name identifying the retrieved net and the designated component identification name is extracted from the pin connecting location table 270.

(Step S1806) Via information for a via whose one end shows same coordinates of a location included in the extracted pin connecting location information is extracted from the via table 250. Wiring conductor information for the wiring conductor whose path includes the above coordinates is extracted from the wiring conductor table 260.

(Step S1807) The unconnected wiring layer element extracting unit 1840 judges whether the parameter is designated in the second format.

(Step S1808) When the parameter is designated in the second format, that is, when at least one wiring layer identification name is designated, wiring conductor information that includes a net identification name identifying the retrieved net and the designated wiring layer identification name is extracted from the wiring conductor table 260.

(Step S1809) Via information for a via whose one end shows same coordinates as coordinates of a through point of a path of the wiring conductor included in the extracted wiring conductor information is extracted from the via table 250. Also, pin connecting location information including a pin that is connected at a location of the above coordinates is extracted from the pin connecting location table 270.

(Step S1810) The Z-coordinate showing a location of a wiring layer identified by the designated wiring layer identification name is calculated. Via information including a net identification name that identifies the above retrieved net and a via whose one end shows the Z-coordinate that coincides with the calculated Z-coordinate is extracted from the via table 250. Also, pin connecting location information that includes a net identification name that identifies the retrieved net and a pin that is connected at a location showing the Z-coordinate that coincides with the above Z-coordinate is acquired from the pin connecting location table 270.

(Step S1811) The unconnection information output unit 1850 outputs unconnection information that includes numbers and identification names that each identify a pin, a via, and the wiring conductor shown by the pin information, the via information, the wiring conductor information acquired in step S1805, step S1808, step S1809, and step S1810, to the storage unit 1100. The storage unit 1100 stores the unconnection information into the unconnection table 390.

Incomplete Net Retrieving Process in Detail

The following is a detailed explanation of the incomplete net retrieving process with reference to a flowchart shown in FIG. 54.

(Step S1820) The incomplete net retrieving unit 1830 acquires one set of connection information from the connection table 190.

(Step S1821) One set of pin connecting location information including a net identification name that coincides with a net identification name included in the acquired set of connection information is acquired from the pin connecting location table 270.

(Step S1822) Wiring conductor information for the wiring conductor whose path includes coordinates of a through point that coincides with coordinates of a pin connecting location included in the acquired pin connecting location information is retrieved from the wiring conductor table 260. When there is no such information, the processing advances to step S1830.

(Step S1823) The processing from step S1821 is repeated for each set of pin connecting location information that includes a net identification name identifying a net included in the acquired connection information.

(Step S1824) A wiring layer is selected.

(Step S1825) Wiring conductor information that includes a wiring layer identification name that coincides with a wiring layer identification name identifying the selected wiring layer and a net identification name that coincides with the above net identification name is retrieved from the wiring conductor table 260. When there is no such information, or when only one set of such information is retrieved, the processing advances to step S1827.

(Step S1826) The judgement is performed as to whether all the retrieved wiring conductors are connected by wiring components. If the above judgement result is negative, the processing advances to step S1830.

(Step S1827) The processing from step S1824 is repeated for each wiring layer.

(Step S1828) A judgement is performed as to whether there is a via connecting two wiring conductors respectively located on adjacent wiring layers that belong to a net identified by the net identification name. When the above judgement result is negative, the processing advances to step S1830.

(Step S1829) A net identified by the net identification name is judged to have completed the wiring, and the processing advances to step S1831.

(Step S1830) A net identified by the net identification name is judged not to have completed the wiring.

(Step S1831) The processing from step S1820 is repeated for each set of connection information stored in the connection table 190.

Display of Unconnection Information

The display unit 1030 displays unconnection information that has been generated by the unconnection information generation unit 1800 and stored into the unconnection table 390. The following is an explanation of a form of the display.

The display unit 1030 displays the updated layout design of components, vias, and wiring conductors using a top view or a side view (see FIGS. 31A and 31B). When the display unit 1030 displays results of the unconnection information generation process, it displays only components, vias, and wiring conductors that have pins stored in the unconnection table 390, and do not display other components, vias, and wiring conductors. Alternatively, the display unit 1030 displays components, vias, and wiring conductors that have pins stored in the unconnection table 390 using a dark color, and displays other components, vias, and wiring conductors using a light color. When components, vias, and wiring conductors placed on a plurality of wiring layers are displayed using a top view, the components, the vias, and the wiring conductors on a different layer are displayed using a different color, or a different type of line.

Modifications

Although the present invention has been described based on the above embodiment, the invention should not be limited to such. For instance, the following modifications are possible.

(1) The present invention may be methods described above, or may either be computer programs that realize these methods by a computer, or digital signals that are composed of these computer programs.

Also, the present invention may be a computer-readable storage medium, such as a floppy disk, a hard disk, a CD-ROM, an MO, a DVD, a DVD-ROM, a DVD-RAM, or a semiconductor memory, that stores the computer programs or the digital signals, or may be the computer programs or the digital signals stored in any above listed computer-readable storage medium.

Also, the present invention may be realized by transmitting the computer programs or the digital signals via a telecommunication line, a radio communication line, a wire communication line, or a network represented by the Internet.

Furthermore, the present invention may relate to a computer system composed of a microprocessor and a memory wherein the memory stores the computer programs and the microprocessor operates according to the computer programs.

By storing the computer programs or the digital signals in any above listed storage medium and transferring the storage medium, the computer programs and the digital signals may be realized by another independent computer system.

(2) The placement information generation unit in the above embodiment calculates, when a region to be occupied by a component to be placed intersects with a region occupied by a component that has already been placed, a placement location of a placement reference point of the component in such a manner that the above two regions do not intersect when the placement reference point of the component coincides with the calculated placement location, and outputs placement information including the calculated placement location of the placement reference point. However, the placement information generation unit may instead calculate a placement angle at which the component is placed in such a manner that the above two regions do not intersect when the component is placed using the placement angle, and may instead output placement information including the calculated placement angle.

(3) The above embodiment indicates that a wiring component is a cubic shaped nonconductor that includes at least one conductor on its surface. However, the wiring conductor may instead include the conductor inside the wiring component. In this case, the wiring conductor should further include connection terminals for connecting the internal wiring conductor to outside the component.

(4) Although the location field 153 in the pin table 150 stores a point for showing a location of a pin in the above embodiment, it may further store a radius with the above point as the center of the pin. In this case, a location of the pin can be expressed using a circle region. Alternatively, a location of the pin can be expressed by storing a location of each vertex that defines the outline of the pin.

(5) The allowable direction field 143 in the component table 140 stores the allowable rotation angle for showing the direction to which a component is allowed to be oriented, however, the allowable direction field 143 may instead store the prohibited rotation angle for showing the direction to which the component is prohibited to be oriented.

(6) The wiring component information generation unit calculates the distance of a wiring component in the Z-axis direction as the height of the wiring component stored in the wiring component reference table 215, however, the distance in the Z-axis direction is not limited to such a value. For example, a larger value may be used as far as the wiring component does not intersect with other components.

(7) In the above embodiment, a parameter delivered to the unconnection information generation unit is designated in either of the two formats: (1) in which at least one component identification name is designated; and (2) in which at least one wiring layer identification name is designated. However, both component identification information and wiring layer identification information may be designated at the same time. In this case, the processing from step S1805 through step S1806 is executed for the designated component identification information, and the processing from step S1808 through step S1810 is executed for the designated wiring layer information. Unconnection information showing wiring elements extracted by both the processes is outputted in step S1811.

Figure 55A:
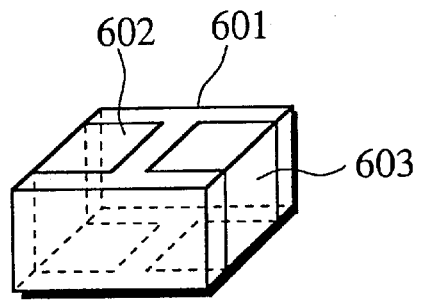
FIG. 55A shows an example of a component to be placed so as to be rotated in a direction orthogonal to a wiring layer.
Figure 55B:
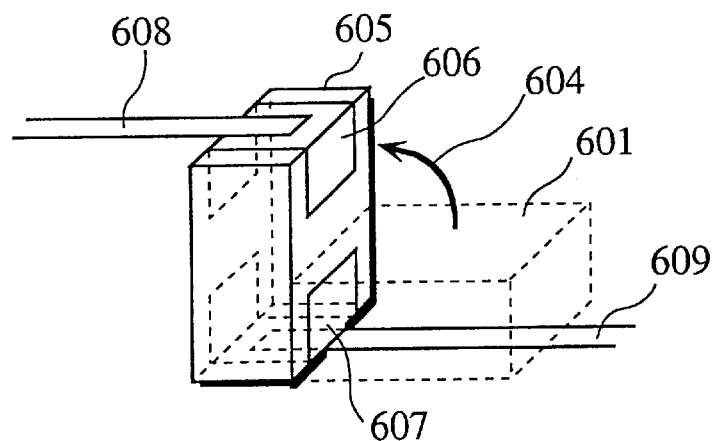
FIG. 55B shows the component that has been placed so as to be rotated in the direction orthogonal to the wiring layer.
Figure 55C:
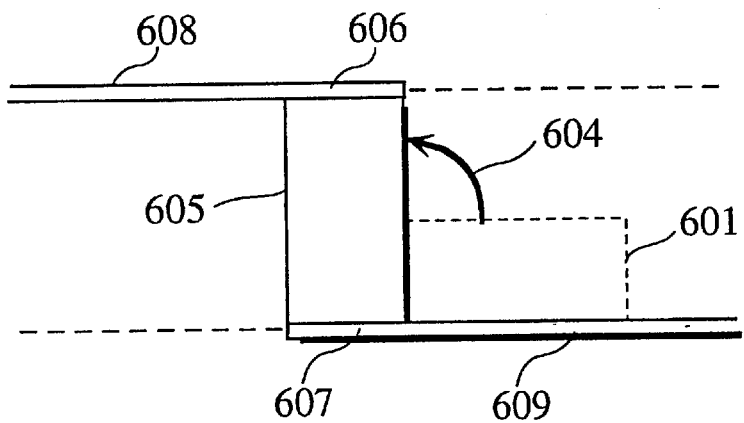
FIG. 55C is a side view showing the component placement shown in FIG. 55B.

(8) As one example of the placement of the component, the above embodiment explains the case in which the component is placed so as to be rotated at an angle of 180 degrees on the Y-axis from the placement reference direction (that is, the component is placed so as to be turned over). However, the component can also be placed so as to be rotated at an angle of 90 degrees on the Y-axis (that is, the component can be placed so as to be stood up). FIG. 55A shows an example in which the component is to be stood up. The component 601 includes a pin 602 and a pin 603 that can be connected in three directions. FIG. 55B shows a component 605 that is placed so as to be rotated at an angle of 90 degrees from the placement reference direction. FIG. 55C is a side view showing the above component 605 in which elements are given the same reference numerals as in FIG. 55B. A dotted line 601 indicates a region of the component 605 if oriented to the placement reference direction and the component 605 indicates a region when placed so as to be rotated at an angle of 90 degrees from the placement reference direction. In this figure, the distance of each wiring path for a pin 606 and for a pin 607 is rather short as both the pin 606 and the pin 607 are directly connected to the wiring conductor 608 and the wiring conductor 609, each of which is located on a different wiring layer.

(9) In the present embodiment, a distance between two adjacent wiring layers in the wiring board is uniform, and the distance is stored in the distance between layers 103 in the wiring board table 100, however, each distance between two adjacent wiring layers may be different. In this case, each different distance is stored in the wiring layer table 110.

Moreover, in the present embodiment, a dielectric for forming a capacitor is placed between predetermined adjacent wiring layers, and wiring layer identification names that each identify the predetermined wiring layer, and a thickness and a dielectric constant of the dielectric are stored in the dielectric table 120. However, the dielectric may be placed between all the adjacent wiring layers, and a thickness and a dielectric constant of each dielectric placed between the adjacent wiring layers may be different. In this case, the thickness and the dielectric constant of each dielectric are stored in the wiring layer table 110.

FIG. 56 shows an example of the wiring layer table that stores the above described sets of information. Each line in the wiring layer table 700 shows each set of wiring layer information in lamination order. A distance between layers 703 and a dielectric constant 704 respectively store a distance between a wiring layer shown by a present line and a wiring layer shown by the following line, and a dielectric constant of a dielectric placed in between.

(10) The above embodiment may also be combined with the above modifications.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A design aiding apparatus that aids layout design of components in a multilayer wiring board, comprising:

a first acquiring unit operable to acquire first location information that shows a first location in a lamination direction of the multilayer wiring board;

a second acquiring unit operable to acquire second information that shows a second location on a two-dimensional plane that is orthogonal to the lamination direction; and a placement unit operable to generate component placement information that shows a space to be occupied by the component, when the component is placed at a location determined by the acquired first location information and the acquired second location information.

2. A design aiding apparatus that aids layout design of components in a multilayer wiring board formed by laminating a plurality of wiring layers, the design aiding apparatus comprising:

a first acquiring unit operable to acquire first location information that shows a first location in a lamination direction of the plurality of wiring layers;

a second acquiring unit operable to acquire second location information that shows a second location on a two-dimensional plane that is orthogonal to the lamination direction; and a placement unit operable to generate component placement information that shows a space to be occupied by the component, when the component is placed in such a manner that a placement reference point of the component coincides with the second location that is on the two-dimensional plane including the first location.

3. The design aiding apparatus of claim 2, wherein the first acquiring unit includes:

a wiring layer information acquiring unit operable to acquire layer information that identifies one wiring layer out of the plurality of wiring layers; and a wiring layer location acquiring unit operable to acquire the first location information that shows a location of the identified wiring layer in the lamination direction;

wherein the placement unit generates the component placement information, in such a manner that the placement reference point of the component coincides with the second location that is on the two-dimensional plane including the first location, the first location being the location of the identified wiring layer in the lamination direction.

4. The design aiding apparatus of claim 3, further comprising:

an angle acquiring unit operable to acquire angle information that shows a rotation angle at which the component 98 is to be rotated for being placed into the multilayer wiring board; and an angle judging unit operable to judge whether the component is placeable in a state of being rotated at the rotation angle shown by the angle information;

wherein when the angle judging unit judges that the component is placeable in a state of being rotated at the rotation angle, the placement unit generates component placement information that shows a space to be occupied by the component when the component is placed in the state of being rotated at the rotation angle.

5. The design aiding apparatus of claim 4, wherein the angle judging unit (a) stores, for each component, prohibited angle information that shows a range of angles at which the component is prohibited to be rotated, (b) judges whether the rotation angle shown by the acquired angle information is in the range of angles shown by the prohibited angle information, (c) judges that the component is not placeable when the rotation angle shown by the acquired angle information is in the range of angles shown by the prohibited angle information, and (d) judges that the component is placeable when the rotation angle shown by the acquired angle information is not in the range of angles shown by the prohibited angle information.

6. The design aiding apparatus of claim 4, wherein the angle acquiring unit acquires an angle that shows a direction orthogonal to the wiring layer as the rotation angle, and the placement unit generates the component placement information that shows the space to be occupied by the component when the component is placed in a state of being rotated in the direction orthogonal to the wiring layer.

7. The design aiding apparatus of claim 4, wherein at least one component has already been placed in the multilayer wiring board, the design aiding apparatus further comprising:

a component placement information storing unit operable to store component placement information that shows a space occupied by the component that has already been placed; and an interference judging unit operable to judge whether the space to be occupied by the component shown by the component placement information generated by the placement unit intersects with the space occupied by the component that has already been placed;

wherein when the interference judging unit judges that the space to be occupied by the component shown by the component placement information intersects with the space occupied by the component that has already been placed, the placement unit (a) calculates a rotation angle at which the component is to be rotated, in such a manner that a space to be occupied by the component when the component is placed in a state of being rotated at the calculated rotation angle does not intersect with the space occupied by the component that has already been placed, and (b) generates component placement information that shows the space to be occupied by the component when the component is placed in the state of being rotated at the calculated rotation angle.

8. The design aiding apparatus of claim 2, wherein the first acquiring unit includes:

a wiring layer information acquiring unit operable to acquire layer information that identifies one wiring layer out of the plurality of wiring layers;

a wiring layer location acquiring unit operable to acquire the first location information that shows a location of the identified wiring layer in the lamination direction; and a distance acquiring unit operable to acquire distance information that shows a distance from the identified wiring layer in the lamination direction;

the placement unit generates the component placement information in such a manner that the placement reference point of the component coincides with the second location that is on the two-dimensional plane including a third location, the third location being away from the first location at the distance determined by the distance information.

9. The design aiding apparatus of claim 8, further comprising:

an angle acquiring unit operable to acquire angle information that shows a rotation angle at which the component is rotated for being placed into the multilayer wiring board;

an angle judging unit operable to judge whether the component is placeable in a state of being rotated at the rotation angle shown by the angle information;

wherein when the angle judging unit judges that the component is placeable in a state of being rotated at the rotation angle, the placement unit generates component placement information that shows a space to be occupied by the component when the component is placed in the state of being rotated at the rotation angle.

10. The design aiding apparatus of claim 9, wherein the angle judging unit (a) stores, for each component, prohibited angle information that shows a range of angles at which the component is prohibited to be rotated, (b) judges whether the rotation angle shown by the acquired angle information is in the range of angles shown by the prohibited angle information, (c) judges that the component is not placeable when the rotation angle shown by the acquired angle information is in the range of angles shown by the prohibited angle information, and (d) judges that the component is placeable when the rotation angle shown by the acquired angle information is not in the range of angles shown by the prohibited angle information.

11. The design aiding apparatus of claim 9, wherein the angle acquiring unit acquires an angle that shows a direction orthogonal to the wiring layer as the rotation angle, and the placement unit generates the component placement information that shows the space to be occupied by the component when the component is placed in a state of being rotated in the direction orthogonal to the wiring layer.

12. The design aiding apparatus of claim 9, wherein at least one component has already been placed in the multilayer wiring board, the design aiding apparatus further comprising:

a component placement information storing unit operable to store component placement information that shows a space occupied by a component that has already been placed; and an interference judging unit operable to judge whether the space to be occupied by the component shown by the component placement information generated by the placement unit intersects with the space occupied by the component that has already been placed;

wherein when the interference judging unit judges that the space to be occupied by the component shown by the component placement information intersects with the space occupied by the component that has already been placed, the placement unit (a) calculates a rotation angle at which the component is to be rotated, in such a manner that a space to be occupied by the component when the component is placed in a state of being rotated at the calculated rotation angle does not intersect with the space occupied by the component that has already been placed, and (b) generates component placement information that shows the space to be occupied by the component when the component is placed in the state of being rotated at the calculated rotation angle.

13. The design aiding apparatus of claim 2, wherein the first acquiring unit includes:

a wiring layer information acquiring unit operable to acquire two sets of layer information that respectively identify adjacent two wiring layers out of the plurality of wiring layers;

a wiring layer location acquiring unit operable to acquire two sets of location information that respectively show two locations of the identified two wiring layers in the lamination direction; and a distance adjusting unit operable to generate the first location information that shows the first location in the lamination direction of the plurality of wiring layers, in such a manner that the space to be occupied by the component is within a space between the identified two wiring layers.

14. The design aiding apparatus of claim 13, further comprising:

an angle acquiring unit operable to acquire angle information that shows a rotation angle at which the component is to be rotated for being placed into the multilayer wiring board; and an angle judging unit operable to judge whether the component is placeable in a state of being rotated at the rotation angle shown by the angle information;

wherein when the angle judging unit judges that the component is placeable in a state of being rotated at the rotation angle, the placement unit generates component placement information that shows a space to be occupied by the component when the component is placed in the state of being rotated at the rotation angle.

15. The design aiding apparatus of claim 14,
wherein the angle judging unit (a) stores, for each component, prohibited angle information that shows a range of angles at which the component is prohibited to be rotated, (b) judges whether the rotation angle shown by the acquired angle information is in the range of angles shown by the prohibited angle information, (c) judges that the component is not placeable when the rotation angle shown by the acquired angle information is in the range of angles shown by the prohibited angle information, and (d) judges that the component is placeable when the rotation angle shown by the acquired angle information is not in the range of angles shown by the prohibited angle information.

16. The design aiding apparatus of claim 14,
wherein the angle acquiring unit acquires an angle that shows a direction orthogonal to the wiring layer as the rotation angle, and
the placement unit generates the component placement information that shows the space to be occupied by the component when the component is placed in a state of being rotated in the direction orthogonal to the wiring layer.

17. The design aiding apparatus of claim 14,
wherein at least one component has already been placed in the multilayer wiring board,
the design, aiding apparatus further comprising:
a component placement information storing unit operable to store component placement information that shows a space occupied by a component that has already been placed; and
an interference judging unit operable to judge whether the space to be occupied by the component shown by the component placement information generated by the placement unit intersects with the space occupied by the component that has already been placed,
wherein when the interference judging unit judges that the space to be occupied by the component shown by the component placement information intersects with the space occupied by the component that has already been placed, the placement unit (a) calculates a rotation angle at which the component is to be rotated, in such a manner that a space to be occupied by the component when the component is placed in a state of being rotated at the calculated rotation angle does not intersect with the space occupied by the component that has already been placed, and (b) generates component placement information that shows the space to be occupied by the component when the component is placed in the state of being rotated at the calculated rotation angle.

18. The design aiding apparatus of claim 2, further comprising:
a penetration judging unit operable to judge whether a space to be occupied by the component shown by the generated component placement information intersects with a wiring layer in the multilayer wiring board; and
a cut-off information generation unit operable to generate, when the penetration judging unit judges that the space to be occupied by the component shown by the generated component placement information intersects with the wiring layer in the multilayer wiring board, plane information that shows a plane on which the space and the wiring layer intersect.

19. The design aiding apparatus of claim 2,
wherein the component includes a connection terminal,
the design aiding apparatus further comprising,
a via connecting unit operable to generate via location information that shows a placement location of a via to connect the connection terminal of the component and a wiring layer.

20. The design aiding apparatus of claim 2 further aids layout design of a plurality of components that are to be placed one on top of another in the multilayer wiring board,
the design aiding apparatus comprising:
a plural component storing unit operable to store a plurality of sets of component information that respectively show a plurality of types of components that are placeable one on top of another;
wherein when the placement unit fetches the plurality of sets of component information, the placement unit generates component placement information that shows a space to be occupied by each of the plurality of types of components when the plurality of types of components shown by the read sets of component information are placed one on top of another, in such a manner that a placement reference point of one component out of the plurality of types of component coincides with the second location.

21. The design aiding apparatus of claim 20,
wherein each of the plurality of types of components is equipped with a connection terminal,
the design aiding apparatus further comprising,
a via connection unit operable to generate via location information that shows a placement location of a via to connect connection terminals respectively equipped on adjacent components.

22. The design aiding apparatus of claim 2,
wherein at least two components to be connected to each other are placed into the multilayer wiring board,
the design aiding apparatus further comprising:
a wiring component judging unit operable to judge whether a wiring component is necessary when the at least two components are connected; and
a wiring component generation unit operable to generate, when the wiring component judging unit judges that the wiring component is necessary, shape information that shows a shape of the wiring component on which conductive foil is laid, the wiring component used to connect the at least two components,
wherein the placement unit generates wiring component placement information that indicates a space to be occupied by the wiring component shown by the generated shape information when the wiring component is placed.

23. The design aiding apparatus of claim 2,
wherein a plurality of components are placed into the multilayer wiring board,
the design aiding apparatus further comprising:
a connection information storing unit operable to store a plurality of sets of connection information that respectively show a plurality of connections that connect the plurality of components;
a wiring information storing unit operable to store a plurality of sets of wiring information that respectively show a plurality of wirings between some components out of the plurality of components; and
an unconnection information generation unit operable to extract connections that are not realized by the plurality of wirings shown by the plurality of sets of wiring information out of the plurality of connections, and generating connection information that shows the extracted connections as unconnection information.

24. The design aiding apparatus of claim 2, wherein a dielectric layer is formed between adjacent two wiring layers in the multilayer wiring board, the design aiding apparatus further comprising, a capacitor generation unit operable to generate foil location information that indicates two locations where conductive foil with a predetermined area is laid, the two in locations respectively being on the two adjacent wiring layers and facing each other.

25. The design aiding apparatus of claim 2, wherein at least one component has already been placed into the multilayer wiring board, the design aiding apparatus further comprising:

a component placement information storing unit operable to store component placement information that shows a space that has been occupied by the at least one component; and an interference judging unit operable to judge whether the space to be occupied by the component shown by the component placement information generated by the placement unit intersects with the space that has been occupied by the at least one component;

wherein when the interference judging unit judges that the space to be occupied by the component shown by the component placement information intersects with the space occupied by the component that has already been placed, the placement unit (a) calculates a placement location of the component, in such a manner that a space to be occupied by the component when the component is placed at the calculated placement location does not intersect with the space occupied by the component that has already been placed, and (b) generates component placement information that shows the space to be occupied by the component when the component is placed at the calculated placement location.

26. A design aiding method that is used in a design aiding apparatus that aids layout design of components in a multilayer wiring board formed by laminating a plurality of wiring layers, the design aiding method comprising:

a first acquiring step for acquiring first location information that shows a first location in a lamination direction of the plurality of wiring layers;

a second acquiring step for acquiring second location information that shows a second location on a two-dimensional plane that is orthogonal to the lamination direction; and a placement step for generating component placement information that shows a space to be occupied by the component, when the component is placed in such a manner that a placement reference point of the component coincides with the second location that is on the two-dimensional plane including the first location.

27. A storage medium that stores a design aiding program used in a design aiding apparatus that aids layout design of components in a multilayer wiring board formed by laminating a plurality of wiring layers, the design aiding program comprising:

a first acquiring step for acquiring first location information that shows a first location in a lamination direction of the plurality of wiring layers;

a second acquiring step for acquiring second location information that shows a second location on a two-dimensional plane that is orthogonal to the lamination direction; and a placement step for generating component placement information that shows a space to be occupied by the component when the component is placed in such a manner that a placement reference point of the component coincides with the second location that is on the two-dimensional plane including the first location.

28. The design aiding program of claim 27, wherein the first acquiring step includes:

a wiring layer information acquiring step for acquiring layer information that identifies one wiring layer out of the plurality of wiring layers; and a wiring layer location acquiring step for acquiring the first location information that shows a location of the identified wiring layer in the lamination direction;

wherein the placement step generates the component placement information, in such a manner that the placement reference point of the component coincides with the second location that is on the two-dimensional plane including the first location, the first location being the location of the identified wiring layer in the lamination direction.

29. The design aiding program of claim 28 further comprising:

an angle acquiring step for acquiring angle information that shows a rotation angle at which the component is to be rotated for being placed into the multilayer wiring board; and an angle judging step for judging whether the component placeable in a state of being rotated at the rotation angle shown by the angle information;

wherein when the angle judging step judges, that the component is placeable in a state of being rotated at the rotation angle, the placement step generates component placement information that shows a space to be occupied by the component when the component is placed in the state of being rotated at the rotation angle.

* * * * *